United States Patent
Hsu et al.

(10) Patent No.: US 7,805,247 B2
(45) Date of Patent: Sep. 28, 2010

(54) SYSTEM AND METHODS FOR WELL DATA COMPRESSION

(75) Inventors: Kai Hsu, Sugar Land, TX (US); Julian J. Pop, Houston, TX (US)

(73) Assignee: Schlumberger Technology Corporation, Sugar Land, TX (US)

(*) Notice: Subject to any disclaimer, the term of this patent is extended or adjusted under 35 U.S.C. 154(b) by 616 days.

(21) Appl. No.: 11/682,023

(22) Filed: Mar. 5, 2007

(65) Prior Publication Data

US 2007/0198192 A1  Aug. 23, 2007

Related U.S. Application Data

(63) Continuation-in-part of application No. 10/434,923, filed on May 9, 2003, now Pat. No. 7,263,880.

(51) Int. Cl.
E21B 47/12 (2006.01)

(52) U.S. Cl. .............. 702/6; 702/7; 702/8; 702/9; 702/10; 702/11; 702/12; 702/13; 702/14; 702/15; 702/16; 702/17; 702/18; 367/76; 367/81; 367/82; 367/83; 367/87; 367/95; 367/101

(58) Field of Classification Search ............... 702/6–18; 367/76, 81–83, 87, 95, 101
See application file for complete search history.

(56) References Cited

U.S. PATENT DOCUMENTS

| | | | |
|---|---|---|---|
| 3,934,468 A | 1/1976 | Brieger | |
| 4,860,581 A | 8/1989 | Zimmerman et al. | |
| 4,936,139 A | 6/1990 | Zimmerman et al. | |
| 5,095,745 A | 3/1992 | Desbrandes | |
| 5,233,866 A | 8/1993 | Desbrandes | |
| 5,803,186 A | 9/1998 | Berger et al. | |
| 5,924,499 A * | 7/1999 | Birchak et al. | 175/40 |
| 5,969,241 A | 10/1999 | Auzerais | |

(Continued)

FOREIGN PATENT DOCUMENTS

WO  2007020475  2/2007

OTHER PUBLICATIONS

E Kartstad and B.S. Aadnoy, "Density Behavior of Drilling Fluids During High Pressure High Temperature Drilling Operations," IADC/SPE 47806 (1998).

(Continued)

*Primary Examiner*—Sujoy K Kundu
(74) *Attorney, Agent, or Firm*—Dave R. Hofman; Brigitte L. Echols

(57) ABSTRACT

Systems and methods in which data compression techniques are utilized to fill a predetermined channel capacity are shown. According to one configuration, event data points within test data are selected for communication via the data communication channel and a data decimator is utilized to identify other data points within the test data to fill or substantially fill the predetermined channel capacity. The foregoing data decimator may employ one or more variables for selecting data for communication, wherein one or more of the variables are preferably adjusted in decimator iterations to select an optimum or otherwise desirable subset of data for communication. Data decimators may additionally or alternatively implement a suitable "growth" function to select the particular data for communication and/or the amount of data communicated.

33 Claims, 25 Drawing Sheets

U.S. PATENT DOCUMENTS

| | | |
|---|---|---|
| 6,230,557 B1 | 5/2001 | Ciglenec et al. |
| 6,932,167 B2 | 8/2005 | Proett et al. |
| 6,986,282 B2 | 1/2006 | Ciglenec et al. |
| 7,011,155 B2 | 3/2006 | Meister et al. |
| 7,114,562 B2 | 10/2006 | Fisseler et al. |
| 7,290,443 B2 * | 11/2007 | Follini et al. ............. 73/152.27 |
| 2004/0231842 A1 | 11/2004 | Shammai et al. |
| 2005/0039527 A1 | 2/2005 | Dhruva et al. |
| 2005/0109538 A1 | 5/2005 | Fisseler et al. |
| 2006/0062081 A1 * | 3/2006 | Wu et al. ...................... 367/25 |
| 2007/0011719 A1 | 1/2007 | Kurkoski et al. |
| 2007/0057811 A1 | 3/2007 | Mehta |

OTHER PUBLICATIONS

Goode et al., "Multliple Probe Formation Testing and Vertical Reservoir Continuity," SPE 22783, 1991 SPE Annual Technical & Conf. EXH., Dallas TX (Oct. 6-Oct. 9, 1991).

* cited by examiner

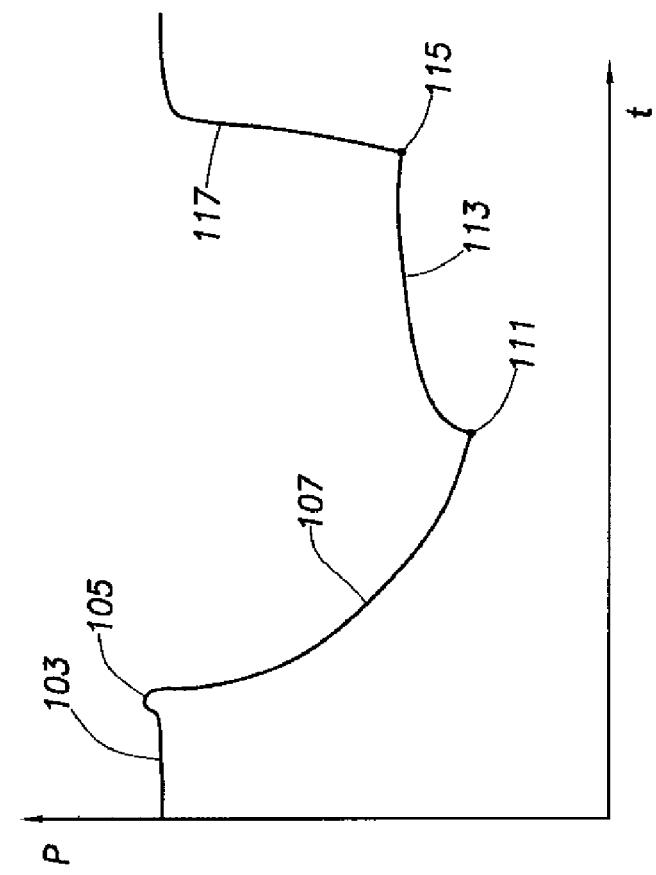
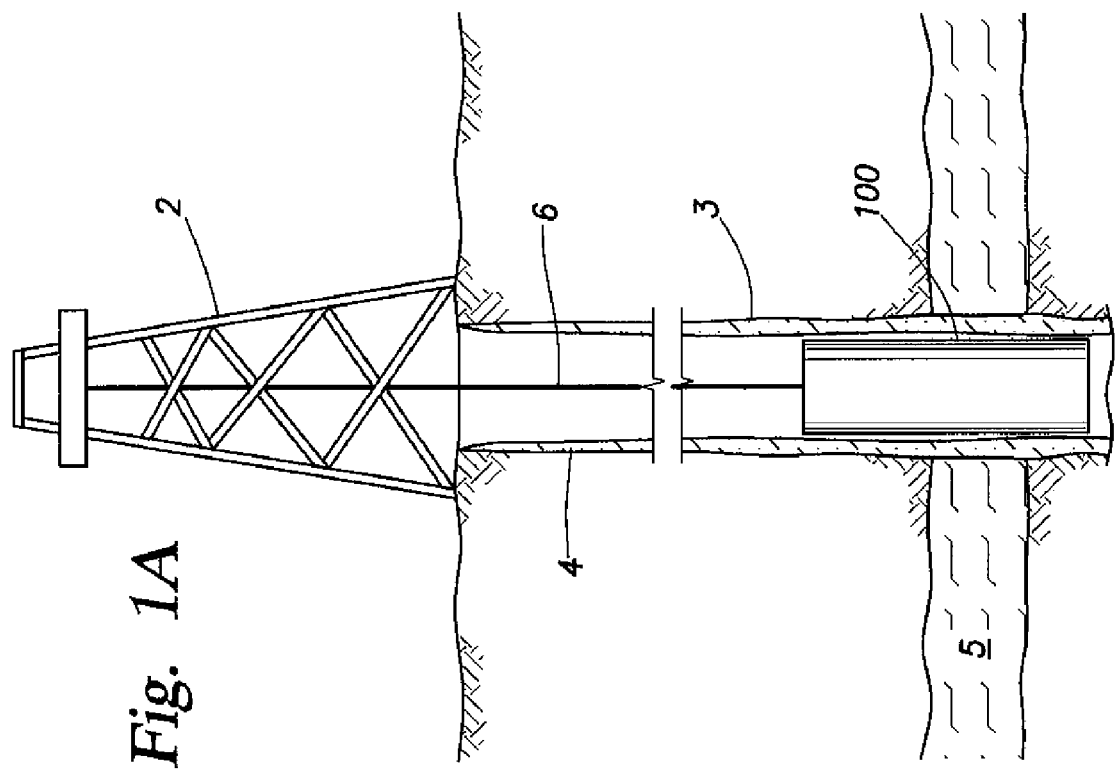
Fig. 1A
Fig. 2

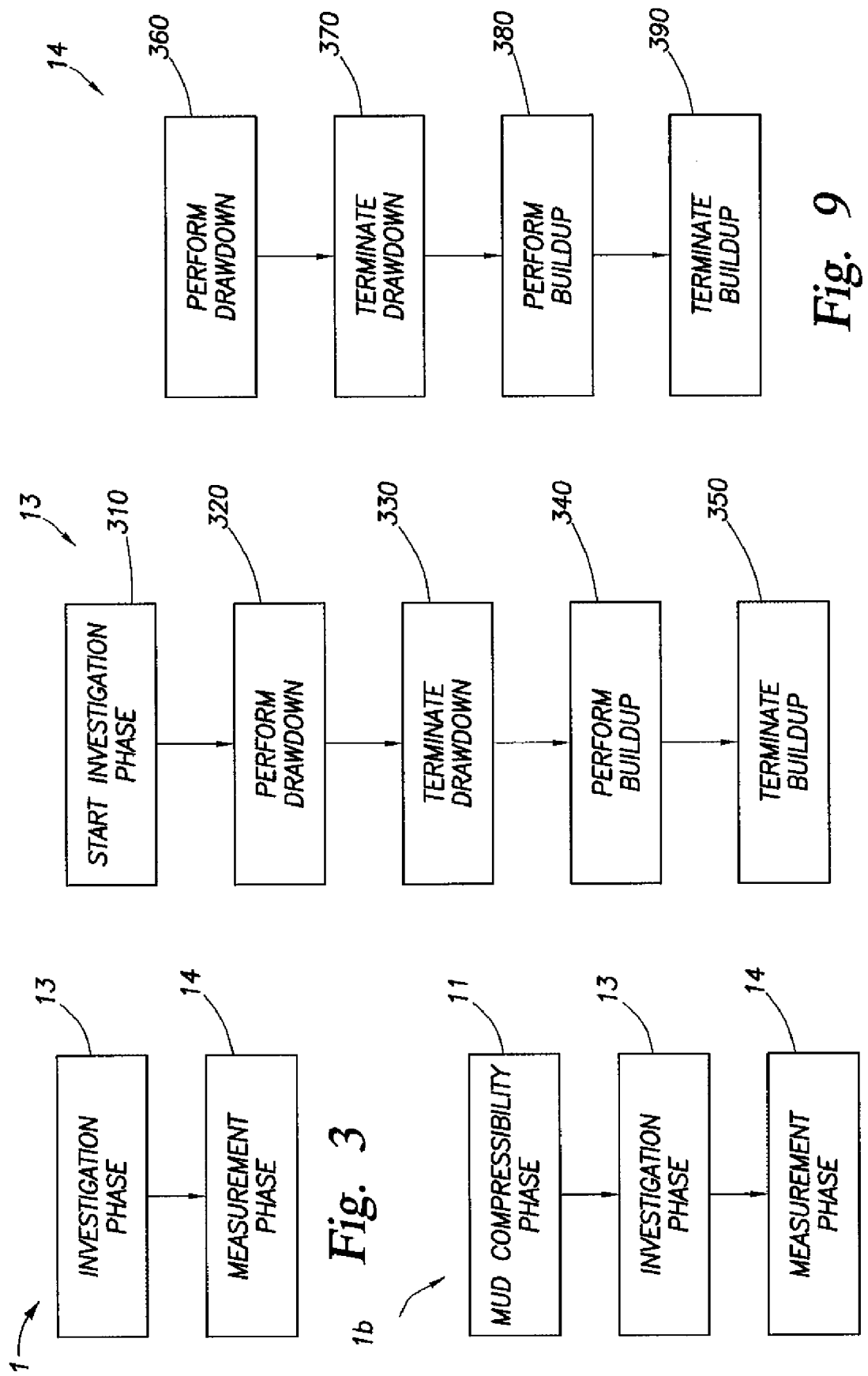

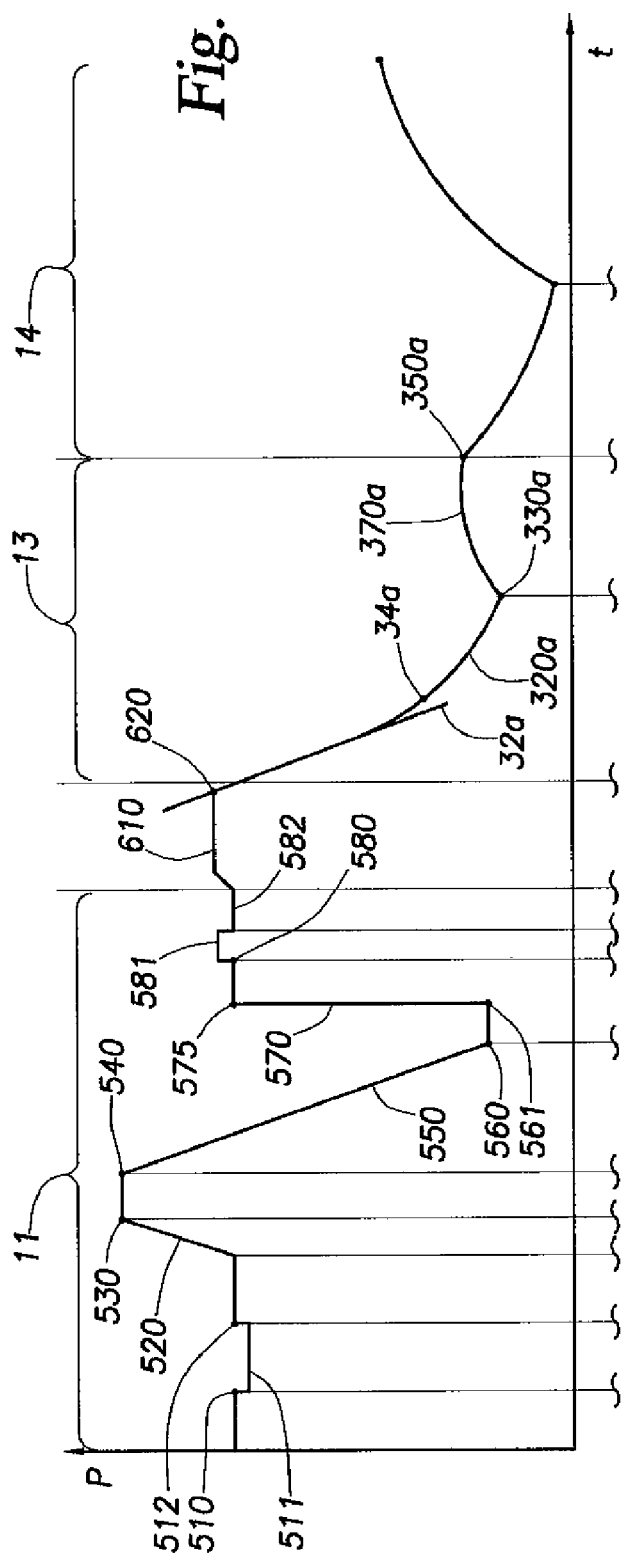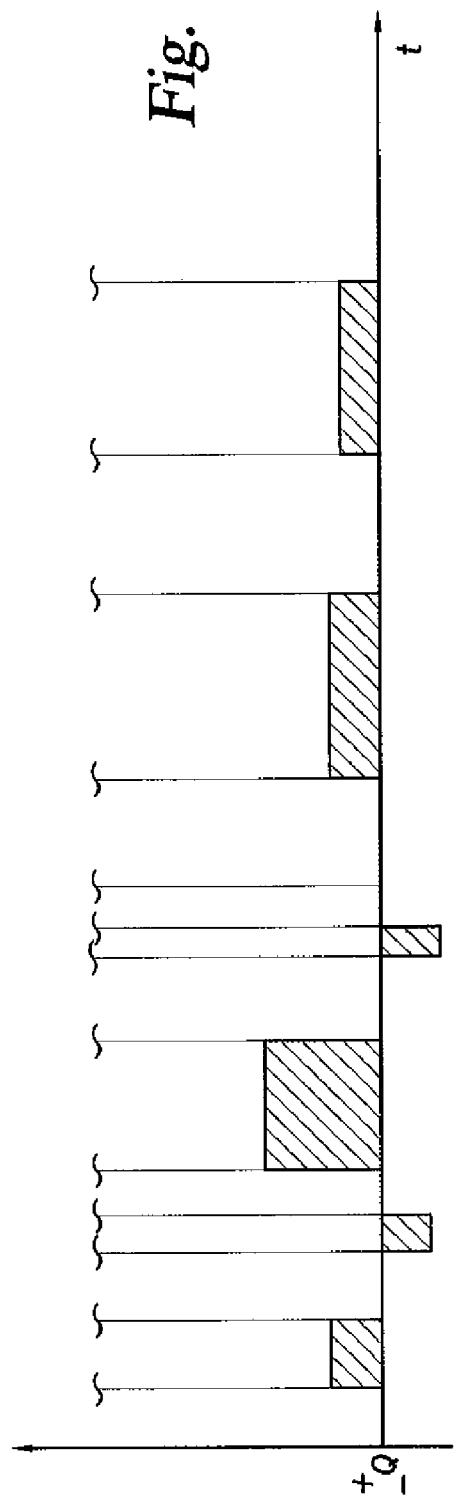

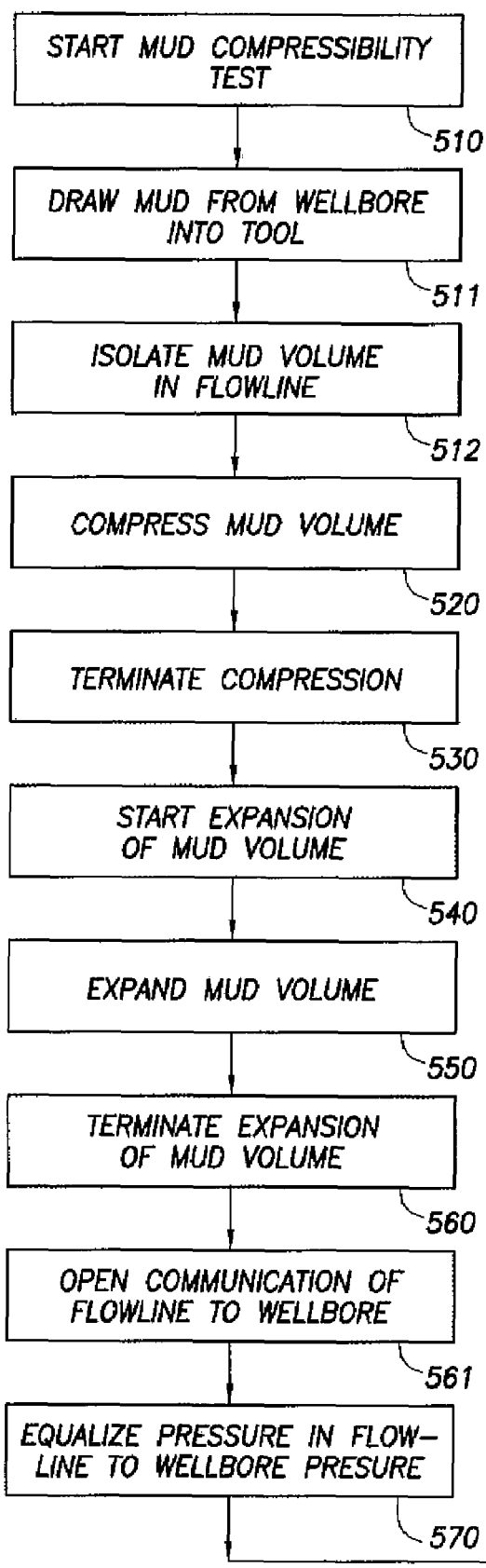
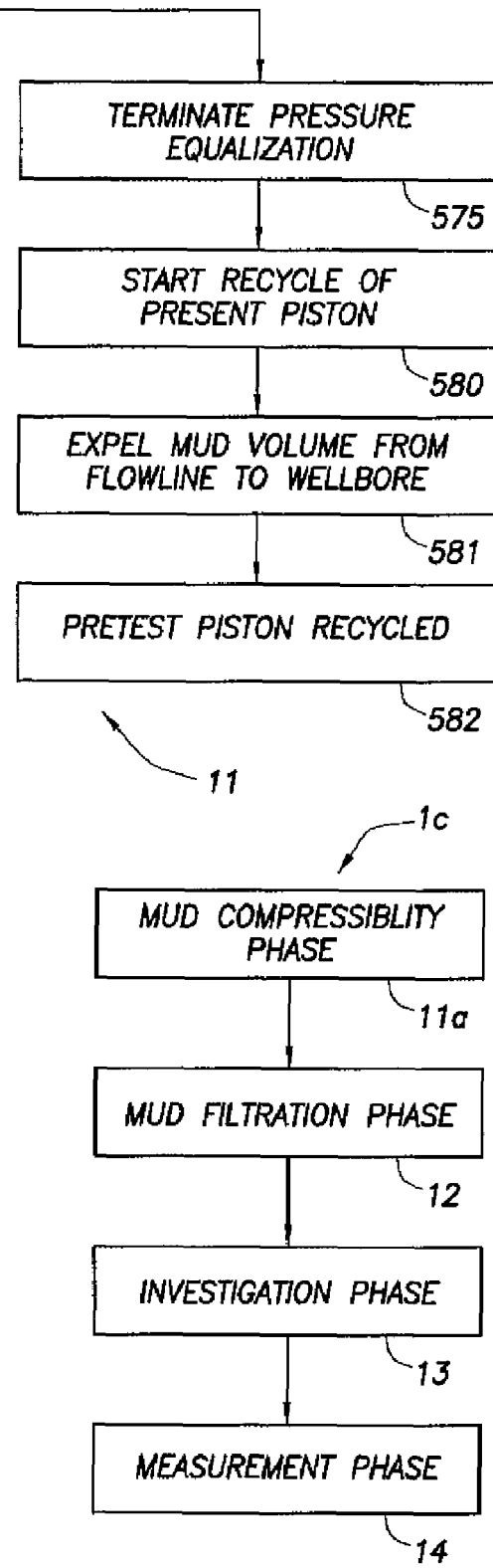
Fig. 12
Fig. 13

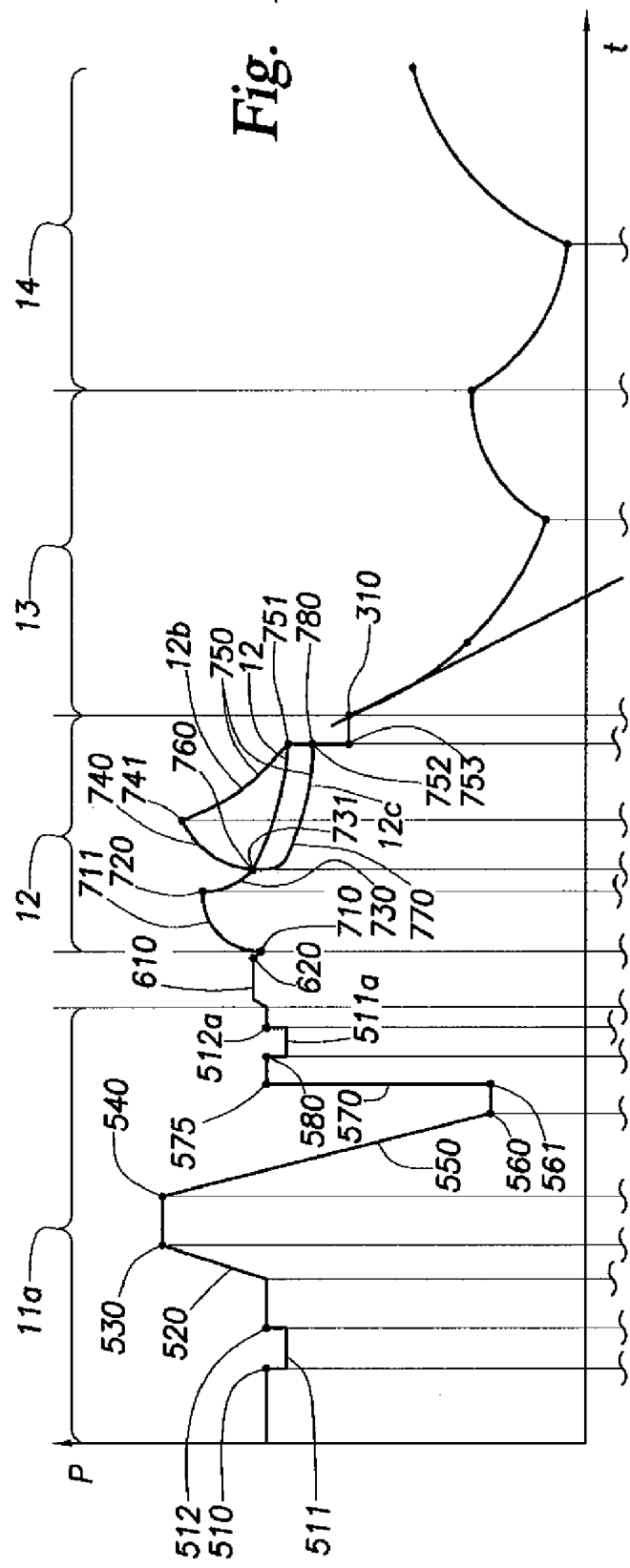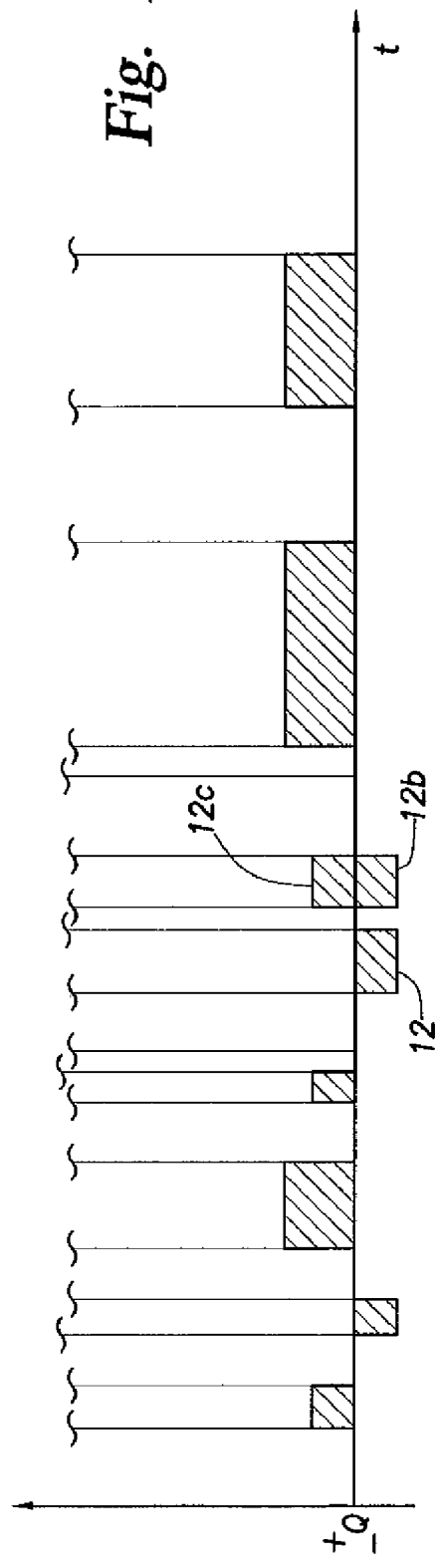

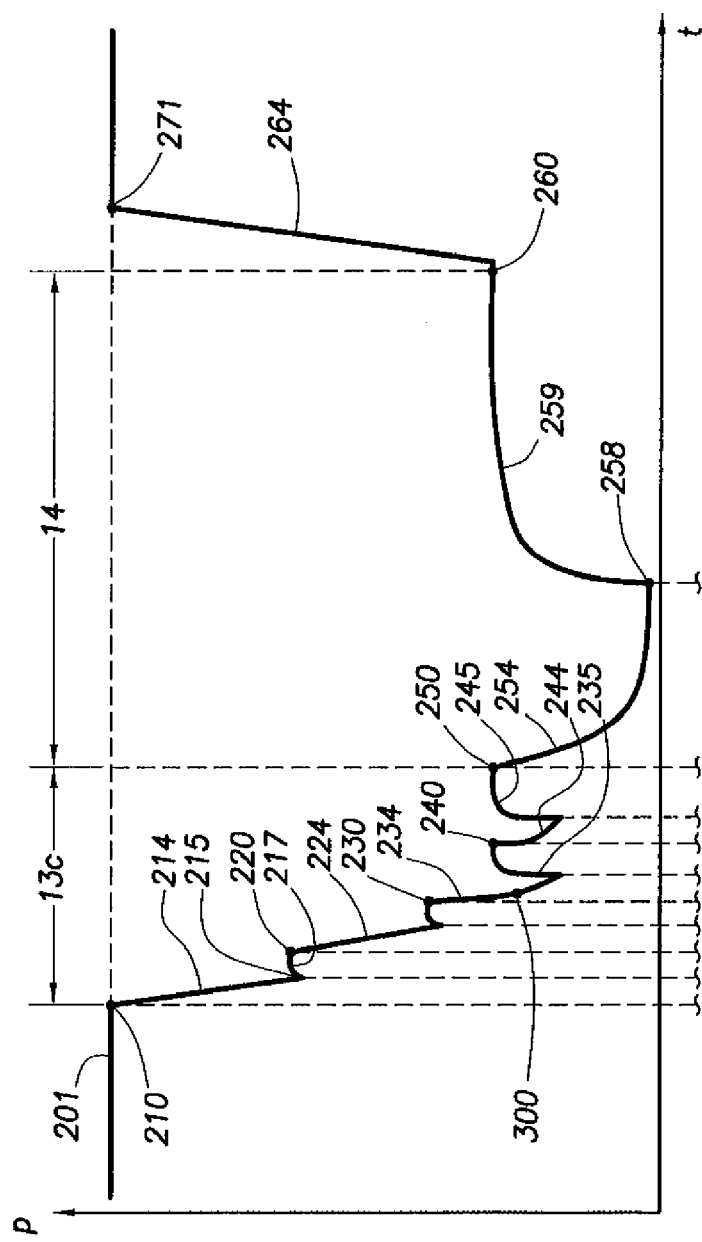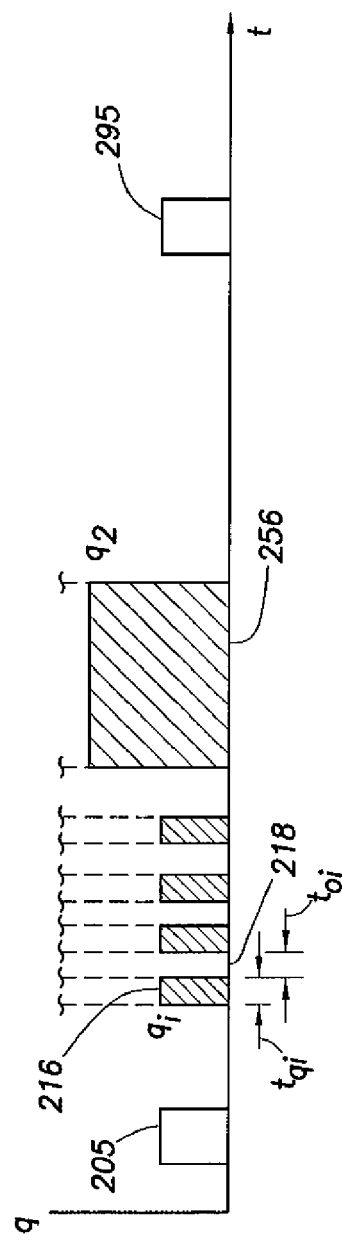

SYSTEM AND METHODS FOR WELL DATA COMPRESSION

CROSS-REFERENCE TO RELATED APPLICATIONS

The present application is a continuation-in-part of copending U.S. patent application Ser. No. 10/434,923, filed May 9, 2003, which is in turn a continuation-in-part of U.S. Pat. No. 6,832,515, filed Sep. 9, 2002, the disclosures of which are hereby incorporated herein in their entirety.

BACKGROUND OF THE INVENTION

1. Field of the Invention

The present invention relates generally to the field of well logging. More particularly, the invention relates to techniques for data compression by a downhole tool positioned in a wellbore penetrating a subterranean formation.

2. Background Art

Over the past several decades, highly sophisticated techniques have been developed for identifying and producing hydrocarbons, commonly referred to as oil and gas, from subsurface formations. These techniques facilitate the discovery, assessment, and production of hydrocarbons from subsurface formations.

When a subsurface formation containing an economically producible amount of hydrocarbons is believed to have been discovered, a borehole is typically drilled from the earth surface to the desired subsurface formation and tests are performed on the formation to determine whether the formation is likely to produce hydrocarbons of commercial value. Typically, tests performed on subsurface formations involve interrogating penetrated formations to determine whether hydrocarbons are actually present and to assess the amount of producible hydrocarbons therein. These preliminary tests are conducted using formation testing tools, often referred to as formation testers. Formation testers are typically lowered into a wellbore by a wireline cable, tubing, drill string, or the like, and may be used to determine various formation characteristics which assist in determining the quality, quantity, and conditions of the hydrocarbons or other fluids located therein. Other formation testers may form part of a drilling tool, such as a drill string, for the measurement of formation parameters during the drilling process.

Formation testers typically comprise slender tools adapted to be lowered into a borehole and positioned at a depth in the borehole adjacent to the subsurface formation for which data is desired. Once positioned in the borehole, these tools are placed in fluid communication with the formation to collect data from the formation. Typically, a probe, snorkel or other device is sealably engaged against the borehole wall to establish such fluid communication.

Formation testers are typically used to measure downhole parameters, such as wellbore pressures, formation pressures and formation mobilities, among others. They may also be used to collect samples from a formation so that the types of fluid contained in the formation and other fluid properties can be determined. The formation properties determined during a formation test are important factors in determining the commercial value of a well and the manner in which hydrocarbons may be recovered from the well. Moreover, formation properties determined by measurements while drilling (MWD) may be highly valuable in controlling further drilling operations.

The operation of formation testers may be more readily understood with reference to the structure of a conventional wireline formation tester shown in FIGS. 1A and 1B. As shown in FIG. 1A, the wireline tester 100 is lowered from an oil rig 2 into an open wellbore 3 filled with a fluid commonly referred to in the industry as "mud." The wellbore is lined with a mudcake 4 deposited onto the wall of the wellbore during drilling operations. The wellbore penetrates a formation 5.

The operation of a conventional modular wireline formation tester having multiple interconnected modules is described in more detail in U.S. Pat. Nos. 4,860,581 and 4,936,139 issued to Zimmerman et al. FIG. 2 depicts a graphical representation of a pressure trace over time measured by the formation tester during a conventional wireline formation testing operation used to determine parameters, such as formation pressure.

Referring now to FIGS. 1A and 1B, in a conventional wireline formation testing operation, a formation tester 100 is lowered into a wellbore 3 by a wireline cable 6. After lowering the formation tester 100 to the desired position in the wellbore, pressure in the flowline 119 in the formation tester may be equalized to the hydrostatic pressure of the fluid in the wellbore by opening an equalization valve (not shown). A pressure sensor or gauge 120 is used to measure the hydrostatic pressure of the fluid in the wellbore. The measured pressure at this point is graphically depicted along line 103 in FIG. 2. The formation tester 100 may then be "set" by anchoring the tester in place with hydraulically actuated pistons, positioning the probe 112 against the sidewall of the wellbore to establish fluid communication with the formation, and closing the equalization valve to isolate the interior of the tool from the well fluids. The point at which a seal is made between the probe and the formation and fluid communication is established, referred to as the "tool set" point, is graphically depicted at 105 in FIG. 2. Fluid from the formation 5 is then drawn into the formation tester 100 by retracting a piston 118 in a pretest chamber 114 to create a pressure drop in the flowline 119 below the formation pressure. This volume expansion cycle, referred to as a "drawdown" cycle, is graphically illustrated along line 107 in FIG. 2.

When the piston 118 stops retracting (depicted at point 111 in FIG. 2), fluid from the formation continues to enter the probe 112 until, given a sufficient time, the pressure in the flowline 119 is the same as the pressure in the formation 5, depicted at 115 in FIG. 2. This cycle, referred to as a "build-up" cycle, is depicted along line 113 in FIG. 2. As illustrated in FIG. 2, the final build-up pressure at 115, frequently referred to as the "sandface" pressure, is usually assumed to be a good approximation to the formation pressure.

The shape of the curve and corresponding data generated by the pressure trace may be used to determine various formation characteristics. For example, pressures measured during drawdown (107 in FIG. 2) and build-up (113 in FIG. 2) may be used to determine formation mobility, that is the ratio of the formation permeability to the formation fluid viscosity. When the formation tester probe (112 FIG. 1B) is disengaged from the wellbore wall, the pressure in flowline 119 increases rapidly as the pressure in the flowline equilibrates with the wellbore pressure, shown as line 117 in FIG. 2. After the formation measurement cycle has been completed, the formation tester 100 may be disengaged and repositioned at a different depth and the formation test cycle repeated as desired.

During this type of test operation for a wireline-conveyed tool, pressure data collected downhole is typically communicated to the surface electronically via the wireline communication system. At the surface, an operator typically monitors the pressure in flowline 119 at a console and the wireline logging system records the pressure data in real time. Data recorded during the drawdown and buildup cycles of the test may be analyzed either at the well site computer in real time or later at a data processing center to determine crucial formation parameters, such as formation fluid pressure, the mud overbalance pressure, i.e. the difference between the wellbore pressure and the formation pressure, and the mobility of the formation.

Wireline formation testers allow high data rate communications for real-time monitoring and control of the test and tool through the use of wireline telemetry. This type of communication system enables field engineers to evaluate the quality of test measurements as they occur, and, if necessary, to take immediate actions to abort a test procedure and/or adjust the pretest parameters before attempting another measurement. For example, by observing the data as they are collected during the pretest drawdown, an engineer may have the option to change the initial pretest parameters, such as drawdown rate and drawdown volume, to better match them to the formation characteristics before attempting another test. Examples of prior art wireline formation testers and/or formation test methods are described, for example, in U.S. Pat. Nos. 3,934,468 issued to Brieger; 4,860,581 and 4,936,139 issued to Zimmerman et al.; and 5,969,241 issued to Auzerais. These patents are assigned to the assignee of the present invention.

Formation testers may also be used during drilling operations. For example, one such downhole drilling tool adapted for collecting data from a subsurface formation during drilling operations is disclosed in U.S. Pat. No. 6,230,557 B1 issued to Ciglenec et al., which is assigned to the assignee of the present invention. Other examples of downhole drilling tools with formation testing capabilities are described in patent Nos. U.S. Pat. No. 5,803,186, U.S. Pat. No. 7,114,562, and U.S. Pat. No. 5,233,866 among others.

Various techniques have been developed for performing specialized formation testing operations, or pretests. For example, U.S. Pat. Nos. 5,095,745 and 5,233,866 both issued to DesBrandes describe a method for determining formation parameters by analyzing the point at which the pressure deviates from a linear draw down. Other examples of such techniques are provided in patent/application Nos. U.S. Pat. No. 6,932,167, U.S. Pat. No. 7,011,155, US 2004/0231842 and US 2005/0039527.

Despite the advances made in developing methods for performing pretests, there remains a need to eliminate delays and errors in the pretest process, and to improve the accuracy of the parameters derived from such tests. Because formation testing operations are used throughout drilling operations, the duration of the test and the absence of real-time communication with the tools are major constraints that must be considered. The problems associated with real-time communication for these operations are largely due to the current limitations of the telemetry typically used during drilling operations, such as mud-pulse telemetry. Limitations, such as uplink and downlink telemetry data rates for most logging while drilling (LWD) or measurement while drilling (MWD) tools, result in slow exchanges of information between the downhole tool and the surface. For example, a simple process of sending a pretest pressure trace to the surface, followed by an engineer sending a command downhole to retract the probe based on the data transmitted may result in substantial delays which tend to adversely impact drilling operations.

Delays also increase the possibility of tools becoming stuck in the wellbore. To reduce the possibility of sticking, drilling operation specifications based on prevailing formation and drilling conditions are often established to dictate how long a drill string may be immobilized in a given borehole. Under these specifications, the drill string may only be allowed to be immobile for a limited period of time to deploy a probe and perform a pressure measurement. Accordingly, it may not be feasible to transmit all the data acquired during a test in real-time due to limitations associated with telemetry bandwidth, and thus appropriate data analysis and/or control may not be possible.

Formation pressure while drilling (FPWD) measurements, wherein a two phase test protocol is implemented, illustrates the need for real-time formation testing data communication. For example, a FPWD pretest may comprise a first phase, perhaps including drawdown and buildup cycles, conducted as an investigation phase and a second phase, perhaps again including drawdown and buildup cycles, conducted as a measurement phase. Data from the investigation phase may used to configure/perform the measurement phase. If the data from the investigation phase is not provided uphole, appropriate analysis and/or control with respect to configuring the measurement phase, continuing the test, etc. may not be possible. Similarly, if data from the measurement phase is not provided uphole, appropriate analysis and/or control with respect to continued drilling operations, further testing, etc. may not be possible. A 5 minute time-limited pretest having a 15 Hz sampling rate with 16 bits/sample, for example, produces 72000 bits per data channel. However, where mud pulse telemetry is implemented, the communication channel capacity is typically limited to between 0.5 to 12 bits/sec. Such a communication channel is typically insufficient to carry the aforementioned FPWD pretest data in real-time.

Therefore, systems and methods are desired that enable the communication of robust data, in real-time or near real-time, using low bandwidth communication channels.

BRIEF SUMMARY OF THE DISCLOSURE

The present invention is directed to systems and methods in which data compression techniques are utilized to fill a predetermined channel capacity, such as the available bandwidth in a data communication channel, for data transmission.

According to one aspect of the disclosure, a method for generating a well log from a down hole tool positioned in a wellbore is provided. The method includes determining a data transmission bandwidth associated with the wellbore available to the downhole tool, identifying a plurality of events in a data stream of the downhole tool, determining values associated with the plurality of events, and determining a portion of the data transmission bandwidth to be available for data transmission after a bandwidth for transmission of values associated with the plurality of events is deducted from said data transmission bandwidth. The method further includes selecting data points from the data stream that are selected as a function of the portion of the data transmission bandwidth to be available for data transmission, determining values associated with the selected data points, transmitting to a surface system the values associated with the plurality of events and with the selected data points, and incorporating the transmitted values into the well log.

According to another aspect of the disclosure, a method for generating a well log from a downhole tool positioned in a wellbore is provided. The method includes acquiring data associated with an operation of the downhole tool, identifying a plurality of events associated with the operation of the downhole tool, and selecting data points that are selected as a function of the plurality of events and a growth function for transmission by the downhole tool. The method further includes determining values associated with the plurality of events and the data points for transmission by the downhole tool, transmitting to a surface system the determined values, and incorporating the transmitted data into the well log.

The foregoing has outlined rather broadly the features and technical advantages of the present disclosure in order that the detailed description that follows may be better understood. Additional features and advantages will be described hereinafter which form the subject of the claims. It should be appreciated by those skilled in the art that the conception and specific embodiment disclosed may be readily utilized as a basis for modifying or designing other structures for carrying out the same purposes. It should also be realized by those skilled in the art that such equivalent constructions do not depart from the spirit and scope of the invention as set forth in the appended claims. The disclosure will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWING

For a more complete understanding of the present invention, reference is now made to the following descriptions taken in conjunction with the accompanying drawing, in which:

FIG. 1A shows a conventional wireline formation tester disposed in a wellbore;

FIG. 2 shows a graphical representation of pressure measurements versus time plot for a typical prior art pretest sequence performed using a conventional formation tester;

FIG. 3 shows a flow chart of steps involved in a pretest according to an embodiment of the invention;

FIG. 6 shows a flow chart detailing the steps involved in performing the investigation phase of the flow chart of FIG. 3;

FIG. 9 shows a flow chart detailing the steps involved in performing the measurement phase of the flow chart of FIG. 3;

FIG. 10 shows a flow chart of steps involved in a pretest according to an embodiment of the invention incorporating a mud compressibility phase;

FIG. 11A shows a graphical representations of a pressure measurements versus time plot for performing the pretest of FIG. 10;

FIG. 11B shows the rate of change of volume corresponding to the graphical representation of FIG. 11A;

FIG. 12 shows a flow chart detailing the steps involved in performing the mud compressibility phase of the flow chart of FIG. 10;

FIG. 13 shows a flow chart of steps involved in a pretest according to an embodiment of the invention incorporating a mud filtration phase;

FIG. 14A shows a graphical representation of a pressure measurements versus time plot for performing the pretest of FIG. 13;

FIG. 14B shows the rate of change of volume corresponding to the graphical representation of FIG. 14A;

FIGS. 16A-C show flow chart detailing the steps involved in performing the mud filtration phase of the flow chart of FIG. 13, wherein FIG. 16A shows a mud filtration phase, FIG. 16B shows a modified mud filtration phase with a repeat compression cycle, and FIG. 16C shows a modified mud filtration phase with a decompression cycle;

FIG. 19A shows a graphical representation of a pressure measurements versus time plot for performing a pretest including a modified investigation phase in accordance with one embodiment of the invention;

FIG. 19B shows the rate of change of volume corresponding to the graphical representation of FIG. 19A;

DETAILED DESCRIPTION OF THE INVENTION

An embodiment for estimating formation properties (e.g. formation pressures and mobilities) is shown in the block diagram of FIG. 3. As shown in FIG. 3, the method includes an investigation phase 13 and a measurement phase 14.

Figure 1B:
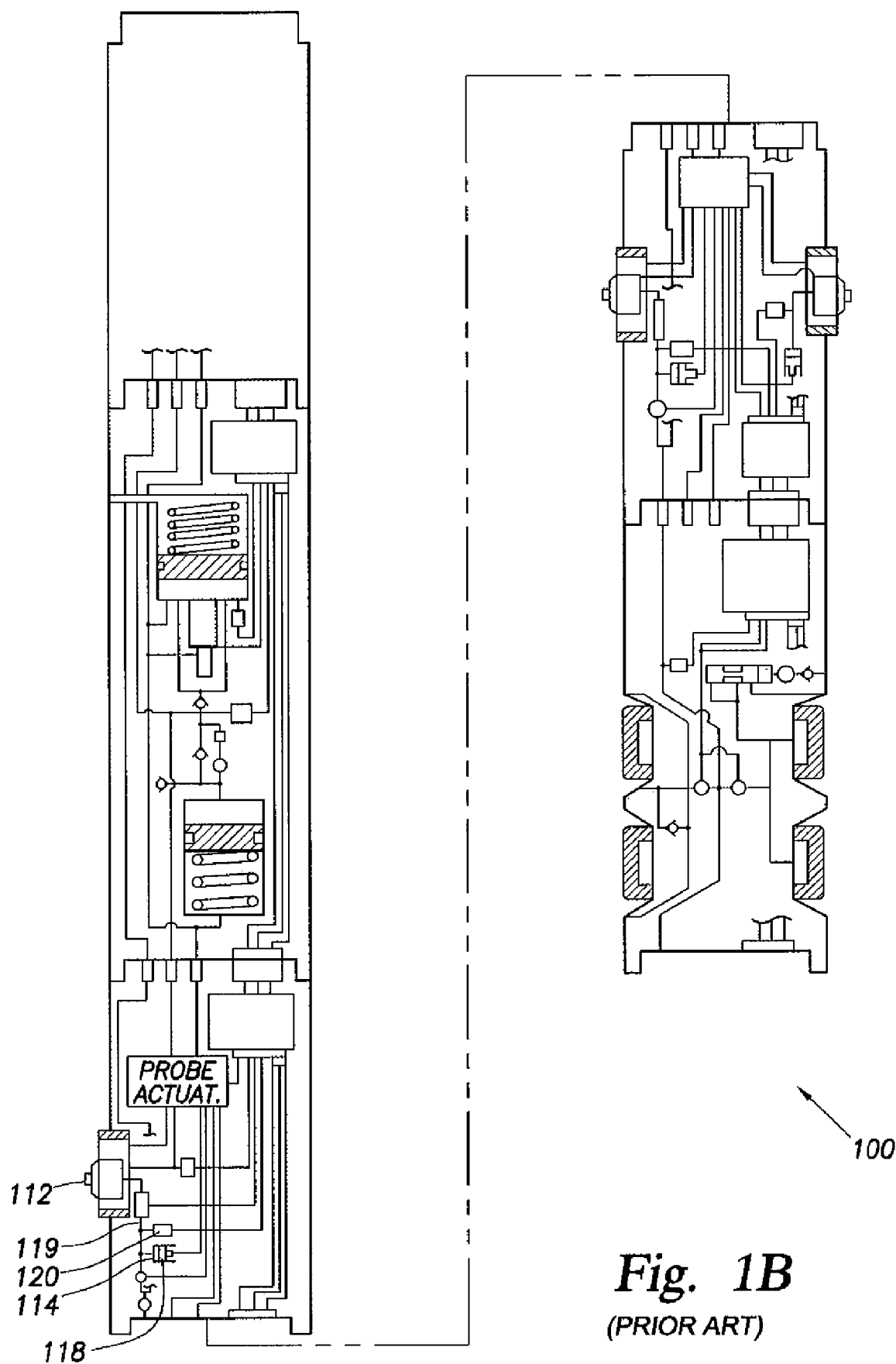
FIG. 1B shows a cross sectional view of the modular conventional wireline formation tester of FIG. 1A.

The method may be practiced with any formation tester known in the art, such as the tester described with respect to FIGS. 1A and 1B. Other formation testers may also be used and/or adapted for embodiments of the invention, such as the wireline formation tester of U.S. Pat. Nos. 4,860,581 and 4,936,139 issued to Zimmerman et al., the downhole drilling tool of U.S. Pat. No. 6,230,557 B1 issued to Ciglenec et al. and/or U.S. Patent Application No. 2005/0109538, the entire contents of which are hereby incorporated by reference.

Figure 4:
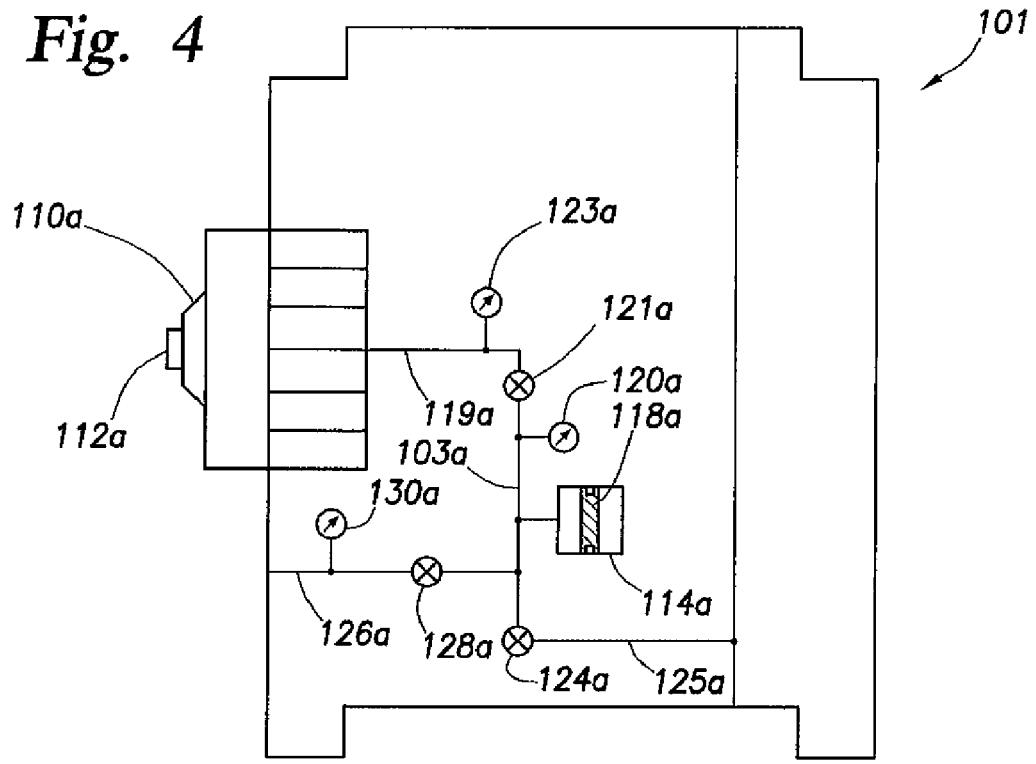
FIG. 4 shows a schematic of components of a module of a formation tester suitable for practicing embodiments of the invention.

A version of a probe module usable with such formation testers is depicted in FIG. 4. The module 101 includes a probe 112a, a packer 110a surrounding the probe, and a flow line 119a extending from the probe into the module. The flow line 119a extends from the probe 112a to probe isolation valve 121a, and has a pressure gauge 123a. A second flow line 103a extends from the probe isolation valve 121a to sample line isolation valve 124a and equalization valve 128a, and has pressure gauge 120a. A reversible pretest piston 118a in a pretest chamber 114a also extends from flow line 103a. Exit line 126a extends from equalization valve 128a and out to the wellbore and has a pressure gauge 130a. Sample flow line 125a extends from sample line isolation valve 124a and through the tool. Fluid sampled in flow line 125a may be captured, flushed, or used for other purposes.

Probe isolation valve 121a isolates fluid in flow line 119a from fluid in flow line 103a. Sample line isolation valve 124a, isolates fluid in flow line 103a from fluid in sample line 125a. Equalizing valve 128a isolates fluid in the wellbore from fluid in the tool. By manipulating the valves to selectively isolate fluid in the flow lines, the pressure gauges 120a and 123a may be used to determine various pressures. For example, by closing valve 121a formation pressure may be read by gauge 123a when the probe is in fluid communication with the formation while minimizing the tool volume connected to the formation.

In another example, with equalizing valve 128a open mud may be withdrawn from the wellbore into the tool by means of pretest piston 118a. On closing equalizing valve 128a, probe isolation valve 121a and sample line isolation valve 124a fluid may be trapped within the tool between these valves and the pretest piston 118a. Pressure gauge 130a may be used to monitor the wellbore fluid pressure continuously throughout the operation of the tool and together with pressure gauges 120a and/or 123a may be used to measure directly the pressure drop across the mudcake and to monitor the transmission of wellbore disturbances across the mudcake for later use in correcting the measured sandface pressure for these disturbances.

Among the functions of pretest piston 118a is to withdraw fluid from or inject fluid into the formation or to compress or expand fluid trapped between probe isolation valve 121a, sample line isolation valve 124a and equalizing valve 128a. The pretest piston 118a preferably has the capability of being operated at low rates, for example 0.01 cm$^3$/sec, and high rates, for example 10 cm$^3$/sec, and has the capability of being able to withdraw large volumes in a single stroke, for example 100 cm$^3$. In addition, if it is necessary to extract more than 100 cm$^3$ from the formation without retracting the probe, the pretest piston 118a may be recycled. The position of the pretest piston 118a preferably can be continuously monitored and positively controlled and its position can be "locked" when it is at rest. In some embodiments, the probe 112a may further include a filter valve (not shown) and a filter piston (not shown).

Various manipulations of the valves, pretest piston and probe allow operation of the tool according to the described methods. One skilled in the art would appreciate that, while these specifications define a preferred probe module, other specifications may be used without departing from the scope of the invention. While FIG. 4 depicts a probe type module, it will be appreciated that either a probe tool or a packer tool may be used, perhaps with some modifications. The following description assumes a probe tool is used. However, one skilled in the art would appreciate that similar procedures may be used with packer tools.

The techniques disclosed herein are also usable with other devices incorporating a flowline. The term "flowline" as used herein shall refer to a conduit, cavity or other passage for establishing fluid communication between the formation and the pretest piston and/or for allowing fluid flow there between. Other such devices may include, for example, a device in which the probe and the pretest piston are integral. An example of such a device is disclosed in U.S. Pat. No. 6,230,557 B1 and U.S. patent application Ser. No. 10/248,782, assigned to the assignee of the present invention.

Figure 5:
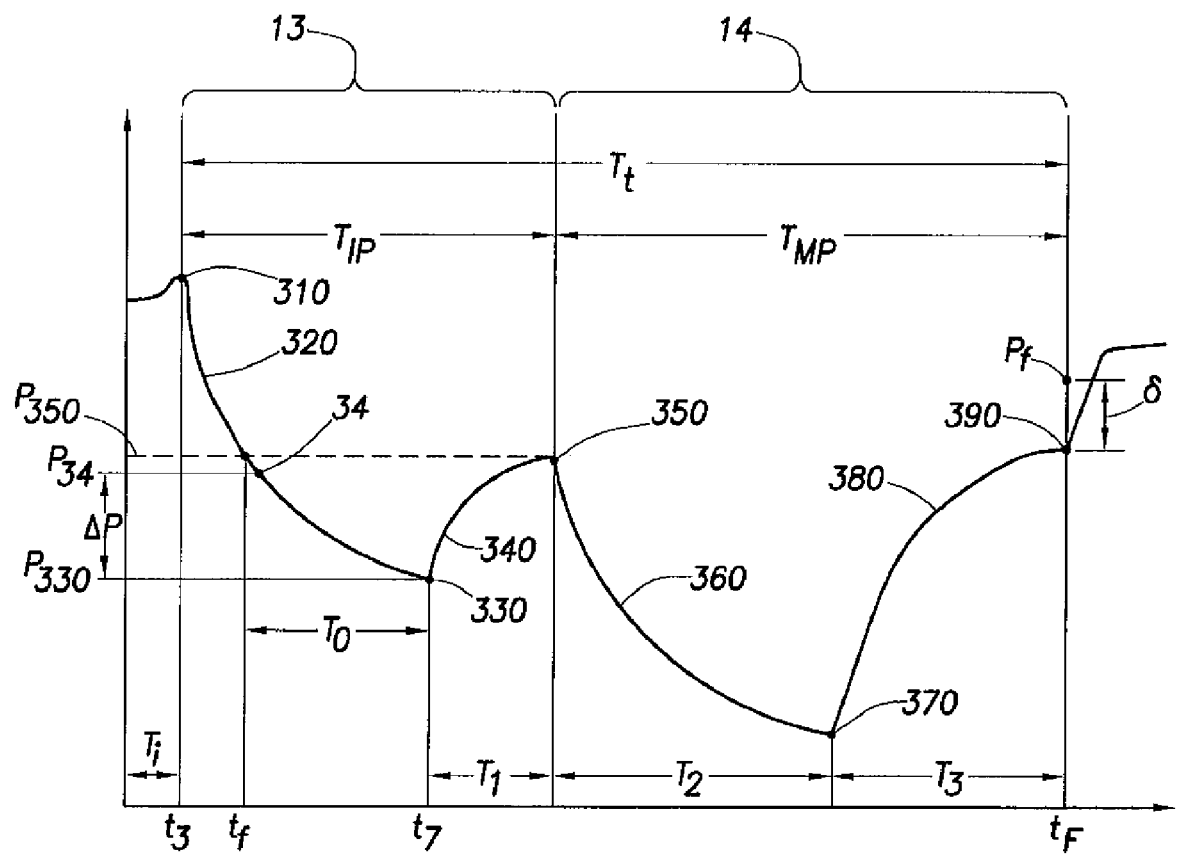
FIG. 5 shows a graphical representation of a pressure measurements versus time plot for performing the pretest of FIG. 3.

As shown in FIG. 5, the investigation phase 13 relates to obtaining initial estimates of formation parameters, such as formation pressure and formation mobility. These initial estimates may then be used to design the measurement phase 14. If desired and allowed, a measurement phase is then performed according to these parameters to generate a refined estimate of the formation parameters. FIG. 5 depicts a corresponding pressure trace illustrating the changes in pressure over time as the method of FIG. 3 is performed. It will be appreciated that, while the pressure trace of FIG. 5 may be performed by the apparatus of FIG. 4, it may also be performed by other downhole tools, such as the tester of FIGS. 1A and 1B.

The investigation phase 13 is shown in greater detail in FIG. 6. The investigation phase comprises initiating the drawdown 310 after the tool is set for duration $T_i$ at time $t_3$, performing the drawdown 320, terminating the drawdown 330, performing the buildup 340 and terminating the buildup 350. To start the investigation phase according to step 310, the probe 112a is placed in fluid communication with the formation and anchored into place and the interior of the tool is isolated from the wellbore. The drawdown 320 is performed by advancing the piston 111a in pretest chamber 114a. To terminate drawdown 330, the piston 118a is stopped. The pressure will begin to build up in flow line 119a until the buildup 340 is terminated at 350. The investigation phase lasts for a duration of time $T_{IP}$. The investigation phase may also be performed as previously described with respect to FIGS. 1B and 2, the drawdown flow rate and the drawdown termination point being pre-defined before the initiation of the investigation phase.

Figure 7:
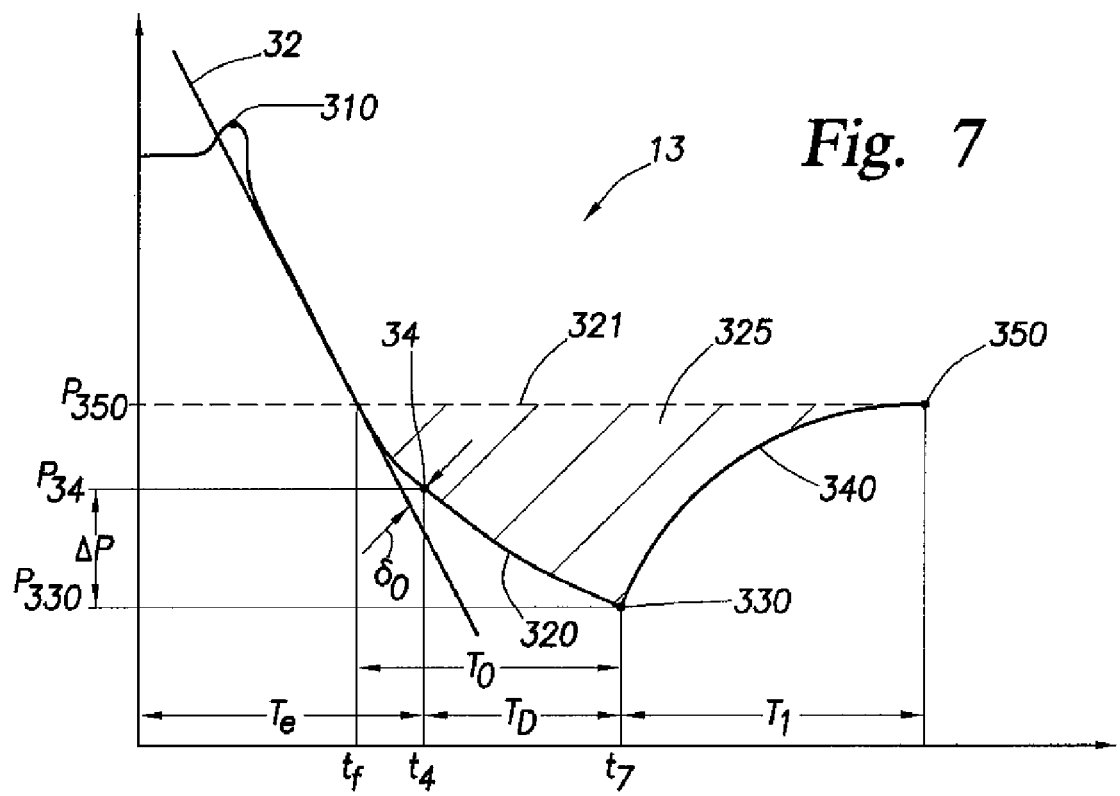
FIG. 7 shows a detailed view of the investigation phase portion of the plot of FIG. 5 depicting the termination of drawdown.

The pressure trace of the investigation phase 13 is shown in greater detail in FIG. 7. Parameters, such as formation pressure and formation mobility, may be determined from an analysis of the data derived from the pressure trace of the investigation phase. For example, termination point 350 represents a provisional estimate of the formation pressure. Alternatively, formation pressures may be estimated more precisely by extrapolating the pressure trend obtained during build up 340 using techniques known by those of skill in the art, the extrapolated pressure corresponding to the pressure that would have been obtained had the buildup been allowed to continue indefinitely. Such procedures may require additional processing to arrive at formation pressure.

Formation mobility $(K/\mu)_1$ may also be determined from the build up phase represented by line 340. Techniques known by those of skill in the art may be used to estimate the formation mobility from the rate of pressure change with time during build up 340. Such procedures may require additional processing to arrive at estimates of the formation mobility.

Alternatively, the work presented in a publication by Goode at al entitled "Multiple Probe Formation Testing and Vertical Reservoir Continuity", SPE 22738, prepared for presentation at the 1991 Society of Petroleum Engineers Annual Technical Conference and Exhibition, held at Dallas, Tex. on Oct. 6 through 9, 1991 implies that the area of the graph depicted by the shaded region and identified by reference numeral 325, denoted herein by A, may be used to predict formation mobility. This area is bounded by a line 321 extending horizontally from termination point 350 (representing the estimated formation pressure $P_{350}$ at termination), the drawdown line 320 and the build up line 340. This area may be determined and related to an estimate of the formation mobility through use of the following equation:

$$\left(\frac{K}{\mu}\right)_1 = \frac{V_1}{4r_p} \frac{\Omega_S}{A} + \varepsilon_K \quad (1)$$

where $(K/\mu)_1$ is the first estimate of the formation mobility (D/cP), where K is the formation permeability (Darcies, denoted by D) and $\mu$ is the formation fluid viscosity (cP) (since the quantity determined by formation testers is the ratio of the formation permeability to the formation fluid viscosity, i.e. the mobility, the explicit value of the viscosity is not needed); $V_1$ (cm³) is the volume extracted from the formation during the investigation pretest, $V_1 = V(t_7+T_1) - V(t_7-T_0) = V(t_7) - V(t_7-T_0)$ where V is the volume of the pretest chamber; $r_p$ is the probe radius (cm); and $\varepsilon_K$ is an error term which is typically small (less than a few percent) for formations having a mobility greater than 1 mD/cP.

The variable $\Omega_S$, which accounts for the effect of a finite-size wellbore on the pressure response of the probe, may be determined by the following equation described in a publication by F. J. Kuchuk entitled "Multiprobe Wireline Formation Tester Pressure Behavior in Crossflow-Layered Reservoirs", In Situ, (1996) 20, 1, 1:

$$\Omega_S = 0.994 - 0.003\,\vartheta - 0.353\,\vartheta^2 - 0.714\,\vartheta^3 + 0.709\,\vartheta^4 \quad (2)$$

where $r_p$ and $r_w$ represent the radius of the probe and the radius of the well, respectively; $\rho = r_p/r_w$, $\eta = K_r/K_z$; $\vartheta = 0.58 + 0.078 \log \eta + 0.26 \log \sigma + 0.8\rho^2$; and $K_r$ and $K_z$ represent the radial permeability and the vertical permeability, respectively.

In stating the result presented in equation 1 it has been assumed that the formation permeability is isotropic, that is $K_r = K_z = K$, that the flow regime during the test is "spherical", and that the conditions which ensure the validity of Darcy's relation hold.

Referring still to FIG. 7, the drawdown step 320 of the investigation phase may be analyzed to determine the pressure drop over time to determine various characteristics of the pressure trace. A best fit line 32 derived from points along drawdown line 320 is depicted extending from initiation point 310. A deviation point 34 may be determined along curve 320 representing the point at which the curve 320 reaches a minimum deviation $\delta_0$ from the best fit line 32. The deviation point 34 may be used as an estimate of the "onset of flow", the point at which fluid is delivered from the formation into the tool during the investigation phase drawdown.

The deviation point 34 may be determined by known techniques, such as the techniques disclosed in U.S. Pat. Nos. 5,095,745 and 5,233,866 both issued to Desbrandes, the entire contents of which are hereby incorporated by reference. Debrandes teaches a technique for estimating the formation pressure from the point of deviation from a best fit line created using data points from the drawdown phase of the pretest. The deviation point may alternatively be determined by testing the most recently acquired point to see if it remains on the linear trend representing the flowline expansion as successive pressure data are acquired. If not the drawdown may be terminated and the pressure allowed to stabilize. The deviation point may also be determined by taking the derivative of the pressure recorded during 320 with respect to time. When the derivative changes (presumably becomes less) by 2-5%, the corresponding point is taken to represent the beginning of flow from the formation. If necessary, to confirm that the deviation from the expansion line represents flow from the formation, further small-volume pretests may be performed.

Other techniques may be used to determine deviation point 34. For example, another technique for determining the deviation point 34 is based on mud compressibility and will be discussed further with respect to FIGS. 9-11.

Once the deviation point 34 is determined, the drawdown is continued beyond the point 34 until some prescribed termination criterion is met. Such criteria may be based on pressure, volume and/or time. Once the criterion has been met, the drawdown is terminated and termination point 330 is reached. It is desirable that the termination point 330 occur at a given pressure $P_{330}$ within a given pressure range □P relative to the deviation pressure $P_{34}$ corresponding to deviation point 34 of FIG. 7. Alternatively, it may be desirable to terminate drawdown within a given period of time following the determination of the deviation point 34. For example, if deviation occurs at time $t_4$, termination may be preset to occur by time $t_7$, where the time expended between time $t_4$ and $t_7$ designated as $T_D$ and is limited to a maximum duration. Another criterion for terminating the pretest is to limit the volume withdrawn from the formation after the point of deviation 34 has been identified. This volume may be determined by the change in volume of the pretest chamber 114a (FIG. 4). The maximum change in volume may be specified as a limiting parameter for the pretest.

One or more of the limiting criteria, pressure, time and/or volume, may be used alone or in combination to determine the termination point 330. If, for example, as in the case of highly permeable formations, a desired criterion, such as a predetermined pressure drop, cannot be met, the duration of the pretest may be further limited by one or more of the other criteria.

After deviation point 34 is reached, pressure continues to fall along line 320 until expansion terminates at point 330. At this point, the probe isolation valve 121a is closed and/or the pretest piston 118a is stopped and the investigation phase build up 340 commences. The build up of pressure in the flowline continues until termination of the buildup occurs at point 350.

The pressure at which the build up becomes sufficiently stable is often taken as an estimate of the formation pressure. The buildup pressure is monitored to provide data for estimating the formation pressure from the progressive stabilization of the buildup pressure. In particular, the information obtained may be used in designing a measurement phase transient such that a direct measurement of the formation pressure is achieved at the end of build up. The question of how long the investigation phase buildup should be allowed to continue to obtain an initial estimate of the formation pressure remains.

It is clear from the previous discussion that the buildup should not be terminated before pressure has recovered to the level at which deviation from the flowline decompression was identified, i.e. the pressure designated by $P_{34}$ on FIG. 7. In one approach, a set time limit may be used for the duration of the buildup $T_1$. $T_1$ may be set at some number, such as 2 to 3 times the time of flow from the formation $T_0$. Other techniques and criteria may be envisioned.

As shown in FIGS. 5 and 7, termination point 350 depicts the end of the buildup, the end of the investigation phase and/or the beginning of the measurement phase. Certain criteria may be used to determine when termination 350 should occur. A possible approach to determination of termination 350 is to allow the measured pressure to stabilize. To establish a point at which a reasonably accurate estimate of formation pressure at termination point 350 may be made relatively quickly, a procedure for determining criteria for establishing when to terminate may be used.

Figure 8:
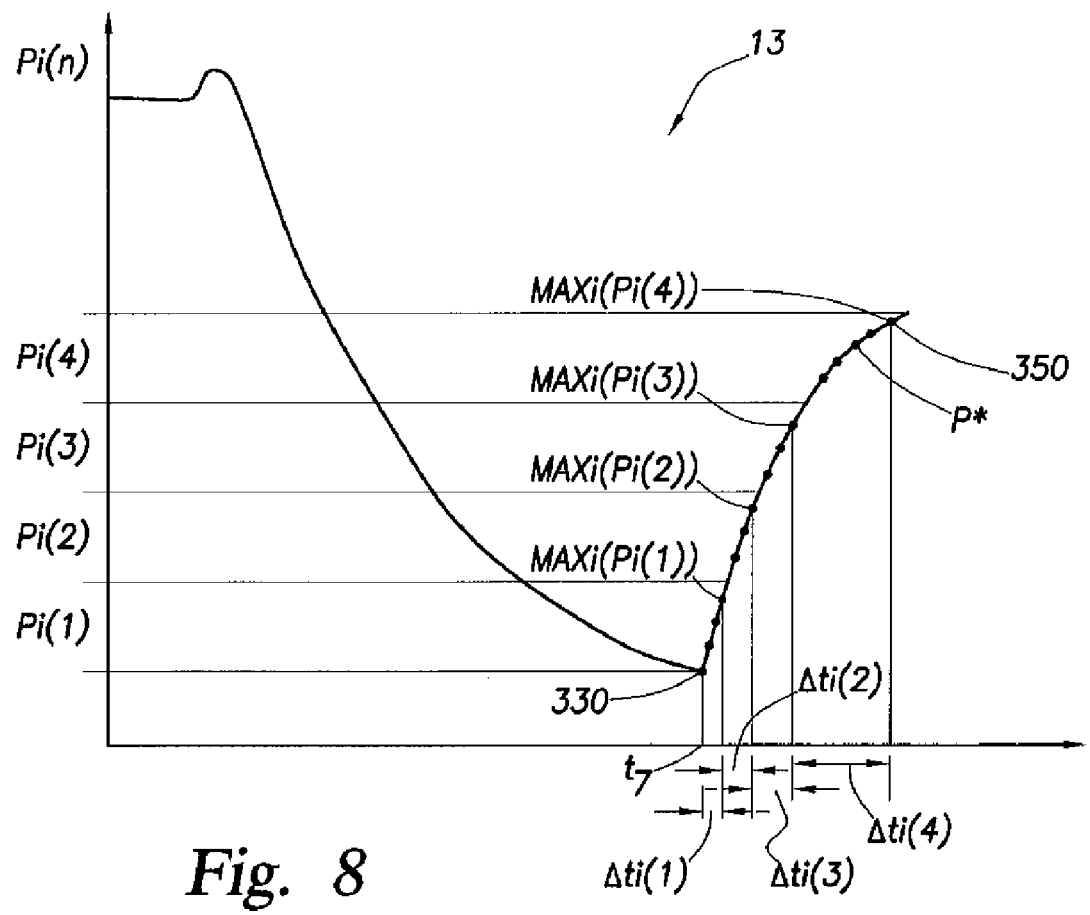
FIG. 8 shows a detailed view of the investigation phase portion of the plot of FIG. 5 depicting the determination of termination of buildup.

As shown in FIG. 8, one such procedure involves establishing a pressure increment beginning at the termination of drawdown point 330. For example, such a pressure increment could be a large multiple of the pressure gauge resolution, or a multiple of the pressure gauge noise. As buildup data are acquired successive pressure points will fall within one such interval. The highest pressure data point within each pressure increment is chosen and differences are constructed between the corresponding times to yield the time increments $\Delta t_{i(n)}$. Buildup is continued until the ratio of two successive time increments is greater than or equal to a predetermined number, such as 2. The last recorded pressure point in the last interval at the time this criterion is met is the calculated termination point 350. This analysis may be mathematically represented by the following:

Starting at $t_7$, the beginning of the buildup of the investigation phase, find a sequence of indices $\{i(n)\} \subset \{i\}$, $i(n) > i(n-1)$, $n = 2, 3, \ldots$, such that for $n \geq 2$, $i(1) = 1$, and $$\max_i (p_{i(n)} - p_{i(n-1)}) \leq \max(n_p \delta_p, \varepsilon_p) \quad (3)$$

where $n_P$ is a number with a value equal to or greater than, for example, 4, typically 10 or greater, $\delta_P$ is the nominal resolution of the pressure measuring instrument; and $\varepsilon_P$ is a small multiple, say 2, of the pressure instrument noise—a quantity which may be determined prior to setting the tool, such as during the mud compressibility experiment.

One skilled in the art would appreciate that other values of $n_p$ and $\varepsilon_p$ may be selected, depending on the desired results, without departing from the scope of the invention. If no points exist in the interval defined by the right hand side of equation (3) other than the base point, the closest point outside the interval may be used.

Defining $\Delta t_{i(n)} \equiv t_{i(n)} - t_{i(n-1)}$, the buildup might be terminated when the following conditions are met: $p_{i(n)} \geq p(t_4) = P_{34}$ (FIG. 7) and $$\frac{\Delta t_{i(n)}}{\Delta t_{i(n-1)}} \geq m_P \quad (4)$$

where $m_P$ is a number greater than or equal to, for example, 2.

The first estimate of the formation pressure is then defined as (FIG. 7):

$$p(t_{i(max(n))}) = p(t_7 + T_1) = P_{350}. \quad (5)$$

In rough terms, the investigation phase pretest according to the current criterion is terminated when the pressure during buildup is greater than the pressure corresponding to the point of deviation 34 and the rate of increase in pressure decreases by a factor of at least 2. An approximation to the formation pressure is taken as the highest pressure measured during buildup.

The equations (3) and (4) together set the accuracy by which the formation pressure is determined during the investigation phase: equation (3) defines a lower bound on the error and $m_P$ roughly defines how close the estimated value is to the true formation pressure. The larger the value of $m_P$, the closer the estimated value of the formation pressure will be to the true value, and the longer the duration of the investigation phase will be.

Yet another criterion for terminating the investigation phase buildup may be based on the flatness of the buildup curve, such as would be determined by comparing the average value of a range of pressure buildup points to a small multiple, for example 2 or 4, of the pressure gauge noise. It will be appreciated that any of the criteria disclosed herein singly, or in combination, may be used to terminate the investigation phase buildup (i.e. 340 on FIG. 5), measurement phase buildup (i.e. 380 on FIG. 5 and described below) or, more generally, any buildup.

As shown in FIG. 7, the termination point 350 depicts the end of the investigation phase 13 following completion of the build up phase 340. However, there may be instances where it is necessary or desirable to terminate the pretest. For example, problems in the process, such as when the probe is plugged, the test is dry or the formation mobility is so low that the test is essentially dry, the mud pressure exactly balances the formation pressure, a false breach is detected, very low permeability formations are tested, a change in the compressibility of the flowline fluid is detected or other issues occur, may justify termination of the pretest prior to completion of the entire cycle.

Once it is desired that the pretest be terminated during the investigation phase, the pretest piston may be halted or probe isolation valve 121 closed (if present) so that the volume in flow line 119 is reduced to a minimum. Once a problem has been detected, the investigation phase may be terminated. If desired, a new investigative phase may be performed.

Referring back to FIG. 5, upon completion of the investigation phase 13, a decision may be made on whether the conditions permit or make desirable performance of the measurement phase 14. This decision may be performed manually. However, it is preferable that the decision be made automatically, and on the basis of set criteria.

One criterion that may be used is simply time. It may be necessary to determine whether there is sufficient time $T_{MP}$ to perform the measurement phase. In FIG. 5, there was sufficient time to perform both an investigation phase and a measurement phase. In other words, the total time $T_t$ to perform both phases was less than the time allotted for the cycle.

Typically, when $T_{IP}$ is less than half the total time $T_t$, there is sufficient time to perform the measurement phase.

Another criterion that may be used to determine whether to proceed with the measurement phase is volume V. It may also be necessary or desirable, for example, to determine whether the volume of the measurement phase will be at least as great as the volume extracted from the formation during the investigation phase. If one or more of conditions are not met, the measurement phase may not be executed. Other criteria may also be determinative of whether a measurement phase should be performed. Alternatively, despite the failure to meet any criteria, the investigation phase may be continued through the remainder of the allotted time to the end so that it becomes, by default, both the investigation phase and the measurement phase.

It will be appreciated that while FIG. 5 depicts a single investigation phase 13 in sequence with a single measurement phase 14, various numbers of investigation phases and measurement phases may be performed in accordance with the present invention. Under extreme circumstances, the investigation phase estimates may be the only estimates obtainable because the pressure increase during the investigation phase buildup may be so slow that the entire time allocated for the test is consumed by this investigation phase. This is typically the case for formations with very low permeabilities. In other situations, such as with moderately to highly permeable formations where the buildup to formation pressure will be relatively quick, it may be possible to perform multiple pretests without running up against the allocated time constraint.

Referring still to FIG. 5, once the decision is made to perform the measurement phase 14, then the parameters of the investigation phase 13 are used to design the measurement phase. The parameters derived from the investigation phase, namely the formation pressure and mobility, are used in specifying the operating parameters of the measurement phase pretest. In particular, it is desirable to use the investigation phase parameters to solve for the volume of the measurement phase pretest and its duration and, consequently, the corresponding flow rate. Preferably, the measurement phase operating parameters are determined in such a way to optimize the volume used during the measurement phase pretest resulting in an estimate of the formation pressure within a given range. More particularly, it is desirable to extract just enough volume, preferably a larger volume than the volume extracted from the formation during the investigation phase, so that at the end of the measurement phase, the pressure recovers to within a desired range $\delta$ of the true formation pressure $p_f$. The volume extracted during the measurement phase is preferably selected so that the time constraints may also be met.

Let H represent the pressure response of the formation to a unit step in flow rate induced by a probe tool as previously described. The condition that the measured pressure be within $\delta$ of the true formation pressure at the end of the measurement phase can be expressed as:

$$H(T'_{tD}) - H((T'_t - T_o)_D) + \frac{q_2}{q_1} \left\{ \begin{array}{c} H((T'_t - T_o - T_1)_D) - \\ H((T'_t - T_o - T_1 - T_2)_D) \end{array} \right\} \leq \frac{2\pi r_* \sqrt{K_r K_z}}{\mu q_1} \delta \quad (6)$$

where $T'_t$ is the total time allocated for both the investigation and measurement phases minus the time taken for flowline expansion, i.e. $T'_t = T_t - (t_7 - t_f) = T_0 + T_1 + T_2 + T_3$ in FIG. 5 (prescribed before the test is performed—seconds); is the approximate duration of formation flow during the investigation phase (determined during acquisition—seconds); $T_1$ is the duration of the buildup during the investigation phase (determined during acquisition—seconds); $T_2$ is the duration of the drawdown during the measurement phase (determined during acquisition—seconds); $T_3$ is the duration of the buildup during the measurement phase (determined during acquisition—seconds); $q_1$ and $q_2$ represent, respectively, the constant flowrates of the investigation and measurement phases respectively (specified before acquisition and determined during acquisition—cm³/sec); $\delta$ is the accuracy to which the formation pressure is to be determined during the measurement phase (prescribed—atmospheres), i.e., $p_f$-p$(T_1) \leq \delta$, where $p_f$ is the true formation pressure; $\phi$ is the formation porosity, $C_t$ is the formation total compressibility (prescribed before acquisition from knowledge of the formation type and porosity through standard correlations—1/atmospheres);

$$T_{nD} = \frac{K_r T_n}{\phi \mu C_t r_*^2} \equiv \frac{T_n}{\tau}$$

where n=t, 0, 1, 2 denotes a dimensionless time and $\tau \equiv \phi \mu C_t r^{*2}/K_r$ represents a time constant; and, $r^*$ is an effective probe radius defined by $$r_* = \frac{r_p}{K(m; \pi/2)} \frac{1}{\Omega_S} = \frac{2 r_p}{\pi(1 + (1/2)^2 m + (3/8)^2 m^2 + O(m^3))} \frac{1}{\Omega_S}$$

where K is a complete elliptic integral of the first kind with modulus $m \equiv \sqrt{1 - K_z/K_r}$. If the formation is isotopic then $r^* = 2 r_p/(\pi \Omega_S)$.

Equivalently, the measurement phase may be restricted by specifying the ratio of the second to the first pretest flow rates and the duration, $T_2$, of the measurement phase pretest, and therefore its volume.

In order to completely specify the measurement phase, it may be desirable to further restrict the measurement phase based on an additional condition. One such condition may be based on specifying the ratio of the duration of the drawdown portion of the measurement phase relative to the total time available for completion of the entire measurement phase since the duration of the measurement phase is known after completion of the investigation phase, namely, $T_2 + T_3 = T'_t - T_0 - T_1$. For example, one may wish to allow twice (or more than twice) as much time for the buildup of the measurement phase as for the drawdown, then $T_3 = n_T T_2$, or, $T_2 = (T'_t - T_0 - T_1)/(n_T + 1)$ where $n_T \geq 2$. Equation (6) may then be solved for the ratio of the measurement to investigation phase pretest flowrates and consequently the volume of the measurement phase $V_2 = q_2 T_2$.

Yet another condition to complete the specification of the measurement phase pretest parameters would be to limit the pressure drop during the measurement phase drawdown. With the same notation as used in equation (6) and the same governing assumptions this condition can be written as $$H((T_o + T_1 + T_2)_D) - H((T_1 + T_2)_D) + \frac{q_2}{q_1} H((T_2)_D) \leq \quad (7)$$

$$\frac{2\pi r_* \sqrt{K_r K_z}}{\mu q_1} \Delta p_{max}$$

where $\Delta p_{max}$ (in atmospheres) is the maximum allowable drawdown pressure drop during the measurement phase.

The application of equations (6) and (7) to the determination of the measurement phase pretest parameters is best illustrated with a specific, simple but non-trivial case. For the purposes of illustration it is assumed that, as before, both the investigation and measurement phase pretests are conducted at precisely controlled rates. In addition it is assumed that the effects of tool storage on the pressure response may be neglected, that the flow regimes in both drawdown and buildup are spherical, that the formation permeability is isotropic and that the conditions ensuring the validity of Darcy's relation are satisfied.

Under the above assumptions equation (6) takes the following form:

$$\mathrm{erfc}\left(\frac{1}{2}\sqrt{\frac{\phi\mu C_t r_*^2}{K T_t'}}\right) - \mathrm{erfc}\left(\frac{1}{2}\sqrt{\frac{\phi\mu C_t r_*^2}{K(T_t' - T_o)}}\right) + \frac{q_2}{q_1}\left\{\mathrm{erfc}\left(\frac{1}{2}\sqrt{\frac{\phi\mu C_t r_*^2}{K(T_t' - T_o - T_1)}}\right) - \mathrm{erfc}\left(\frac{1}{2}\sqrt{\frac{\phi\mu C_t r_*^2}{K(T_t' - T_o - T_1 - T_2)}}\right)\right\} \leq \frac{2\pi K r_*}{\mu q_1}\delta \quad (8)$$

where erfc is the complementary error function.

Because the arguments of the error function are generally small, there is typically little loss in accuracy in using the usual square root approximation. After some rearrangement of terms equation (8) can be shown to take the form $$q_2\left(\sqrt{\lambda/(\lambda - T_2)} - 1\right) \leq \frac{2\pi^{3/2} K r_*}{\mu}\delta\sqrt{\frac{\lambda}{\tau}} - q_1\left(\sqrt{\lambda/(T_t' - T_o)} - \sqrt{\lambda/T_t'}\right) \equiv \frac{2\pi^{3/2} K r_*}{\mu}\delta\sqrt{\frac{\lambda}{\tau}} - q_1 u(\lambda) \quad (9)$$

where $\lambda \equiv T_2 + T_3$, the duration of the measurement phase, is a known quantity once the investigation phase pretest has been completed.

The utility of this relation is clear once the expression in the parentheses on the left hand side is approximated further to obtain an expression for the desired volume of the measurement phase pretest.

$$V_2\left\{1 + \left(\frac{3}{4}\right)\left(\frac{T_2}{\lambda}\right) + O(T_2^2)\right\} = 4\pi^{3/2}\phi C_t \delta\left(\frac{K}{\mu}\frac{T_2 + T_3}{\phi C_t}\right)^{3/2} - \lambda q_1 u(\lambda) \quad (10)$$

With the same assumptions made in arriving at equation (8) from equation (6), equation (7) may be written as, $$\mathrm{erfc}\left(\frac{1}{2}\sqrt{\frac{\phi\mu C_t r_*^2}{K(T_o + T_1 + T_2)}}\right) - \mathrm{erfc}\left(\frac{1}{2}\sqrt{\frac{\phi\mu C_t r_*^2}{K(T_1 + T_2)}}\right) + \frac{q_2}{q_1}\mathrm{erfc}\left(\frac{1}{2}\sqrt{\frac{\phi\mu C_t r_*^2}{K T_2}}\right) \leq \frac{2\pi K r_*}{\mu q_1}\Delta p_{max} \quad (11)$$

which, after applying the square-root approximation for the complementary error function and rearranging terms, can be expressed as:

$$q_2\left(1 - \sqrt{\tau/(\pi T_2)}\right) \leq \frac{2\pi K r_*}{\mu}\Delta p_{max} - \frac{q_1}{\sqrt{\pi}}\left(\sqrt{\tau/(T_1 + T_2)} - \sqrt{\tau/(T_o + T_1 + T_2)}\right) \equiv \frac{2\pi K r_*}{\mu}\Delta p_{max} - q_1 v(T_2) \quad (12)$$

Combining equations (9) and (12) gives rise to:

$$\sqrt{\frac{\lambda}{\lambda - T_2}} = 1 + \left\{\sqrt{\pi}\frac{\delta}{\Delta p_{max}}\sqrt{\frac{\lambda}{\tau}} - \frac{q_1 \mu}{2\pi K r_*}\frac{1}{\Delta p_{max}}u(\lambda)\right\} \times \times \left\{1 + \frac{q_1 \mu}{2\pi K r_*}\frac{1}{\Delta p_{max}}v(T_2)\right\}^{-1}\left(1 - \sqrt{\tau/(\pi T_2)}\right)^{-1} \quad (13)$$

Because the terms in the last two bracket/parenthesis expressions are each very close to unity, equation (13) may be approximated as:

$$\frac{T_2}{\lambda} \approx 1 - \left\{1 + \sqrt{\pi}\frac{\delta}{\Delta p_{max}}\sqrt{\frac{\lambda}{\tau}} - \frac{q_1 \mu}{2\pi K r_*}\frac{1}{\Delta p_{max}}u(\lambda)\right\}^{-2} \quad (14)$$

which gives an expression for the determination of the duration of the measurement phase drawdown and therefore, in combination with the above result for the measurement phase pretest volume, the value of the measurement phase pretest flowrate. To obtain realistic estimates for $T_2$ from equation (14), the following condition should hold:

$$\delta > \frac{q_1 \mu}{2\pi^{3/2} K r_*}\frac{1}{\Delta p_{max}}u(\lambda) \quad (15)$$

Equation (15) expresses the condition that the target neighborhood of the final pressure should be greater than the residual transient left over from the investigation phase pretest.

In general, the estimates delivered by equations (10) and (14) for $V_2$ and $T_2$ may be used as starting values in a more comprehensive parameter estimation scheme utilizing equations (8) and (11). While equations (8) and (11) have been used to illustrate the steps in the procedure to compute the measurement phase parameters, it will be appreciated that other effects, such as tool storage, formation complexities, etc., may be readily incorporated in the estimation process. If the formation model is know, the more general formation model equations (6) and (7) may be used within the parameter estimation process.

The above described approach to determining the measurement phase pretest assumes that certain parameters will be assigned before the optimal pretest volume and duration can be estimated. These parameters include: the accuracy of the formation pressure measurement δ; the maximum drawdown permissible ($\Delta p_{max}$); the formation porosity φ—which will usually be available from openhole logs; and, the total compressibility $C_t$—which may be obtained from known correlations which in turn depend on lithology and porosity.

With the measurement phase pretest parameters determined, it should be possible to achieve improved estimates of the formation pressure and formation mobility within the time allocated for the entire test.

At point 350, the investigation phase ends and the measurement phase may begin. The parameters determined from the investigation phase are used to calculate the flow rate, the pretest duration and/or the volume necessary to determine the parameters for performing the measurement phase 14. The measurement phase 14 may now be performed using a refined set of parameters determined from the original formation parameters estimated in the investigation phase.

As shown in FIG. 9, the measurement phase 14 includes the steps of performing a second draw down 360, terminating the draw down 370, performing a second build up 380 and terminating the build up 390. These steps are performed as previously described according to the investigation phase 13 of FIG. 6. The parameters of the measurement phase, such as flow rate, time and/or volume, preferably have been predetermined according to the results of the investigation phase.

Referring back to FIG. 5, the measurement phase 14 preferably begins at the termination of the investigation phase 350 and lasts for duration $T_{MP}$ specified by the measurement phase until termination at point 390. Preferably, the total time to perform the investigation phase and the measurement phase falls within an allotted amount of time. Once the measurement phase is completed, the formation pressure may be estimated and the tool retracted for additional testing, downhole operations or removal from the wellbore.

Referring now to FIG. 10, an alternate embodiment of the foregoing method for estimating formation properties incorporating a mud compressibility phase 11 is depicted. This embodiment comprises a mud compressibility phase 11, an investigation phase 13 and a measurement phase 14. Estimations of mud compressibility may be used to refine the investigation phase procedure leading to better estimates of parameters from the investigation phase 13 and the measurement phase 14. FIG. 11A depicts a pressure trace corresponding to the method of FIG. 10, and FIG. 11B shows a related graphical representation of the rate of change of the pretest chamber volume.

In this embodiment, the formation tester of FIG. 4 may be used to perform the method of FIG. 10. According to this embodiment, the isolation valves 121a and 124a may be used, in conjunction with equalizing valve 128a, to trap a volume of liquid in flowline 103a. In addition, the isolation valve 121a may be used to reduce tool storage volume effects so as to facilitate a rapid buildup. The equalizing valve 128a additionally allows for easy flushing of the flowline to expel unwanted fluids such as gas and to facilitate the refilling of the flowline sections 119a and 103a with wellbore fluid.

The mud compressibility measurement may be performed, for example, by first drawing a volume of mud into the tool from the wellbore through the equalizing valve 128a by means of the pretest piston 118a, isolating a volume of mud in the flowline by closing the equalizing valve 128a and the isolation valves 121a and 124a, compressing and/or expanding the volume of the trapped mud by adjusting the volume of the pretest chamber 114a by means of the pretest piston 118a and simultaneously recording the pressure and volume of the trapped fluid by means of the pressure gauge 120a.

The volume of the pretest chamber may be measured very precisely, for example, by measuring the displacement of the pretest piston by means of a suitable linear potentiometer not shown in FIG. 4 or by other well established techniques. Also not shown in FIG. 4 is the means by which the speed of the pretest piston can be controlled precisely to give the desired control over the pretest piston rate $q_p$. The techniques for achieving these precise rates are well known in the art, for example, by use of pistons attached to lead screws of the correct form, gearboxes and computer controlled motors such rates as are required by the present method can be readily achieved.

FIGS. 11A and 12 depict the mud compressibility phase 11 in greater detail. The mud compressibility phase 11 is performed prior to setting the tool and therefore prior to conducting the investigation and measurement phases. In particular, the tool does not have to be set against the wellbore, nor does it have to be immobile in the wellbore in order to conduct the mud compressibility test thereby reducing the risk of sticking the tool due to an immobilized drill string. It would be preferable, however, to sample the wellbore fluid at a point close to the point of the test.

The steps used to perform the compressibility phase 11 are shown in greater detail in FIG. 12. These steps also correspond to points along the pressure trace of FIG. 11A. As set forth in FIG. 12, the steps of the mud compressibility test include starting the mud compressibility test 510, drawing mud from the wellbore into the tool 511, isolating the mud volume in the flow line 512, compressing the mud volume 520 and terminating the compression 530. Next, the expansion of mud volume is started 540, the mud volume expands 550 for a period of time until terminated 560. Open communication of the flowline to wellbore is begun 561, and pressure is equalized in the flowline to wellbore pressure 570 until terminated 575. The pretest piston recycling may now begin 580. Mud is expelled from the flowline into the wellbore 581 and the pretest piston is recycled 582. When it is desired to perform the investigation phase, the tool may then be set 610 and open communication of the flowline with the wellbore terminated 620.

Mud compressibility relates to the compressibility of the flowline fluid, which typically is whole drilling mud. Knowledge of the mud compressibility may be used to better determine the slope of the line 32 (as previously described with respect to FIG. 7), which in turn leads to an improved determination of the point of deviation 34 signaling flow from the formation. Knowledge of the value of mud compressibility, therefore, results in a more efficient investigation phase 13 and provides an additional avenue to further refine the estimates derived from the investigation phase 13 and ultimately to improve those derived from the measurement phase 14.

Mud compressibility $C_m$ may be determined by analyzing the pressure trace of FIG. 11A and the pressure and volume data correspondingly generated. In particular, mud compressibility may be determined from, the following equation:

$$C_m = -\frac{1}{V}\frac{dV}{dp} \text{ or, equivalently, } q_p = -C_m V \dot{p} \quad (16)$$

where $C_m$ is the mud compressibility (1/psi), V is the total volume of the trapped mud (cm³), p is the measured flowline pressure (psi), $\dot{p}$ is the time rate of change of the measured flowline pressure (psi/sec), and $q_p$ represents the pretest piston rate (cm³/sec).

To obtain an accurate estimate of the mud compressibility, it is desirable that more than several data points be collected to define each leg of the pressure-volume trend during the mud compressibility measurement. In using equation (16) to determine the mud compressibility the usual assumptions have been made, in particular, the compressibility is constant and the incremental pretest volume used in the measurement is small compared to the total volume V of mud trapped in the flowline.

The utility of measuring the mud compressibility in obtaining a more precise deviation point 34a is now explained. The method begins by fitting the initial portion of the drawdown data of the investigation phase 13 to a line 32a of known slope to the data. The slope of line 32a is fixed by the previously determined mud compressibility, flowline volume, and the pretest piston drawdown rate. Because the drawdown is operated at a fixed and precisely controlled rate and the compressibility of the flowline fluid is a known constant that has been determined by the above-described experiment, the equation describing this line with a known slope a is given by:

$$p(t) = p^+ - \frac{q_p}{V(0)C_m}t \quad (17)$$
$$= b - at$$

where V(0) is the flowline volume at the beginning of the expansion, $C_m$ is the mud compressibility, $q_p$ is the piston decompression rate, $p^+$ is the apparent pressure at the initiation of the expansion process. It is assumed that V(0) is very much larger than the increase in volume due to the expansion of the pretest chamber.

Because the slope a is now known the only parameter that needs to be specified to completely define equation (17) is the intercept $p^+$, i.e., b. In general, $p^+$ is unknown, however, when data points belonging to the linear trend of the flowline expansion are fitted to lines with slope a they should all produce similar intercepts. Thus, the value of intercept $p^+$ will emerge when the linear trend of the flowline expansion is identified.

A stretch of data points that fall on a line having the defined slope a, to within a given precision, is identified. This line represents the true mud expansion drawdown pressure trend. One skilled in the art would appreciate that in fitting the data points to a line, it is unnecessary that all points fall precisely on the line. Instead, it is sufficient that the data points fit to a line within a precision limit, which is selected based on the tool characteristics and operation parameters. With this approach, one can avoid the irregular trend associated with early data points, i.e., those points around the start of pretest piston drawdown. Finally, the first point 34a, after the points that define the straight line, that deviates significantly (or beyond a precision limit) from the line is the point where deviation from the drawdown pressure trend occurs. The deviation 34a typically occurs at a higher pressure than would be predicted by extrapolation of the line. This point indicates the breach of the mudcake.

Various procedures are available for identifying the data points belonging to the flowline expansion line. The details of any procedure depend, of course, on how one wishes to determine the flowline expansion line, how the maximal interval is chosen, and how one chooses the measures of precision, etc.

Two possible approaches are given below to illustrate the details. Before doing so, the following terms are defined:

$$\bar{b}_k \equiv \frac{1}{N(k)}\left(\sum_{n=1}^{N(k)} p_n + a\sum_{n=1}^{N(k)} t_n\right) = \bar{p}_n + a\bar{t}_n \quad (18)$$

$$\hat{b}_k \equiv \underset{N(k)}{median}(p_k + at_k), \text{ and} \quad (19)$$

$$S_{p,k}^2 \equiv \frac{1}{N(k)}\sum_{n=1}^{N(k)}(p_n - p(t_n))^2 \quad (20)$$
$$= \frac{1}{N(k)}\sum_{n=1}^{N(k)}(p_n - \bar{p}_k + a(t_n - \bar{t}_k))^2$$

where, in general, N(k)<k represents the number of data points selected from the k data points $(t_k, p_k)$ acquired. Depending on the context, N(k) may equal k. Equations (18) and (19) represent, respectively, the least-squares line with fixed slope a and the line of least absolute deviation with fixed slope a through N(k) data points, and, equation (20) represents the variance of the data about the fixed slope line.

One technique for defining a line with slope a spanning the longest time interval is to fit the individual data points, as they are acquired, to lines of fixed slope a. This fitting produces a sequence of intercepts $\{b_k\}$, where the individual $b_k$ are computed from: $b_k = p_k + at_k$. If successive values of $b_k$ become progressively closer and ultimately fall within a narrow band, the data points corresponding to these indices are used to fit the final line.

Specifically, the technique may involve the steps of: (i) determining a median, $\tilde{b}_k$, from the given sequence of intercepts $\{b_k\}$; (ii) finding indices belonging to the set $l_k = \{i \in [2, \ldots, N(k)] | |b_i - \tilde{b}_k| \leq n_b \epsilon_b\}$ where $n_b$ is a number such as 2 or 3 and where a possible choice for $\epsilon_b$ is defined by the following equation:

$$\epsilon_b^2 = S_{b,k}^2 = \frac{1}{N(k)}(S_{p,k}^2 + a^2 S_{t,k}^2) = \frac{1}{N(k)}S_{p,k}^2 \quad (21)$$

where the last expression results from the assumption that time measurements are exact.

Other, less natural choices for $\epsilon_b$ are possible, for example, $\epsilon_b = S_{p,k}$; (iii) fitting a line of fixed slope a to the data points with indices belonging to $l_k$; and (iv) finding the first point $(t_k, p_k)$ that produces $p_k - b^*_k + at_k > n_s S_{p,k}$, where $b^*_k = \tilde{b}_k$ or $\bar{b}_k$ depending on the method used for fitting the line, and $n_S$ is a number such as 2 or 3. This point, represented by 34a on FIG. 11A, is taken to indicate a breach of the mudcake and the initiation of flow from the formation.

An alternate approach is based on the idea that the sequence of variances of the data about the line of constant slope should eventually become more-or-less constant as the fitted line encounters the true flowline expansion data. Thus, a method according to the invention may be implemented as follows: (i) a line of fixed slope, a, is first fitted to the data accumulated up to the time $t_k$. For each set of data, a line is determined from $p(t_k) = \bar{b}_k - at_k$, where $\bar{b}_k$ is computed from equation (18); (ii) the sequence of variances $\{S_{p,k}^2\}$ is constructed using equation (20) with N(k)=k; (iii) successively indices are found belonging to the set:

$$J_k = \left\{ i \in [3, \ldots, k] | S_{p,k-1}^2 - S_{p,k}^2 > \frac{1}{k} S_{p,k-1}^2 - (p_k - (\overline{b}_k - at_k))^2 \right\};$$

(iv) a line of fixed slope a is fitted to the data with indices in $J_k$. Let N(k) be the number of indices in the set; (v) determine the point of departure from the last of the series of fixed-slope lines having indices in the above set as the first point that fulfills $p_k - \overline{b}_k + at_k > n_S S_{p,k}$, where $n_S$ is a number such as 2 or 3; (vi) define $$S_{\min}^2 = \min_{N(k)} \{S_{p,k}^2\};$$

(vii) find the subset of points of $J_k$ such that $N = \{i \in J_k | |p_i - (\overline{b}_i - at_i)| < S_{min}\}$; (viii) fit a line with slope a through the points with indices in N; and (ix) define the breach of the mudcake as the first point $(t_k, p_k)$ where $p_k - \overline{b}_k + at_k > n_S S_{p,k}$. As in the previous option this point, represented again by 34a on FIG. 11A, is taken to indicate a breach of the mudcake and the initiation of flow from the formation.

Once the best fit line 32a and the deviation point 34a are determined, the termination point 330a, the build up 370a and the termination of buildup 350a may be determined as discussed previously with respect to FIG. 7. The measurement phase 14 may then be determined by the refined parameters generated in the investigation phase 13 of FIG. 11A.

Referring now to FIG. 13, an alternate embodiment of the method for estimating formation properties incorporating a mud filtration phase 12 is depicted. In this embodiment the method comprises a mud compressibility phase 11a, a mud filtration phase 12, an investigation phase 13 and a measurement phase 14. The corresponding pressure trace is depicted in FIG. 14A, and a corresponding graphical depiction of the rate of change of pretest volume is shown in FIG. 14B. The same tool described with respect to the method of FIG. 10 may also be used in connection with the method of FIG. 13.

FIGS. 14A and 14B depict the mud filtration phase 12 in greater detail. The mud filtration phase 12 is performed after the tool is set and before the investigation phase 13 and the measurement phase 14 are performed. A modified mud compressibility phase 11a is performed prior to the mud filtration phase 12.

Figure 15:
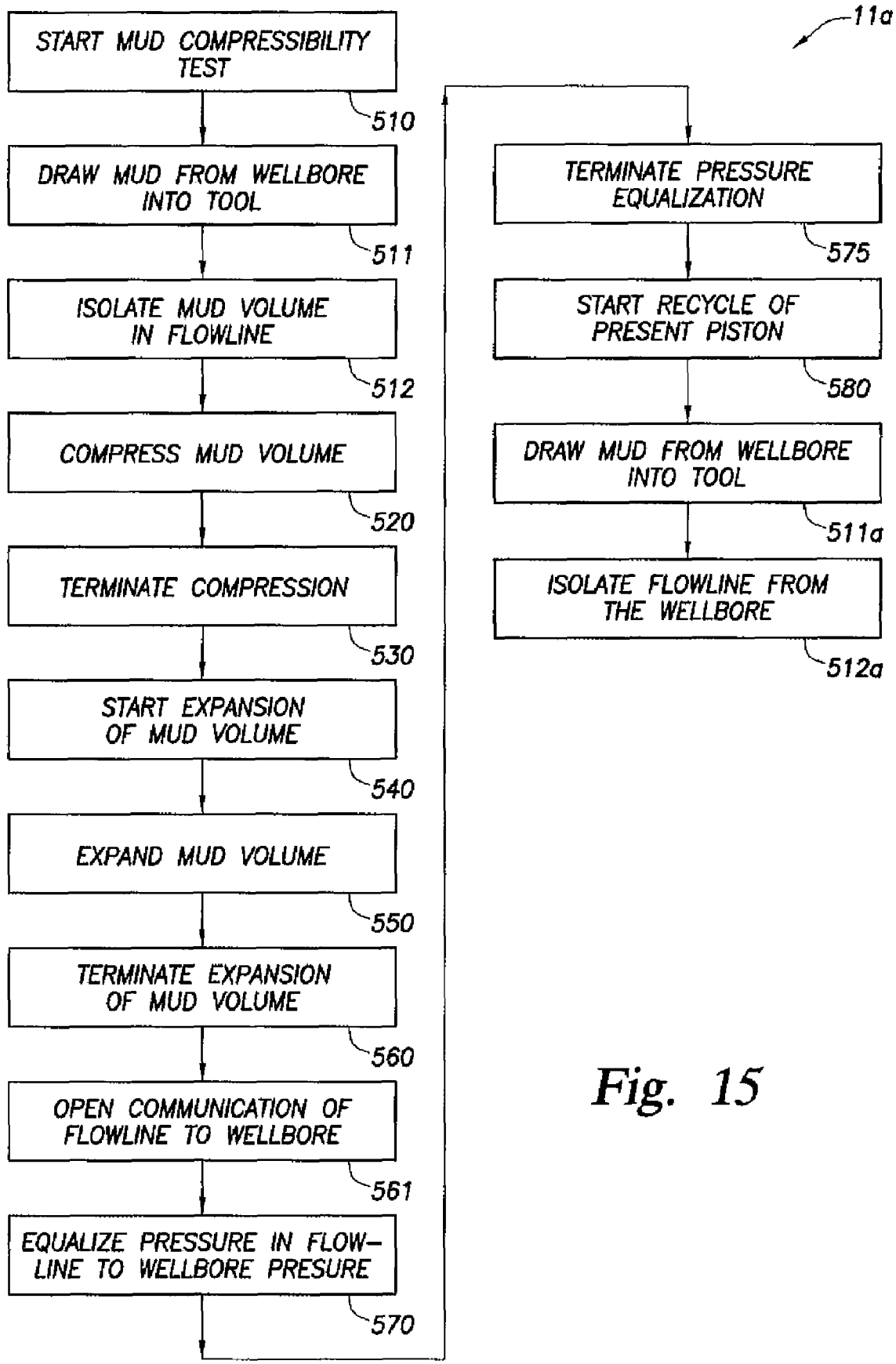
FIG. 15 shows the modified mud compressibility phase of FIG. 12 modified for use with the mud filtration phase.

The modified compressibility test 11a is depicted in greater detail in FIG. 15. The modified compressibility test 11a includes the same steps 510-580 of the compressibility test 11 of FIG. 12. After step 580, steps 511 and 512 of the mud compressibility test are repeated, namely mud is drawn from the wellbore into the tool 511a and the flowline is isolated from the wellbore 512a. The tool may now be set 610 and at the termination of the set cycle the flowline may be isolated 620 in preparation for the mud filtration, investigative and measurement phases.

Figure 16B:
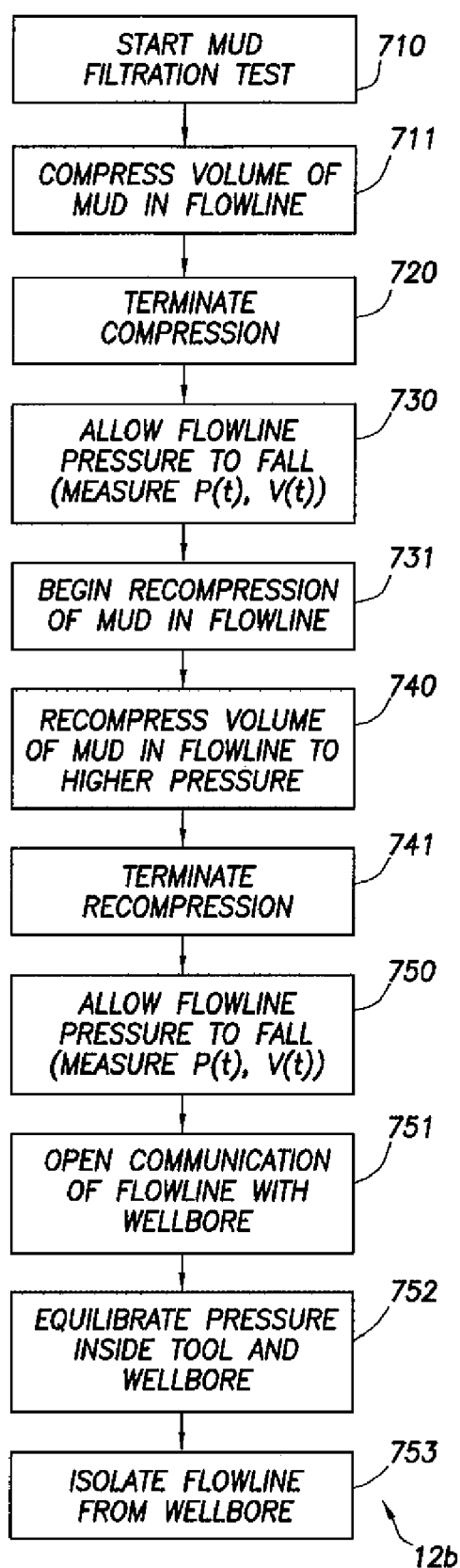
Figure 16C:
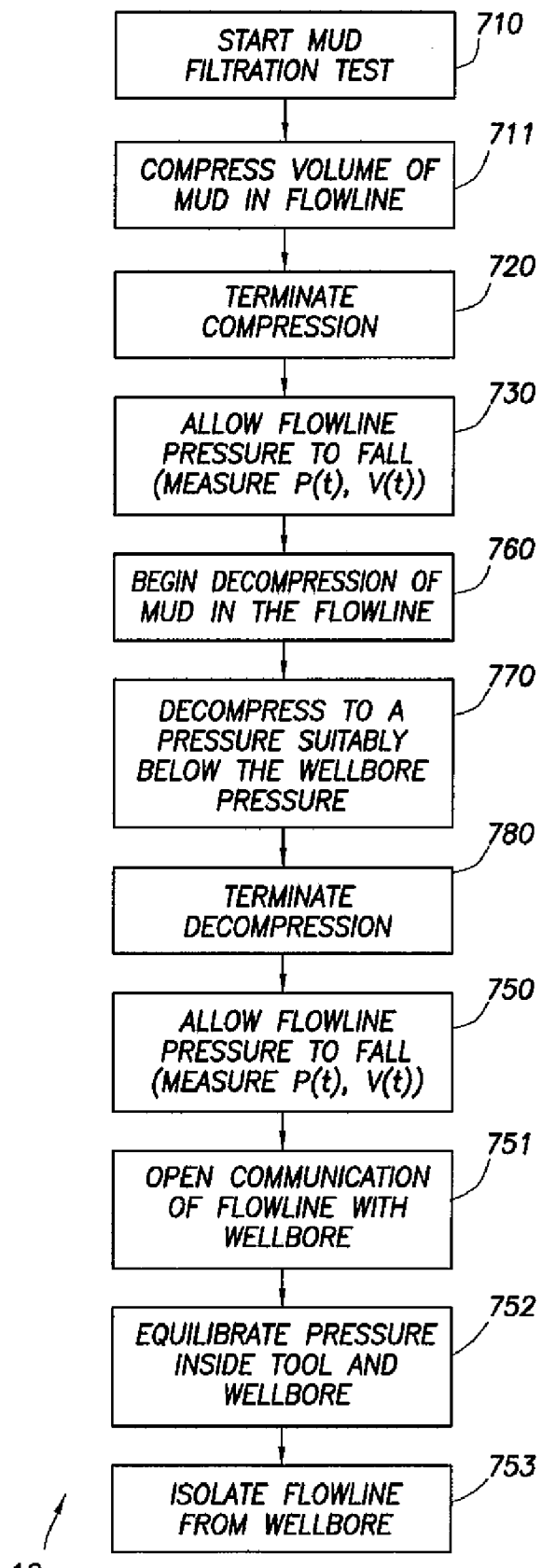
Figure 16A:
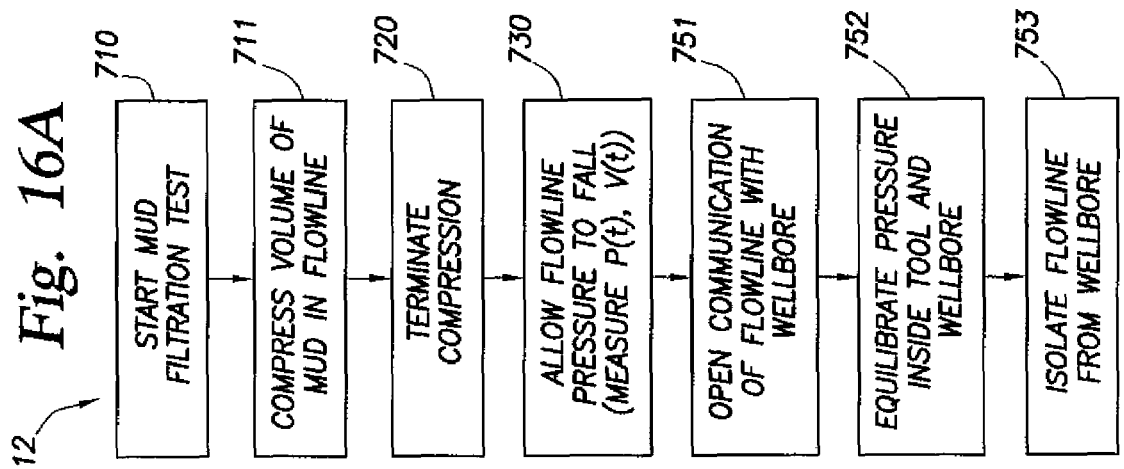

The mud filtration phase 12 is shown in greater detail in FIG. 16A. The mud filtration phase is started at 710, the volume of mud in the flowline is compressed 711 until termination at point 720, and the flowline pressure falls 730. Following the initial compression, communication of the flowline within the wellbore is opened 751, pressures inside the tool and wellbore are equilibrated 752, and the flowline is isolated from the wellbore 753.

Optionally, as shown in FIG. 16B, a modified mud filtration phase 12b may be performed. In the modified mud filtration phase 12b, a second compression is performed prior to opening communication of the flowline 751, including the steps of beginning recompression of mud in flowline 731, compressing volume of mud in flowline to higher pressure 740, terminating recompression 741. Flowline pressure is then permitted to fall 750. Steps 751-753 may then be performed as described with respect to FIG. 16A. The pressure trace of FIG. 14A shows the mud filtration phase 12b of FIG. 16B.

In another option 12c, shown in FIG. 16C, a decompression cycle may be performed following flowline pressure fall 730 of the first compression 711, including the steps of beginning the decompression of mud in the flowline 760, decompressing to a pressure suitably below the wellbore pressure 770, and terminating the decompression 780. Flowline pressure is then permitted to fall 750. Steps 751-753 may then be repeated as previously described with respect to FIG. 16A. The pressure trace of FIG. 14A shows the mud filtration phase 12c of FIG. 16C.

As shown in the pressure trace of FIG. 14A, the mud filtration method 12 of FIG. 16A may be performed with either the mud filtration phase 12b of FIG. 16B or the mud filtration phase 12c of FIG. 16C. Optionally, one or more of the techniques depicted in FIGS. 16A-C may be performed during the mud filtration phase.

Mud filtration relates to the filtration of the base fluid of the mud through a mudcake deposited on the wellbore wall and the determination of the volumetric rate of the filtration under the existing wellbore conditions. Assuming the mudcake properties remain unchanged during the test, the filtration rate through the mudcake is given by the simple expression:

$$q_f = C_m V_t \dot{p} \tag{22}$$

where $V_t$ is the total volume of the trapped mud (cm$^3$), and $q_f$ represents the mud filtration rate (cm$^3$/sec); $C_m$ represents the mud compressibility (1/psi) (where $C_m$ is determined during the modified mud compressibility test 11a or input); $\dot{p}$ represents the rate of pressure decline (psi/sec) as measured during 730 and 750 in FIG. 14. The volume $V_t$ in equation (22) is a representation of the volume of the flowline contained between valves 121a, 124a and 128a as shown in FIG. 4.

For mud cakes which are inefficient in sealing the wellbore wall the rate of mud infiltration can be a significant fraction of the pretest piston rate during flowline decompression of the investigation phase and if not taken into account can lead to error in the point detected as the point of initiation of flow from the formation, 34 FIG. 7. The slope, a, of the fixed slope line used during the flowline decompression phase to detect the point of initiation of flow from the formation, i.e. the point of deviation, 34 FIG. 7, under these circumstances is determined using the following equation:

$$p(t) = p^+ - \frac{q_p - q_f}{V(0)C_m} t \tag{23}$$
$$= b - at$$

where $V(0)$ is the flowline volume at the beginning of the expansion, $C_m$ is the mud compressibility, $q_p$ is the piston decompression rate, $q_f$ is the rate of filtration from the flow line through the mudcake into the formation, and $p^+$ is the apparent pressure at the initiation of the expansion process which, as previously explained, is determined during the process of determining the deviation point 34.

Once the mudcake filtration rate $q_f$ and the mud compressibility $C_m$ have been determined, it is possible to proceed to estimate the formation pressure from the investigation phase 13 under circumstances where filtration through the mudcake is significant.

Preferably embodiments of the invention may be implemented in an automatic manner. In addition, they are applicable to both downhole drilling tools and to a wireline formation tester conveyed downhole by any type of work string, such as drill string, wireline cable, jointed tubing, or coiled tubing. Advantageously, methods of the invention permit downhole drilling tools to perform time-constrained formation testing in a most time efficient manner such that potential problems associated with a stopped drilling tool can be minimized or avoided.

Another embodiment of performing investigation phase measurements will be described with reference to FIGS. 17A, 17B, and 18. Prior to setting the formation tester 805, the mud compressibility is preferably determined as described above (not shown). Subsequent to the determination of the mud compressibility and prior to setting the formation tester, the pressure measured by the tool is the wellbore fluid, or mud hydrostatic, pressure 801. After the tool is set 805, the pretest piston 118a, as shown in FIG. 4, is activated 810 to withdraw fluid at a precise and fixed rate to achieve a specified pressure drop 814 in a desired time $t_{pi}$ 815. It is preferred that the desired pressure drop ($\Box p$) be of the same order but less than the expected overbalance at that depth, if the overbalance is approximately known. Overbalance is the difference in pressure between the mud hydrostatic pressure and the formation pressure. Alternatively, the desired pressure drop ($\Box p$) may be some number (e.g., 300 psi) that is larger than the maximum expected value of the "flow initiation pressure" (e.g., 200 psi). Whether the actual formation pressure is within this range is immaterial to the embodiments of the invention. Therefore, the following description assumes that the formation pressure is not within the range.

In accordance with embodiments of the invention, the piston drawdown rate to achieve this limited pressure drop ($\Box p$) may be estimated from $$q_{pi} = -\frac{1}{t_{pi}} C_m V_t \Delta p \qquad (24)$$

where $C_m$ is the compressibility of the flowline fluid, which is assumed to be the same as the wellbore fluid; $V_t$ is the volume of the trapped fluid within the flowline 103a between the valves 121a, 124a and 128a shown in FIG. 4; $\Delta p$ is the desired pressure drop and $t_{pi}$ is the duration of the pretest drawdown.

Figure 17A:
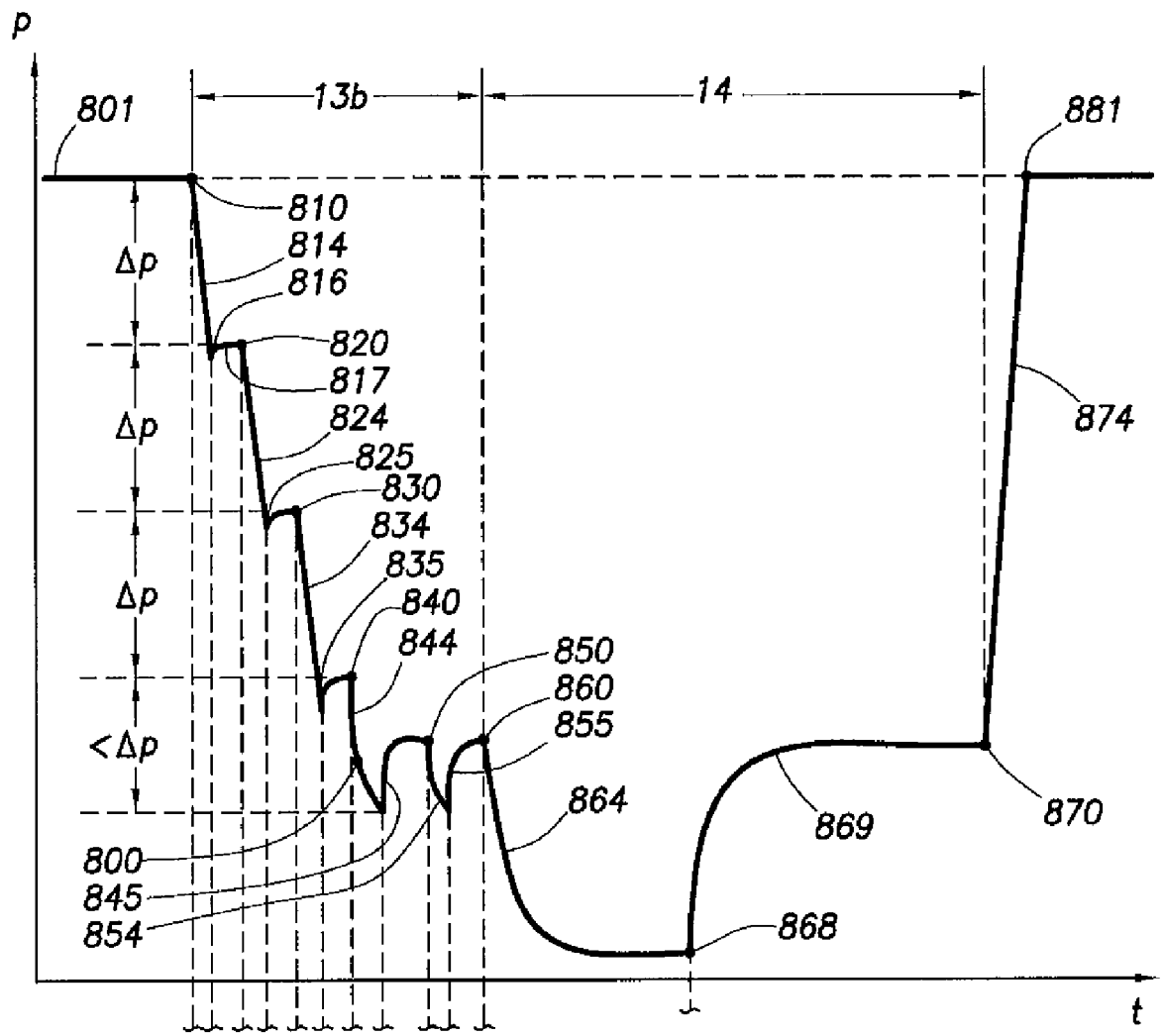
FIG. 17A shows a graphical representation of a pressure measurements versus time plot for performing a pretest including a modified investigation phase in accordance with one embodiment of the invention.
Figure 17B:
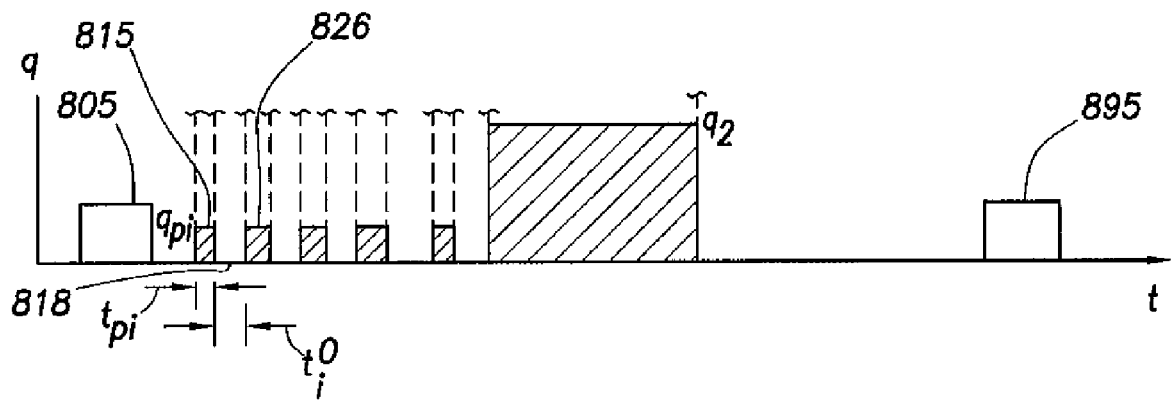
FIG. 17B shows the rate of change of volume corresponding to the graphical representation of FIG. 17A.
Figure 18:
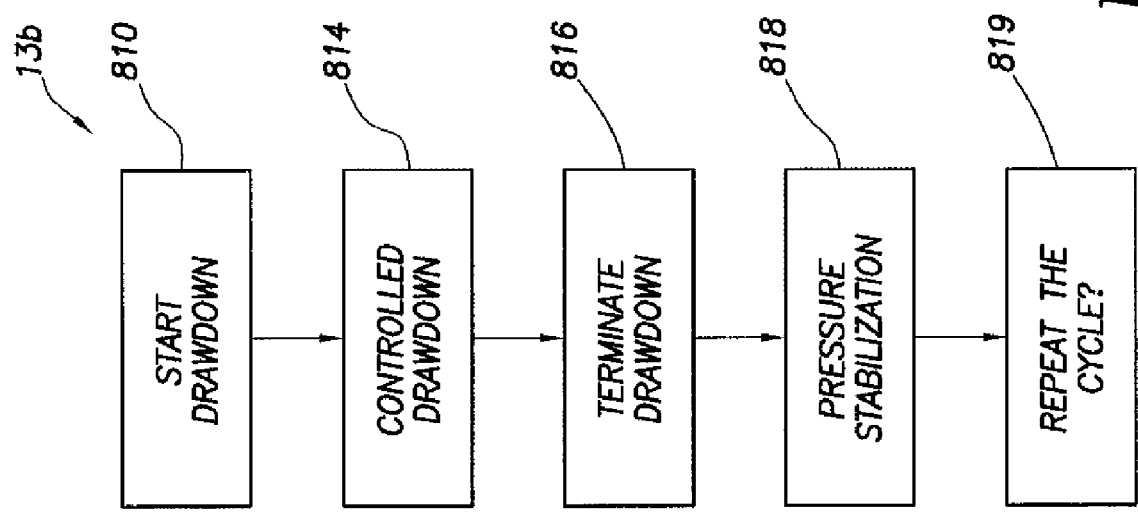
FIG. 18 shows a flow chart detailing the steps involved in performing the modified investigation phase of FIG. 17A.

Referring to FIGS. 17A, 17B, and 18, a method of performing an investigation phase 13b in accordance with embodiments of the invention comprises the step of starting the drawdown 810 and performing a controlled drawdown 814. It is preferred that the piston drawdown rate be precisely controlled so that the pressure drop and the rate of pressure change be well controlled. However, it is not necessary to conduct the pretest (piston drawdown) at low rates. When the prescribed incremental pressure drop ($\Box p$) has been reached, the pretest piston is stopped and the drawdown terminated 816. The pressure is then allowed to equilibrate 817 for a period $t_i^o$, 818 which may be longer than the drawdown period $t_{pi}$ 817, for example, $t_i^o = 2 t_{pi}$. After the pressure has equilibrated, the stabilized pressure at point 820 is compared with the pressure at the start of the drawdown at point 810. At this point, a decision is made as to whether to repeat the cycle, shown as 819 in FIG. 18. The criterion for the decision is whether the equalized pressure (e.g., at point 820) differs from the pressure at the start of the drawdown (e.g., at point 810) by an amount that is substantially consistent with the expected pressure drop ($\Box p$). If so, then this flowline expansion cycle is repeated.

To repeat the flowline expansion cycle, for example, the pretest piston is re-activated and the drawdown cycle is repeated as described, namely, initiation of the pretest 820, drawdown 824 by exactly the same amount ($\Delta p$) at substantially the same rate and duration 826 as for the previous cycle, termination of the drawdown 825, and stabilization 830. Again, the pressures at 820 and 830 are compared to decide whether to repeat the cycle. As shown in FIG. 17A, these pressures are significantly different and are substantially consistent with the expected pressure drop ($\Delta p$) arising from expansion of the fluid in the flowline. Therefore, the cycle is repeated, 830-834-835-840. The "flowline expansion" cycle is repeated until the difference in consecutive stabilized pressures is substantially smaller than the imposed/prescribed pressure drop ($\Box p$), shown for example in FIG. 17A as 840 and 850.

After the difference in consecutive stabilized pressures is substantially smaller than the imposed/prescribed pressure drop ($\Box p$), the "flowline expansion" cycle may be repeated one more time, shown as 850-854-855-860 in FIG. 17A. If the stabilized pressures at 850 and 860 are in substantial agreement, for example within a small multiple of the gauge repeatability, the larger of the two values is taken as the first estimate of the formation pressure. One of ordinary skill in the art would appreciate that the processes as shown in FIGS. 17A, 17B, and 18 are for illustration only. Embodiments of the invention are not limited by how many flowline expansion cycles are performed. Furthermore, after the difference in consecutive stabilized pressures is substantially smaller than the imposed/prescribed pressure drop ($\Box p$), it is optional to repeat the cycle one or more times.

The point at which the transition from flowline fluid expansion to flow from the formation takes place is identified as 800 in FIG. 17A. If the pressures at 850 and 860 agree at the end of the allotted stabilization time, it may be advantageous to allow the pressure 860 to continue to build and use the procedures described in previous sections (see the description for FIG. 8) to terminate the build up in order to obtain a better first estimate of the formation pressure. The process by which the decision is made to either continue the investigation phase or to perform the measurement phase, 864-868-869, to obtain a final estimate of the formation pressure 870 is described in previous sections. After the measurement phase is completed 870, the probe is disengaged from the wellbore wall and the pressure returns to the wellbore pressure 874 within a time period 895 and reaches stabilization at 881.

Once a first estimate of the formation pressure and the formation mobility are obtained in the investigation phase 13b shown in FIGS. 17A and 18, the parameters thus obtained may be used to establish the measurement phase 14 pretest parameters that will produce more accurate formation parameters within the allotted time for the test. The procedures for using the parameters obtained in the investigation phase 13b to design the measurement phase 14 pretest parameters have been described in previous sections.

Figure 20:
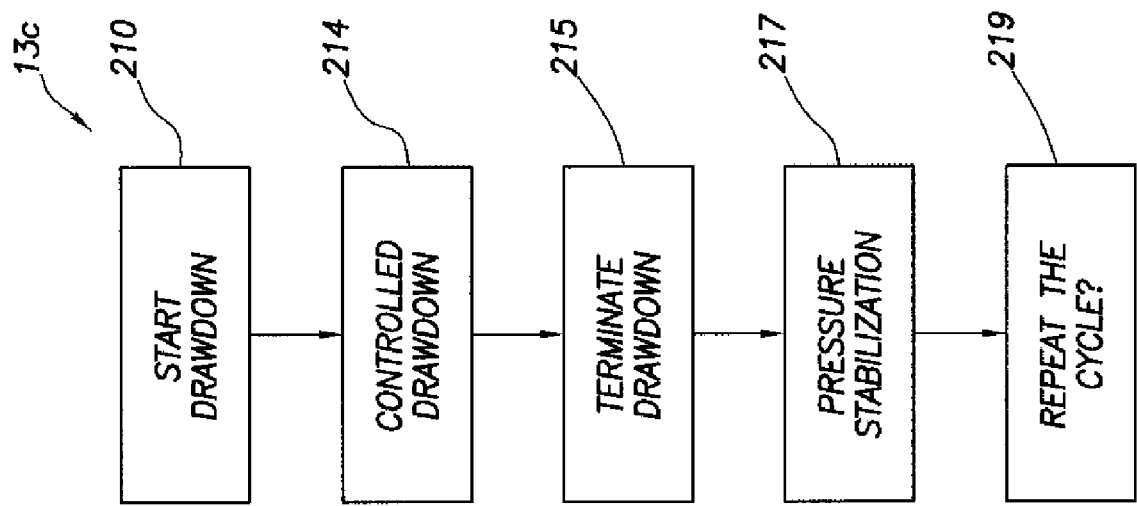
FIG. 20 shows a flow chart detailing the steps involved in performing the modified investigation phase of FIG. 19A.

In the embodiments shown in FIGS. 17A, 17B, and 18, the magnitude of the pressure drop ($\Box p$) during the flowline expansion phase is prescribed. In an alternative embodiment, as shown in FIGS. 19 and 20, the magnitude of the volume increase ($\Box V$) during the flowline expansion phase is prescribed. In this embodiment, a fixed and precisely regulated volume of fluid (ΔV) is extracted at each step at a controlled rate to produce a pressure drop that may be estimated from:

$$\Delta p = -\frac{1}{C_m V_t} \Delta V = -\frac{1}{C_m V_t} q_i t_{qi} \quad (25)$$

The procedures used in this embodiment are similar to those described for embodiments shown in FIGS. 17A, 17B, and 18. Prior to setting the formation tester, the mud compressibility is preferably determined (not shown). Subsequent to the determination of the mud compressibility and prior to setting the formation tester, the pressure measured by the tool is the wellbore or mud hydrostatic pressure 201.

Referring to FIGS. 19A, 19B, and 20, after the tool is set 205, the pretest piston 118a shown in FIG. 4 is activated. In accordance with one embodiment of the invention, a method for performing an investigation phase 13c comprises the steps of starting the drawdown 210, withdrawing fluid at a precise and fixed rate 214 until the volume of the pretest chamber 114a is increased by the prescribed amount ΔV. The incremental change in volume of the pretest chamber may be on the order of 0.2 to 1 cubic centimeter, for example. One of ordinary skill in the art would appreciate that the amount of the prescribed volume increase (☐V), is not limited to these exemplary volumes and should be chosen according to the total volume of the trapped fluid. The resulting expansion of the flowline fluid induces a pressure drop in the flowline.

When the prescribed increment in pretest chamber volume has been achieved, the pretest piston 118a is stopped and the drawdown is terminated 215. The pressure in the flowline is then allowed to equilibrate 217 for a period $t_{oi}$ 218 that is longer than the drawdown period $t_{qi}$ 216, for example, $t_{oi}$=2 $t_{qi}$. After the pressure has stabilized (shown at point 220 in FIG. 19A), a decision is made as to whether to repeat the "flowline expansion" cycle 219 (shown in FIG. 20). The criterion for making the decision is similar to that described for the embodiments shown in FIGS. 17A and 18. That is, if the pressure after stabilization or equalization (e.g., at point 220) is significantly different from that at the start of the drawdown (e.g., at point 210) and the pressure difference is substantially consistent with the expected pressure drop arising from the expansion of the fluid in the flowline, then the "flowline expansion" cycle is repeated.

To repeat the "flowline expansion" cycle, for example, the pretest piston is re-activated 220, the flowline is expanded by precisely the same volume ΔV 224, and the pressure is allowed to stabilize 230. Again, if the pressures at 220 and 230 are significantly different and are substantially consistent with the expected pressure drop arising from the expansion of the fluid in the flowline, the cycle is repeated, for example 230-234-235-240. The "flowline expansion" cycle is repeated until the difference in consecutive stabilized pressures, e.g., pressures at 230 and 240 as shown in FIG. 19A, is substantially smaller than the expected pressure drop due to the expansion of fluid in the flowline.

After the difference in consecutive stabilized pressures is substantially smaller than the expected pressure drop, the "flowline expansion" cycle may be repeated one more time, shown as 240-244-245-250 in FIG. 19A. If the stabilized pressures at 240 and 250 substantially agree, the larger of the two values is taken to represent the first estimate of the formation pressure. One of ordinary skill in the art would appreciate that the processes as shown in FIGS. 19A, 19B, and 20 are for illustration only. Embodiments of the invention are not limited by how many "flowline expansion" cycles are performed. Furthermore, after the difference in consecutive stabilized pressures is substantially smaller than the expected pressure drop, it is optional to repeat the cycle one or more times.

The point at which the transition from flowline fluid expansion to flow from the formation takes place is identified as 300 in FIG. 19A. If the pressures at 240 and 250 agree to within a selected limit (e.g., a small multiple of the gauge repeatability) at the end of the allotted stabilization time, it may be advantageous to allow the pressure at 250 to continue to build and use the procedure disclosed in the previous section (see FIG. 8) to terminate the build up in order to obtain a better first estimate of the formation pressure. The process by which the decision to continue the investigation phase or whether to execute the measurement phase, 250-258-259-260, to obtain a final estimate of the formation pressure 260 is as described in previous sections. After the measurement phase is completed 260, the probe is disengaged from the wellbore wall and the pressure returns to the wellbore pressure 264 within a time period 295 and reaches stabilization at 271.

Once a first estimate of the formation pressure and the formation mobility are obtained in the investigation phase 13c, shown in FIGS. 19A and 20, the parameters thus obtained may be used to establish the measurement phase 14 pretest parameters that will produce more accurate formation parameters within the allotted time for the test. The procedures for using the parameters obtained in the investigation phase 13c to design the measurement phase 14 pretest parameters have been described in previous sections.

In a previous section, methods for determining mud compressibility are outlined. The mud compressibility is dependent on its composition and on the temperature and the pressure of the fluid. As a result the mud compressibility often changes with depth. Therefore, it is desirable to measure the mud compressibility in situ at a location near where the testing is to be performed. If the tool configuration does not allow the mud compressibility to be determined as described above, the in-situ mud compressibility may be estimated by alternate methods as described in the following.

In a method according to embodiments of the invention, the formation tester may be set in casing, for example near the casing shoe, to establish a fluid seal with the casing. A compression and decompression of the well fluid trapped in the tester flowline is performed by means of the pretest piston 118a shown in FIG. 4. Procedures for performing the mud compressibility test are described above with reference to FIGS. 11A and 11B. Once the pretest piston rate $q_p$, the rate of pressure change $\dot{p}$ and the trapped volume V are known, the mud compressibility may be estimated from $C_m = -q_p/(V\dot{p})$.

In this particular embodiment, the true vertical depth (hence, the temperature and pressure) at which the compressibility measurement is performed may be significantly different from the depth where the formation pressure is to be measured. Because the compressibility of drilling fluids is affected by temperature and pressure, it would be necessary to apply a correction to the compressibility thus measured in order to estimate the compressibility of the drilling mud at the depth where the testing is to be performed.

Figure 21:
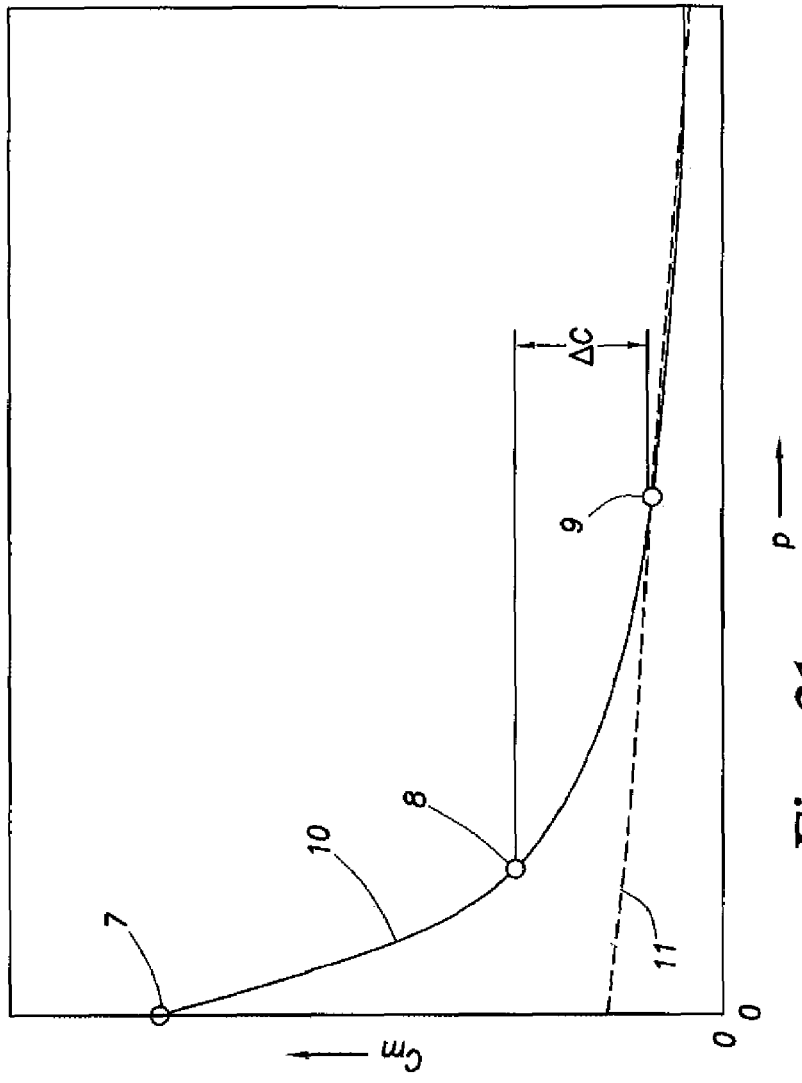
FIG. 21 shows a fluid compressibility correction chart which may be used to provide corrected mud compressibility when the original mud compressibility is performed at a different temperature and/or pressure.

In a method in accordance with the present invention, the wellbore pressure and temperature information are acquired before the measurement begins, e.g., at point 801 as shown in FIG. 17A, using conventional pressure and temperature sensors. Based on known drilling mud properties and in-situ temperature and pressure measurements, charts as shown in FIG. 21 may be constructed for the purpose of conducting temperature and pressure corrections. Alternatively, analytical methods known in the art may be used to compute correction factors which when applied to the original compressibility measurement will provide the in-situ flowline fluid compressibility at the depth at which the formation pressure is to be measured. See e.g., E. Kartstad and B. S. Aadnoy, "*Density Behavior of Drilling Fluids During High Pressure High Temperature Drilling Operations*," IADC/SPE paper 47806, 1998.

In another method according to embodiments of the invention, the compressibility of a surface-derived (e.g., mud-pit) sample over the range of expected downhole temperature and pressure conditions are measured. An estimate of the in-situ mud compressibility under the downhole conditions may then be estimated from known relationships between the mud density and mud pressure and mud temperature according to methods known in the art. See, e.g., FIG. 21 and E. Kartstad and B. S. Aadnoy, "*Density Behavior of Drilling Fluids During High Pressure High Temperature Drilling Operations*," IADC/SPE paper 47806, 1998.

FIG. 21 depicts a typical relationship between fluid compressibility ($C_m$) and fluid pressure (p) for oil based and water based muds. Solid line 10 depicts the variation in mud compressibility with wellbore pressure for a typical oil based mud. Dashed line 11 depicts the corresponding variation in mud compressibility for a typical water based mud. The compressibility of the oil based mud at the surface is represented by reference number 7. The compressibility of the oil based mud at the casing shoe is represented by reference number 8. The compressibility of the oil based mud at a given measurement depth below the casing shoe is represented by reference number 9. The compressibility correction $\Delta C$ represents the difference between the compressibility of the oil based mud at the casing shoe 8 and that at the measurement depth 9. The compressibility measurement made at the casing shoe 8 may be adjusted by the compressibility correction $\Delta C$ to determine the compressibility at the measurement depth 9. As indicated by the dashed line 11, the change in compressibility and corresponding compressibility correction for water based muds may be less significant than the correction depicted by the solid line 10 for oil based muds.

As noted above, mud compressibility under the downhole conditions, either measured directly in situ or extrapolated from other measurements, may be used in embodiments of the invention to improve the accuracy of the estimates of formation properties from the investigation phase and/or measurement phase as shown, for example, in FIG. 11A.

Figure 22:
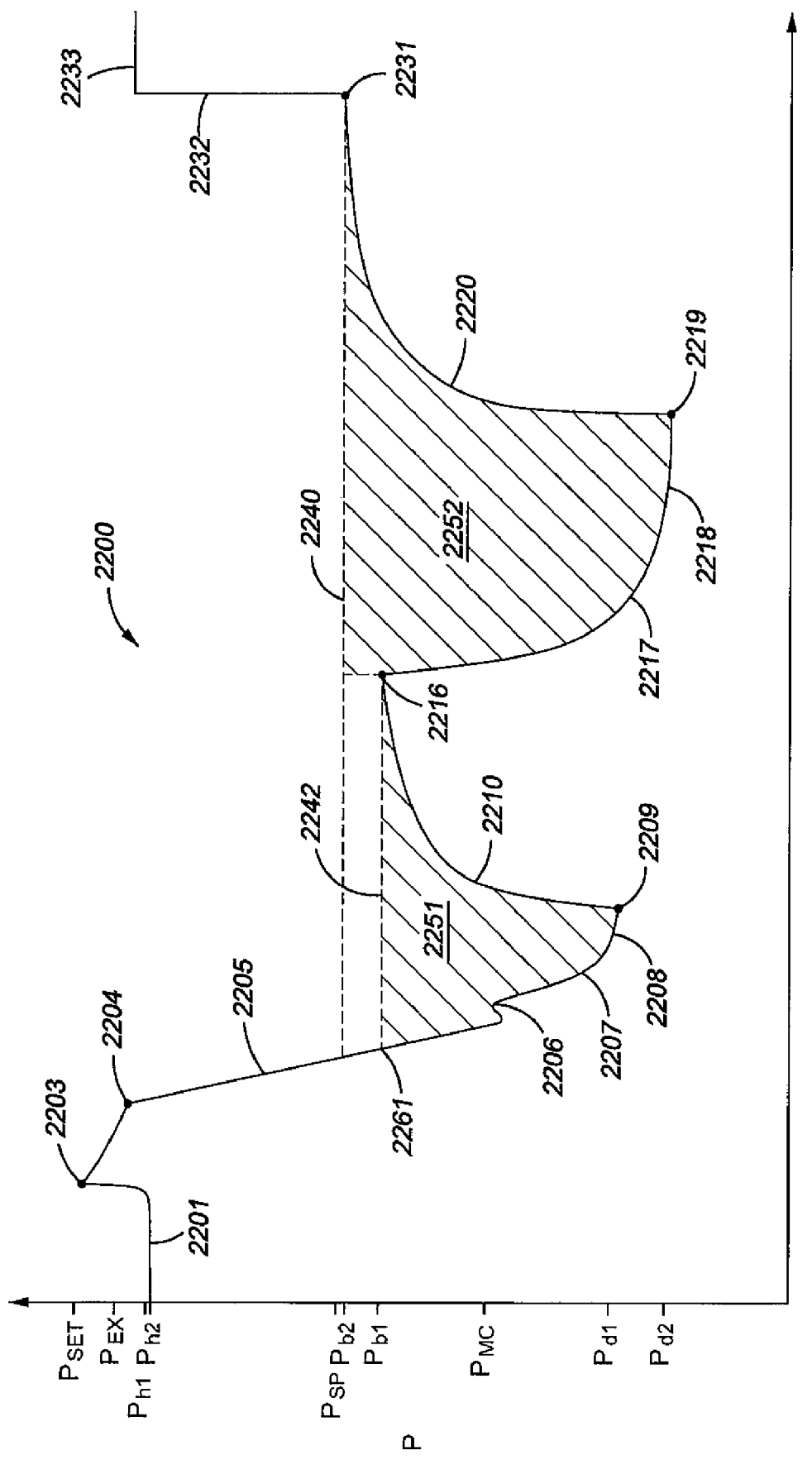
FIG. 22 shows a graphical representation of pressure measurements versus time plot generated by a formation tester.

FIG. 22 depicts a pressure (P) versus time (t) plot 2200 of the pressure taken during a pretest operation. This pressure trace is similar to the pretest depicted in FIG. 5 above, but with greater detail. A general procedure for a pretest will be described with reference to FIG. 22, although it is noted that this description is exemplary, and other procedures may be used without departing from the scope of the invention.

Before the pretest begins, a fluid communication device, such as the probe (112a in FIG. 4) is in a retracted position so that the interior of the tool is exposed to the wellbore or hydrostatic pressure ($P_{h1}$), shown at 2201. To perform a pretest, the fluid communication device is pressed against the borehole wall to form a seal and establish fluid communication with the formation. As the probe engages the borehole wall, the fluid communication device is 'set' and pressure in the flowline increases. This pressure increase is caused by the compression of the fluid in the flowline when the probe presses into the mudcake on the borehole wall. This 'setting' action has a set pressure ($P_{set}$) and is shown in FIG. 22 at 2203. As depicted, the set pressure ($P_{set}$) may be higher than the wellbore pressure ($P_{h1}$), at 2201, although this may not always be the case. The relative position of the set pressure ($P_{set}$) with respect to the hydrostatic pressure ($P_{h1}$) is immaterial to the applicability of the description below.

In FIG. 22, point 2204 marks the beginning of the drawdown phase 2205 of the investigation phase. This is called the expansion pressure ($P_{ex}$), because it is the pressure measured just before the expansion phase begins. The point 2204 may be above the wellbore pressure ($P_{h1}$), or it may fall back down to, or even below, the wellbore pressure ($P_{h1}$) after the tool is set.

In the drawdown phase, a pretest piston (e.g., 118a in FIG. 4) located inside the tool and connected to the flowline (e.g., 119a in FIG. 4) is displaced so that the volume of the flowline is increased. In this case, the increase occurs at a steady and known rate, but may be varied if desired. As the volume is increased and the drawdown in performed, the pressure in the flowline drops. This 'drawdown phase' 2205 extends from 2204 to the termination of drawdown at drawdown pressure 2209.

At some point during the first drawdown, it is expected that the mudcake (4 in FIG. 1) on the borehole wall isolated within the probe of the tool will break, which will enable fluid from the formation to flow into the probe flowline. When the mudcake breaks, and if the formation has sufficient mobility, the pressure in the flowline may experience a slight rise, shown at 2206. Typically, this occurs at a pressure that is lower than the stabilized sandface pressure ($P_{sf}$) 2240, which is usually unknown to the operator at the time the mudcake breaks. Thus, the pressure ($P_{MC}$) 2206 at which the mudcake breaks provides an initial indication of the range in which the stabilized sandface pressure ($P_{sf}$) 2240, and ultimately the formation pressure ($P_f$ or $P^*$), lies.

Once the mudcake breaks 2206, the drawdown continues 2207 until the pressure in the flowline reaches a drawdown pressure ($P_{d1}$) at 2209. It is noted that most of the drawdown phase (i.e., 2205, 2207), with the exception of the mudcake breach 2206, is very close to a linear drop in pressure as described with respect to FIG. 7 above. Near the end of the drawdown phase 2208, the pressure trend becomes non-linear. This is because fluid is flowing into the tool from the formation, and the flowrate of fluid from the formation begins to match the volume rate of change imposed by the motion of the piston.

The lowest pressure during the drawdown, referred to as the 'drawdown phase' 2205, is called the "drawdown pressure" ($P_{d1}$) 2209. There are several methods for determining when the drawdown will be stopped. Some examples of techniques for determining termination of the drawdown are described with respect to FIG. 7 above.

One technique that may be used to select the drawdown pressure ($P_{d1}$) 2209 is based on the pressure at which the mudcake breaks ($P_{MC}$) 2206, if that is detected. For example, if the mudcake break is detected, the drawdown pressure ($P_{d1}$) 2209 may be set at a given or 'pre-selected' value below the mudcake pressure ($P_{MC}$) 2206.

In other cases, the drawdown pressure ($P_{d1}$) 2209 is not specifically selected at all. Instead, the drawdown phase is terminated, for example, based on the change in the effective volume of the probe flowline after the mudcake breaks 2206. For example, the drawdown phase may be defined by moving a piston to displace a selected volume after the mudcake breaks 2206. In those cases where the mudcake break 2206 is not detected, the drawdown phase may be terminated based on the total volume of fluid that is displaced by moving the piston. Thus, a fixed rate and a total volume may be specified. The drawdown phase will continue with the piston moving at the fixed rate until the specified total volume is reached. At that point, the piston is stopped, and the drawdown pressure ($P_{d1}$) 2209 will depend on the ability of the formation to deliver fluid and the operational parameter selected for the pretest.

Once the drawdown pressure ($P_{d1}$) is reached 2209, the piston in the tool stops moving, and pressure sensors in the tool monitor the pressure buildup that results from the formation fluid flowing into the tool. This pressure buildup, or buildup phase 2210, extends from the drawdown pressure 2209 until a final buildup 2216 is reached. During the buildup phase 2210, the pressure builds asymptotically towards the stabilized sandface pressure ($P_{sf}$) at dashed line 2240. It is noted that the final buildup pressure ($P_{b1}$) 2216 at the end of the first buildup phase 2210 is depicted as being less than the stabilized sandface pressure ($P_{sf}$) 2240, but it could be greater. The buildup phase 2210 may be terminated before the pressure completely stabilizes, for example when only a short duration is allotted for the pretest.

As shown in FIG. 22, two sequential pretests are performed. The first pretest, referred to as the 'investigation phase,' as just described, spans the pressure curve in FIG. 22 from 2204 to 2216. The investigation phase may be similar to the pretest as described, for example, with respect to FIG. 2 above. A second pretest or "measurement phase" may be performed after the first pretest or investigation phase as described above. Additional pretests may be performed as desired.

The second pretest or 'measurement phase' extends from 2216 to 2231 in FIG. 22. As described above, the duration of the phases may be limited and the termination points of these phases may be set based on criteria. Typically, the investigation phase is shorter in duration compared to the measurement phase(s) and is often used to provide estimates of the formation parameters and/or to design criteria for conducting the measurement phase. The measurement phase may be specifically tailored to achieve pretest objectives based on the results derived from the investigation phase. It is typically longer in duration than the investigation phase and may provide more accurate results.

As discussed above with respect to FIG. 7, the pretests may be used to generate an estimate of the formation pressure ($P_f$) and an estimate of the "mobility" of the fluid in the formation. Mobility describes how easily the formation fluid will flow in the formation. This may be useful in evaluating the economic viability of producing hydrocarbons from the well. The mobility is defined as the permeability of the formation divided by the viscosity of the fluid in the formation. Thus, mobility M, is defined as $M=K/\mu$, where K is the formation permeability and $\mu$ is the viscosity of the formation fluid.

As described previously with respect to FIG. 7, an estimate of the mobility of a formation can be determined from the area below a line running horizontally through the final buildup pressure and above the drawdown and buildup curves (as depicted by reference number 325 in FIG. 7). For example, in FIG. 22, the area 2251 below the horizontal line 2242 through the first buildup pressure ($P_{b1}$) 2216, and above at least a portion of the drawdown 2205 and buildup 2210 curves is an indicator of the mobility. For example, the mobility $(K/\mu)_1$ may be estimated using equation (1) above and where $V_1$ is the variation of the pretest chamber volume between the point of intersection of the line 2242 and the line 2205 (e.g., 2261 in FIG. 22) and the end of the buildup phase (e.g., 2216 in FIG. 22) and A is the area under the curve (e.g., area 2251 in FIG. 22).

FIG. 22 also shows the pressure curve for a measurement phase, between points 2216 and 2231. The measurement phase shown in FIG. 22 is similar to the investigation phase (2204-2216), except that the measurement phase may, but not necessarily, have a larger pressure drop and usually has a longer time for the buildup phase. The criteria for performing the measurement phase may be designed based on the results of the investigation phase as described previously herein.

The second drawdown starts at point 2216 in FIG. 22 and continues until the pressure reaches the second drawdown pressure ($P_{d2}$) 2219. Similarly to the late part 2208 of the first drawdown, the late part 2218 of the second drawdown 2217 exhibits non-linearity. As with the first drawdown phase 2205, the second drawdown 2217 may be terminated by any method known in the art. For example, the second drawdown phase 2217 may be stopped after a preselected volume of expansion. Also, the second drawdown 2217 may be terminated once a preselected pressure, the second drawdown pressure ($P_{d2}$), has been reached. The second drawdown pressure ($P_{d2}$) 2219 may be selected based on information already known about the well and formation, from information derived from a previous pretest, or from tests performed in a pilot well, or using any criteria described above.

Alternatively, the second drawdown 2217 may be terminated based on information gained during the investigation phase as described above. For example, the volumetric rate and the total volume selected for the second drawdown 2217 may be selected based on the pressure data obtained during the investigation phase 2204-2216. In another example, the second drawdown pressure 2219 may be specifically selected based on the analysis of the pressure data obtained in the investigation phase 2204-2216. The method for terminating the first and second drawdown phases are not intended to limit the invention.

The second drawdown 2217 may be caused by moving a piston to expand the volume in the flowline in the tool. Preferably, the piston used for the measurement phase is the same piston that is used for the investigation phase, although another piston may be used. Additionally, other methods for lowering the pressure may be used, as are known in the art. The method for performing a drawdown is not intended to limit the invention.

Following termination of the drawdown phase 2217 at point 2219, the piston may be stopped, and the pressure in the flowline allowed to increase. This is the second buildup phase 2220. Preferably, the second buildup phase 2220 is longer in duration than the first buildup phase 2210, when multiple pretests are performed. The pressure in the second buildup phase 2220 builds up to the second buildup pressure ($P_{b2}$) 2231. This second buildup pressure may be used as a second indicator of the stabilized sandface pressure ($P_{sf}$) 2240.

As with the investigation phase, the area 2252 on the graph of the measurement phase that lies under the second buildup pressure ($P_{b2}$) 2231 and above the second drawdown phase 2217 and the second buildup phase 2220 may be used as an indicator of the mobility of the fluid in the formation. The value of the area 2252 together with the variation of the pretest chamber volume between the point 2216 and the point 2231 may be used to estimate the mobility. For example, Equation (1), above, may be used to estimate the mobility of the fluid in the formation. Alternatively, any other method known in the art may be used to determine the mobility.

Following the measurement phase (i.e., after termination of the second buildup phase 2220 at 2231), the pretest piston is typically partially extended, the equalization valve opened and the fluid communication device is retracted from the borehole wall. The flowline is then again exposed to the wellbore pressure. The pressure in the flowline rises (at 2232) to the wellbore pressure ($P_{h2}$) 2233.

In most cases, the wellbore pressure measured at the beginning of the pretest ($P_{h1}$ at 2201) is similar to or the same as the wellbore pressure ($P_{h2}$ at 2233) measured at the end of the pretest. It is noted that there may be differences depending on a number of circumstances. For example, changes in the temperature may affect the pressure measurement. Additionally, if the pretest is performed while drilling, the hydrodynamic pressure in the borehole may fluctuate if the pretest is performed while the mud pumps are running. Other factors may affect the wellbore pressure measurements ($P_{h1}$, $P_{h2}$).

It is noted that when performing a pretest during drilling operations, it may be desirable to do so with the mud pumps running, even though the mud flow may cause noise and fluctuations in the wellbore pressure. The mud pumps provide a flow of mud through the drill string, which allows the use of mud-pulse telemetry. Thus, by leaving the mud pumps on while performing a pretest, at least some level of communication with the surface may be accomplished.

In operation according to aspects of the present invention, data compression techniques are utilized to fill a predetermined communication channel capacity, such as the bandwidth available for data transmission in the aforementioned mud-pulse telemetry channel, with data to be communicated, such as the aforementioned pretest data, etc. Using such data compression techniques, robust uphole communication of test data, such as pressure verses time data derived from a formation pressure while drilling test, may be provided in real-time or near real-time, even where the data communication channel is severely bandwidth limited such as due to a low data rate and/or the bandwidth is consumed by transmission of other/additional data. For example, using data compression techniques of the present invention, data of the pretest described above with respect to FIG. 22 sufficient to accurately represent the plot illustrated in the figure may be communicated to the surface in real-time or near real-time.

The communication of robust data may be utilized to facilitate analysis and/or control of the drilling operation without requiring removal of the formation testing tool, and thus the drill string, and/or to allow drilling operations to be continued and/or modified rapidly in light of the information derived from the results of a pretest, etc. Of course, the present invention is not limited to communication only of the aforementioned pretest pressure data or even just pretest data. For example, the present method may be used to communicate, among others, pretest pressure derivative data, pretest motor speeds and volumes, volumes of fluid pumped during a sampling operation, optical densities from a fluid spectrometer, fluid densities and/or viscosities of a sampled stream, and information concerning the operation of the tool such as the retract and setline pressures or the information concerning the internal state of the tool, if desired. Where the formation testing tool is not adapted to autonomously utilize the investigation phase data to configure a measurement phase test, data compression techniques of the present invention may be utilized to communicate data of the investigation phase, sufficient to accurately represent the plot illustrated in FIG. 22, to the surface in real-time or near real-time. This data may be analyzed at the surface for configuring the measurement phase of the pretest within a limited time allotted for drilling operation stoppage for conducting the pretest. In those cases where the pressure test is conducted with mud circulation pumps off, in which case there is no communication between the tool and surface during the performance of the test, the methods described herein may be used to great advantage. By utilizing these methods, an accurate representation of the data acquired by the tool during such pumps off tests may be efficiently transmitted to surface after the fact allowing timely decisions to be made regarding the operation of the tool and the state of the well. Although the foregoing examples referenced uphole transmission of data, it should be appreciated that the concepts of the present invention may be applied with respect to downhole or other data communications.

Figure 23:
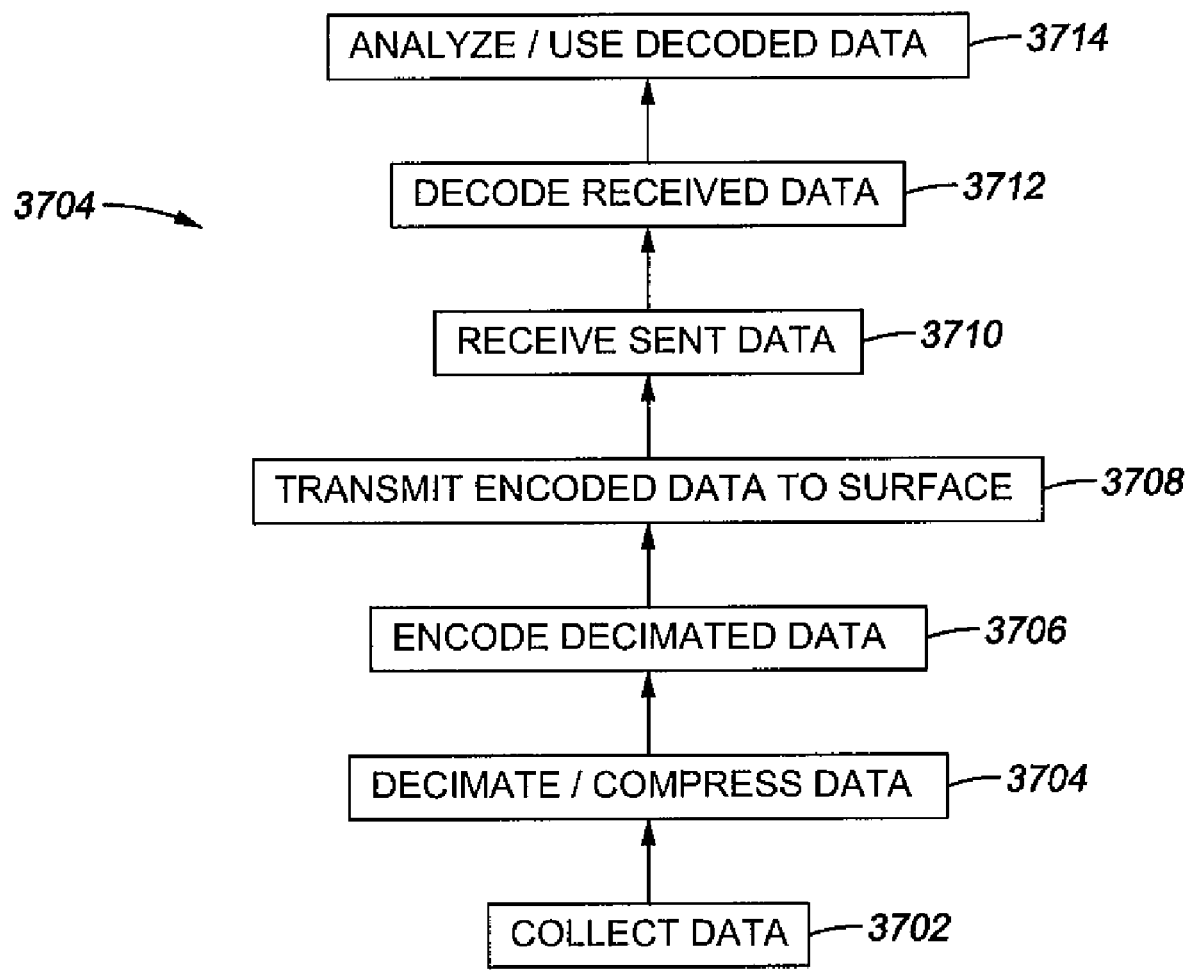
FIG. 23 is a high level flow diagram of operation providing data compression and communication in accordance with the concepts of the present invention.

Directing attention to FIG. 23, a high level flow diagram of operations providing data compression and communication in accordance with the concepts of the present invention is shown. As shown in the flow diagram of FIG. 23, at step 3702 data is collected, such as may be comprised of the aforementioned pretest data. For example, a formation testing tool may perform one or more measurements, as described above, to provide desired data.

Thereafter, at step 3704, all or a selected portion of the collected data, e.g., the data representing a portion of interest with respect to a test procedure, is decimated/compressed, preferably using techniques described more fully below. It should be appreciated that "decimation" is used herein in its broadest meaning to include reducing the number of samples in signal discrete series or data streams, and is not intended to be limited to tenths ("deci") of the whole.

In providing data decimation/compression at step 3704, event data points are preferably identified within test data for communication via the data communication channel. A data decimator preferably utilizes these event data points to identify additional data points within the collected data, such as particular data points disposed on a curve between event data points, for communication via the data communication channel. Preferably, the additional data points are selected to cause the event data points, the additional data points, and any overhead data utilized with respect to communication of the collected data to fill as nearly as possible all available bandwidth in the communication channel. The bandwidth in the communication channel filled according to aspects of the invention may be the entire bandwidth of the communication channel or some portion of the channel bandwidth which is not otherwise utilized, reserved, or unavailable for the foregoing data communication.

At step 3706 the decimated/compressed data is encoded for transmission within the communication channel. Encoding the data may comprise packetizing or quantizing and assigning bits to the data, processing the data to provide error detection and/or correction, encapsulating the data within an appropriate transport container, etc. Moreover, encoding the data as provided at step 3706 may include appending the decimated/compressed data to, or interleaving the decimated/compressed data with, other data which is to be communicated via the communication channel.

The encoded data is transmitted using the communication channel at step 3708. Transmission at step 3708 may include modulation of a carrier wave or other well known techniques for placing data on a medium for transmission. In a preferred configuration, the encoded data is modulated as pulses for transmission via a mud pulse telemetry communication channel.

At step 3710 the encoded data is received by a system in communication with the communication channel. For example, where a formation testing tool has performed a test from which the data has been collected, a surface system, such as an up-hole receiver coupled to the communication channel, may receive the data. Reception at step 3710 may include demodulation of a carrier channel or other well known techniques for extracting data from a transmission medium. In a preferred configuration, the received data is demodulated from pulses of a mud pulse telemetry communication channel.

The received data is decoded at step 3712. Decoding the data may comprise depacketizing or dequantization and reconstruction of the data, processing the data to detect and/or correct errors, unwrapping or decapsulating the data from within a transport container, etc. Moreover, decoding the data as provided at step 3712 may include separating desired data from other data which has been communicated via the communication channel. Decoding the data at step 3712 may additionally or alternatively include applying one or more inverse functions to data compressed using a particular function, such as discussed with respect to FIG. 30 below. In addition, decoding the data may comprise applying the inverse of a "growth" function applied by a data decimator as described below. Application of such an inverse function may utilize information regarding the function applied to the data which is communicated through the communication channel or may be independently determined, such as through employing the same algorithms used to determine a function to be applied by system transmitting the data.

At step 3714 the decoded or reconstructed data is analyzed and/or used. The decoded data is usually added to a well log. A well log may take the form of a display on a screen located on the rig, for example the rig 2 in FIG. 1A. A well log may also take the form of a printed document or of an electronic record, stored in any known storage means known in the art. For example, where a formation testing tool has performed a test from which the data has been collected, a surface system, such as a computer or terminal, may process the data to provide information to a well engineer or other operator with respect to continued drilling operations, performing additional tests, completing tests, etc. Alternatively or additionally the information may be stored and used later, for example, to determine a reservoir model, asses the profitability of the reservoir, select exploitation equipment or for other applications known in the art.

Figure 24:
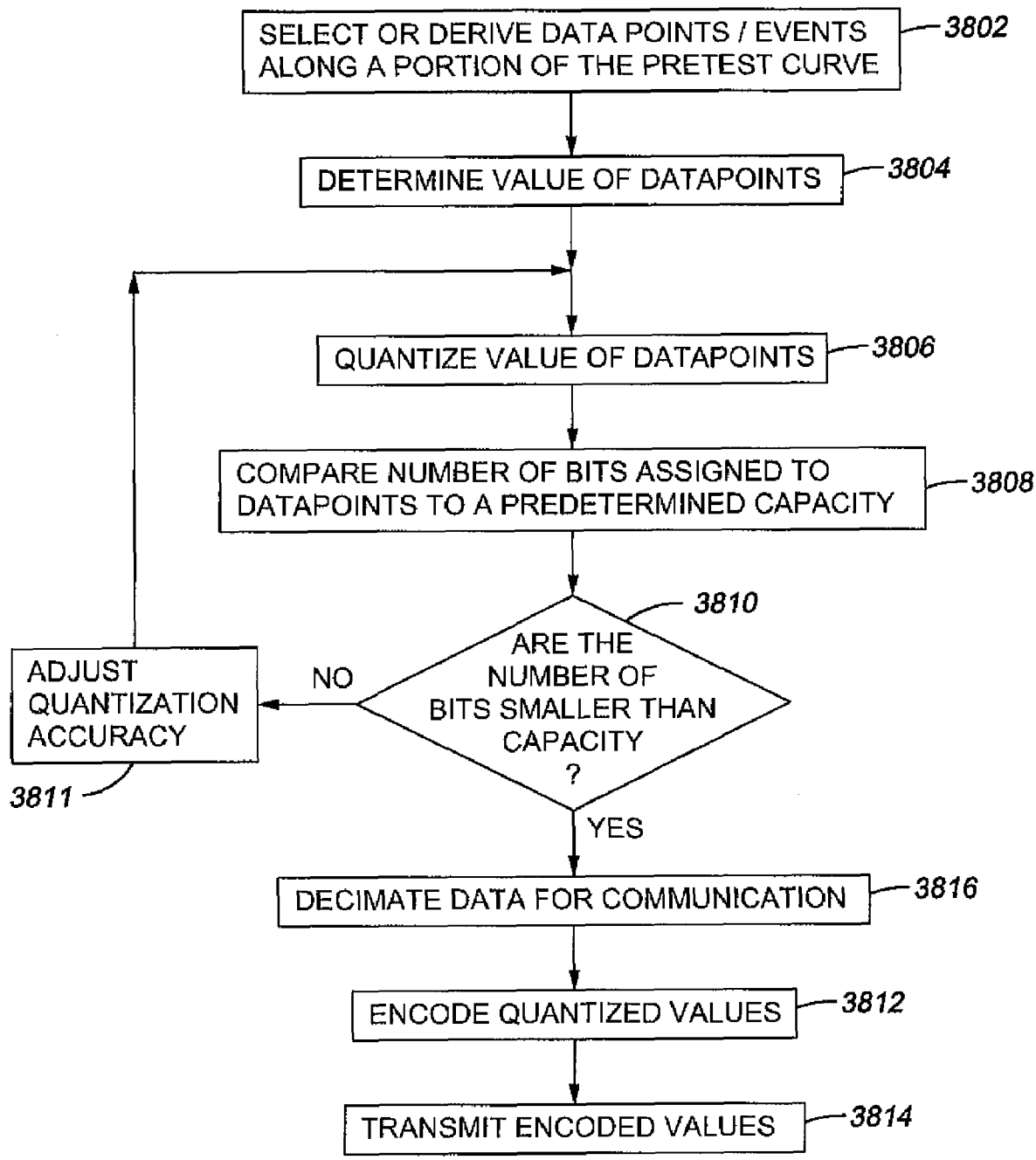
FIG. 24 provides detail with respect to a configuration of the decimate/compress data step of FIG. 23.
Figure 25:
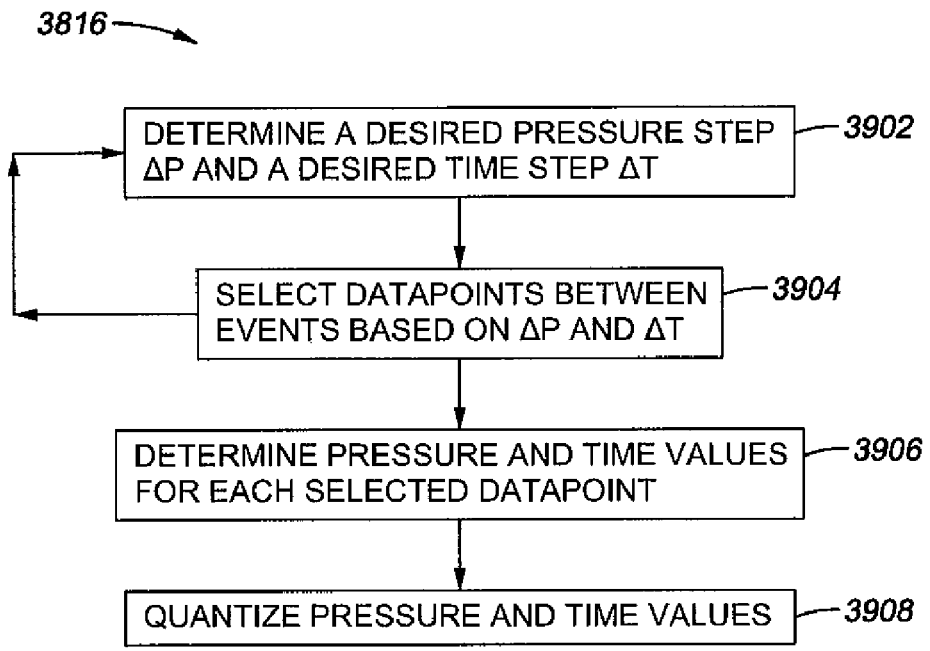
FIG. 25 is a flow diagram of operation providing data decimation for compression of data to be communicated according to one configuration of a method employing concepts of the present invention.
Figure 26:
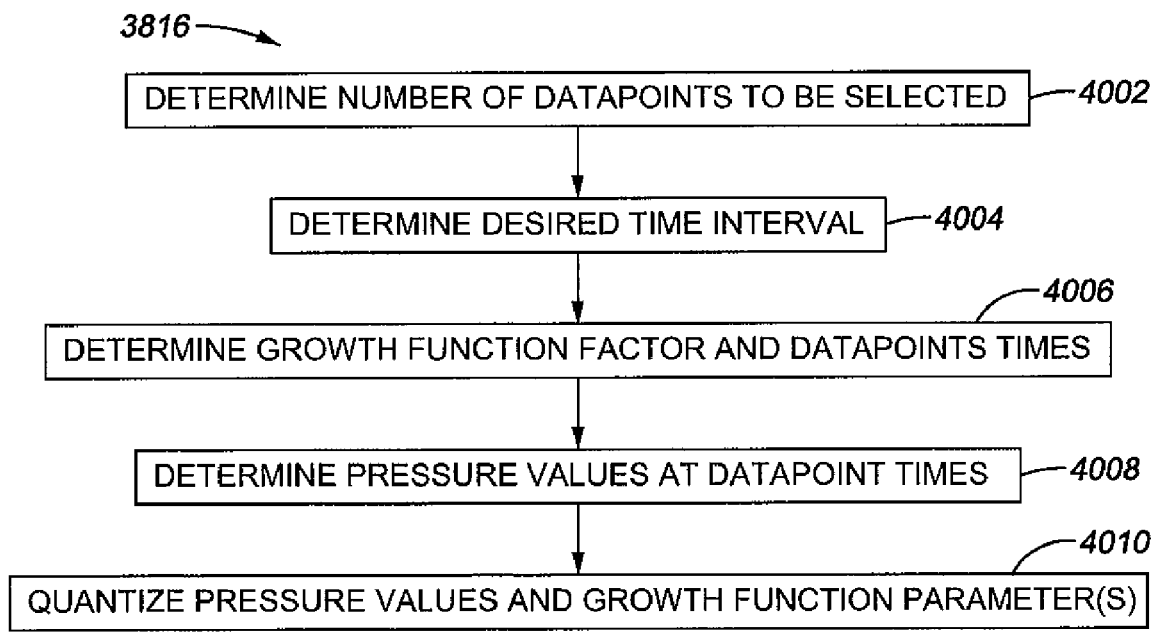
FIG. 26 is a flow diagram of operation providing data decimation for compression of data to be communicated according to another configuration of a method employing concepts of the present invention.

Having described generally operations providing data compression and communication in accordance with the concepts of the present invention as illustrated in FIG. 23, attention is directed to FIGS. 24-26 wherein further detail with respect to preferred data compression techniques is provided. Specifically, the flow diagram of FIG. 24 provides detail with respect to a preferred configuration of the decimate/compress data step 3704 of FIG. 23. Similarly, the flow diagrams of FIGS. 25 and 26 provide details with respect to various configurations of the decimate data for communication step 3816 of FIG. 24.

To better aid the reader in understanding the concepts of the present invention, operation of the invention as represented by the flow diagrams of FIGS. 24-26 will be described herein with reference to formation pretest data to thereby provide a more tangible exemplary configuration. It should be appreciated, however, that the present invention is not limited to use with the exemplary data referenced herein.

Referring now to FIG. 24, the flow diagram therein begins at step 3802 wherein event data points are selected or derived for communication. Referring to the pretest data shown in FIG. 22, it can be seen that particular events are represented therein. For example, the data of the measurement phase of the pretest includes data points associated with particular events experienced during or in association with the pretest. In particular data point 2216 represents a drawdown start event, data point 2219 represents a drawdown pressure reached event, and data point 2231 represents a buildup pressure approximated event. Other events which may be of interest with respect to a well pretest include, identification of the wellbore pressure before the test 2201, tool set event 2203, beginning of a pretest investigation phase/beginning of flowline expansion 2204, mudcake breach detection 2206, termination of the investigation drawdown 2209, investigation buildup pressure approximated/ending of a pretest investigation phase/beginning of a pretest measurement phase 2216, termination of the measurement phase drawdown 2219, measurement phase buildup pressure approximated/ending of a pretest measurement phase/a final formation pressure is reached 2231, and the wellbore pressure after the test is conducted 2233. These events may not be present in all tests, for example a lost seal or a dry test etc. These and other events may be readily detectable (e.g., a particular testing operation is commenced or terminated, such as the pretest piston is engaged, a motor is activated, a particular motor speed is attained, a tool is engaged, a tool is disengaged, etc.) or relatively easily identified within the data stream (e.g., reversal or fast change of a trend, a peak or valley in one or more measured parameters, a steady state in one or more measured parameters reached, a timeout is reached, etc.).

Various event data points may be considered as being of particular interest with respect to the pretest performed, or otherwise may represent data of particular interest within the data stream. For example, the aforementioned event data points may define intervals of values or portions of data for compression, and/or real-time communication. Accordingly, step 3802 of FIG. 24 preferably operates to select or derive one or more of these events, event points or data points for inclusion in the compressed communication used to represent the full data stream (e.g., the entire pretest or the pretest measurement phase portion of the curve shown in FIG. 22).

At step 3804 the value or values associated with the aforementioned event points are determined. For example, where the event data points represent a pressure at a particular time, the pressure and time values for each selected event data point may be determined for transmission. In another example, acquired data are extrapolated between or beyond sampled times to precisely determine values at a change of trend or asymptotic values. In yet another example, values at the selected data points are determined by "smoothing" the collected data or trends in the collected data, for example as further detailed below with respect to FIGS. 31-33B.

In operation as illustrated in FIG. 24, the values for each selected event data point are quantized for communication via the communication channel at step 3806. For example, the values of each event data point may be quantized for encoding prior to transmission. Non-uniform quantization of data may be provided, if desired. For example, it may be advantageous to use one quantization accuracy to quantize values of data points located in an interval and another quantization accuracy to quantize values of data points located in another interval or intervals. A compander may be utilized to change the quantization accuracy used to quantize the values of each event data points depending on a desired accuracy level. Details concerning a compander configuration which may be utilized according to the concepts of the present invention are discussed below.

The number of bits allocated for the decimated data point values resulting from quantizing the data may be based upon the desired accuracy. For example, where the data points represent pressure and time information, the number of bits provided by the aforementioned quantizing may be calculated according to the following rule:

$$n\text{bits}_{time} = \lceil \log_2(t_{max}/t_{acc}) \rceil \tag{43}$$

$$n\text{bits}_{press} = \lceil \log_2(P_{max}/P_{acc}) \rceil \tag{45}$$

where $\lceil x \rceil$ denotes the smallest integer larger than x, $t_{acc}$ and $P_{acc}$ are, respectively, the desired time and pressure accuracies, nbits$_{time}$ and nbits$_{press}$ are, respectively, the number of bits allocated for decimated time and pressure, and t$_{max}$ and P$_{max}$ are, respectively, the maximum pressure value and the maximum time value.

At step 3808 the data identified for communication, e.g., the event point data and any overhead data associated with the transmission thereof, is analyzed with respect to a predetermined channel capacity, e.g., the bandwidth available in the communication channel for communication of the pretest data, to determine if additional pretest data may be communicated within the communication channel. For example, a mud pulse telemetry communication channel may provide from approximately 0.5 bits per second to approximately 12 bits per second, depending upon various factors. The maximum bit rate achievable with respect to any particular well using mud pulse telemetry is determinable, such as through empirical evaluation. The period in which data communication is to be accomplished is similarly determinable. For example, drilling operations may be interrupted for a maximum period, such as 15 minutes, and a pretest operation from which the data to be communicated is captured may require 10 minutes, leaving approximately 5 minutes for data communication (ignoring for this example that data communication may be accomplished during the pretest operations) if it is desired to complete the pretest operations and all associated communications prior to drilling operations resuming. Alternatively, the transmission of data can take place simultaneously with the resumption of drilling, if necessary. Assuming in this example that the mud pulse telemetry communication channel supports 1 bit per second and that no other data is being communicated through the channel at this time, a bandwidth capacity of 300 bits is available for communication of the pretest data (assuming a 5 minute transmission time). Operation at step 3808 preferably compares the number of bits from the quantized values of the selected event data points, and any overhead bits associated therewith (e.g., packet headers, error detection/correction bits, etc.), to the available bandwidth capacity to determine if capacity remains for communication of additional data.

A determination is preferably made at step 3810 with respect to whether the amount of data associated with communication of the selected event data points, and any other data currently selected for communication, is less than the capacity available in the communication channel for such communications. If there is additional capacity available in the communication channel (or if there is additional capacity beyond a minimum threshold amount sufficient to allow additional data to be communicated), processing proceeds according to the illustrated flow diagram to step 3816 wherein additional pretest data is preferably selected for communication. Detail with respect to various data decimation techniques which may be utilized for selecting such additional data is provided in the discussions of FIGS. 39 and 40 below.

If, however, additional capacity is not available in the communication channel (or if there is insufficient capacity to allow additional data to be communicated), processing may proceed according to the illustrated flow diagram to steps 3811, wherein the quantization accuracy is adjusted. For example, the resolution of the values may be altered to obtain a smaller number of bits assigned to the data points and/or the number data points may be reduced until sufficient bandwidth is achieved.

At step 3812 of the illustrated configuration the data selected for communication, e.g., the selected event data points and selected additional data points, is encoded. Operation with respect to step 3812 preferably corresponds to step 3706 discussed above with respect to FIG. 23. At step 3814 of the illustrated configuration the encoded data is transmitted. Operation with respect to step 3814 preferably corresponds to step 3708 discussed above with respect to FIG. 23.

Referring now to FIG. 25, a flow diagram of operations providing data decimation for compression of data to be communicated according to one configuration of a method employing concepts of the present invention is shown. It should be appreciated that the steps of the flow diagram set forth in FIG. 25 may be performed as part of the decimate data for communication step 3816 shown in FIG. 24.

The data decimator utilized in implementing the flow diagram shown in FIG. 25 operates to optimize the particular data selected for communication and/or the amount of data communicated through the use of one or more variables for selecting data for communication. The variables for selecting data for communication shown in FIG. 25 are change in pressure ($\Delta P$) and change in time ($\Delta T$), consistent with the example wherein the pretest data points are pressure verses time. Of course, other variables may be utilized in selecting data for communication as a compressed data set according to the concepts of the present invention.

At step 3902, values of $\Delta P$ and $\Delta T$ are selected. The values of these variables may be selected by any of a number of techniques. For example, step values associated with a highest resolution of the data (e.g., corresponding to a sampling rate used in acquiring test data) may be selected for these variables initially because such a selection would provide maximum information. Alternatively, step values considered likely to result in selection of data points sufficient to fill the capacity of the communication channel may be selected initially for these variables. Step values considered likely to result in selection of data points less than that needed to fill the capacity of the communication channel may be selected initially for these variables such that an iterative process may be used to increase the number of selected data points to substantially fill the capacity of the communication channel. In other words, the iterative process may include selecting, identifying, and determining data points to converge on a selection of candidate data points. Such step values may be selected using historical information, modeling, statistical analysis, etc. A particularly advantageous initial choice for the pressure step value is to choose an integer multiple, such as four or greater, of the pressure channel noise, the pressure noise being determined directly from the pressure trace being compressed by methods well known in signal processing.

In an optimization of $\Delta P$ and/or $\Delta T$, the pressure and/or time steps may be determined by a discrete optimization algorithm which automatically adjusts the pressure and/or time step sizes to achieve the specified target of number of bits representing the pretest pressure-time trace to be communicated.

Data points within the data stream to be compressed according to the present invention are selected at step 3904. In the configuration of FIG. 25, data points which are analyzed for selection are data points lying on a curve a step value (here $\Delta P$ or $\Delta T$) from a reference point (here an event data point). Preferably, data points which are analyzed for selection are data points on the curve between two selected event data points, such as event data points selected at step 3802 of FIG. 24. Accordingly, a segment of the data set curve bounded by the two selected event data points may readily be represented in a compressed data stream according to this operation. Multiple curve segments may be compressed according to the foregoing to thereby provide piece-wise compression of the pretest data. The foregoing concepts are more readily appreciated through reference to FIG. 27.

Figure 27:
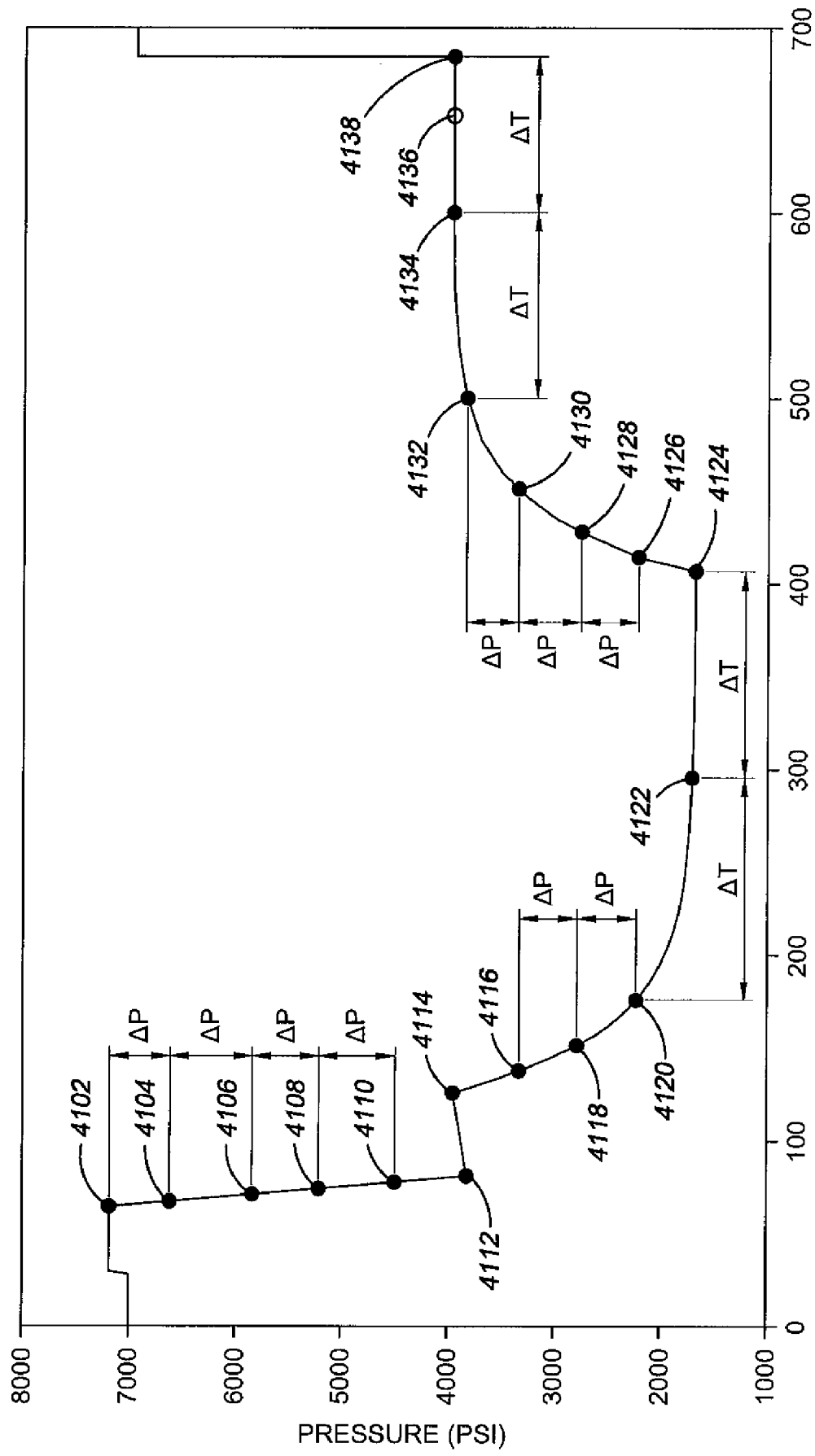
FIG. 27 is a curve associated with a data set for communication according to the present invention substantially corresponding to the pretest of FIG. 22.

FIG. 27 shows a curve associated with a data set for communication according to the present invention substantially corresponding to the pretest of FIG. 22. Data points 4102-4138 are shown as initially being selected as the compressed data set for communication. That is, if the number of bits associated with communicating each of these data points via the communication channel is less than or equal to the available capacity of the communication channel, such as may be determined at step 3810 of FIG. 24, data points 4102-4138 will be selected for communication. Data points 4102-4138 include event data points 4102, 4112, 4114, 4124, and 4136, such as may have been selected at step 3802 of FIG. 24. Where a portion of the curve is to be compressed for communication, an event data point bounding that portion of the curve is identified and data points along that curve in steps associated with the aforementioned variables are selected for communication.

Accordingly, where the portion of the curve bounded by event data points 4114 and 4124 is to be compressed, event data point 4114 may be identified and the data stream analyzed to select a next data point having a value which is either ΔP or ΔT greater or less than a corresponding value of the event data point 4114. In the example shown, the pressure value of data point 4116 is ΔP from that of event data point 4114 (while the change in time remains less than ΔT). This is again repeated using selected data point 4116 as the reference, thus selecting data point 4118 having a pressure value ΔP from that of data point 4116 (again while the change in time remains less than ΔT). Data point 4122 shows an example of selection of a data point having a time value ΔT from that of a preceding selected data point (although the change in pressure remains less than ΔP). It should be appreciated that the entire data set, or portions thereof, may readily be decimated according to the foregoing.

Once the data points have been selected, the value or values (e.g., pressure slopes, and/or time values) associated with the aforementioned selected data points are determined at step 3906 and the values quantized for communication via the communication channel at step 3908. Quantization of the values may be accomplished using the same technique as utilized with respect to the selected event data points (step 3806) or by utilizing another technique.

Because operation of the foregoing configuration of the present invention maximizes the amount of data communicated within the bandwidth available in the communication channel, selection of additional data points using the foregoing variables is preferably an iterative process. Accordingly, the illustrated example returns to step 3810 of FIG. 24 after selection of additional data points using the foregoing decimation technique for a determination with respect to whether the amount of data associated with communication of the selected event data points, and the selected additional data points is less than the capacity available in the communication channel for such communications. If communication of the selected data points would not fill the communication channel available capacity, the decimation step is preferably repeated with an adjustment to one or more of the foregoing variables (e.g., decrease the step size ΔP and/or ΔT) to increase the number of additional selected data points. Similarly, if communication of the selected data points would exceed the communication channel available capacity, the decimation step is preferably repeated with an adjustment to one or more of the foregoing variables (e.g., increase the step size ΔP and/or ΔT) to decrease the number of additional selected data points.

Selection of a particular one of the foregoing variables for adjustment and the amount of adjustment provided may be based upon any of a number of considerations. For example, in the example described herein, wherein pressure and time steps are used to select additional data points, it may be desirable to adjust the pressure related variable where the time related variable has been selected as a function of a maximum or minimum "time-out" for sampling data. Of course, any or all such variables may be adjusted in any amount according to the concepts of the present invention. Moreover, different variables may be selected for adjustment at different times, such as successive iterations, and/or by different amounts according to the concepts of the present invention.

Referring now to FIG. 26, a flow diagram of operations providing data decimation for compression of data to be communicated according to another aspect of a method employing concepts of the present invention is shown. It should be appreciated that the steps of the flow diagram set forth in FIG. 26 may be performed as part of the decimate data for communication step 3816 shown in FIG. 24. It should further be appreciated that the data compression techniques described with reference to FIG. 26 may be used as an alternative to or in combination with the data compression techniques described above with reference to FIG. 25. For example, the data compression techniques of FIG. 25 may be utilized for one segment of a curve while the compression techniques of FIG. 26 may be utilized for another segment of a curve. A compression technique best suited for the particular data characteristics may thus be used.

The data decimator utilized in implementing the flow diagram shown in FIG. 26 operates to optimize the particular data selected for communication and/or the amount of data communicated through the use of a suitable "growth" function to select the particular data points for communication and/or the amount of data points communicated. Functions implemented by such data decimators may utilize, for example, a linear, a logarithmic, an exponential, a spherical, or a geometric progression, or any other appropriate time-like function, for example time or produced volume. For example, where a curve represented by the data points exhibits rapidly changing values at the beginning of the curve and the rate of change of the values decreases later in the curve, it may be desirable to implement a data point selection technique to spread the data points selected out along the curve to avoid capturing a disproportionately large percentage of data points late in the curve and a lower percentage of data points early in the curve where most of the change is taking place. Application of a growth function by the data decimator may be utilized to optimize selection of the particular data for communication by selecting data points more evenly spread over the arc of the curve. The foregoing concepts are more readily appreciated through reference to FIG. 28.

Figure 28:
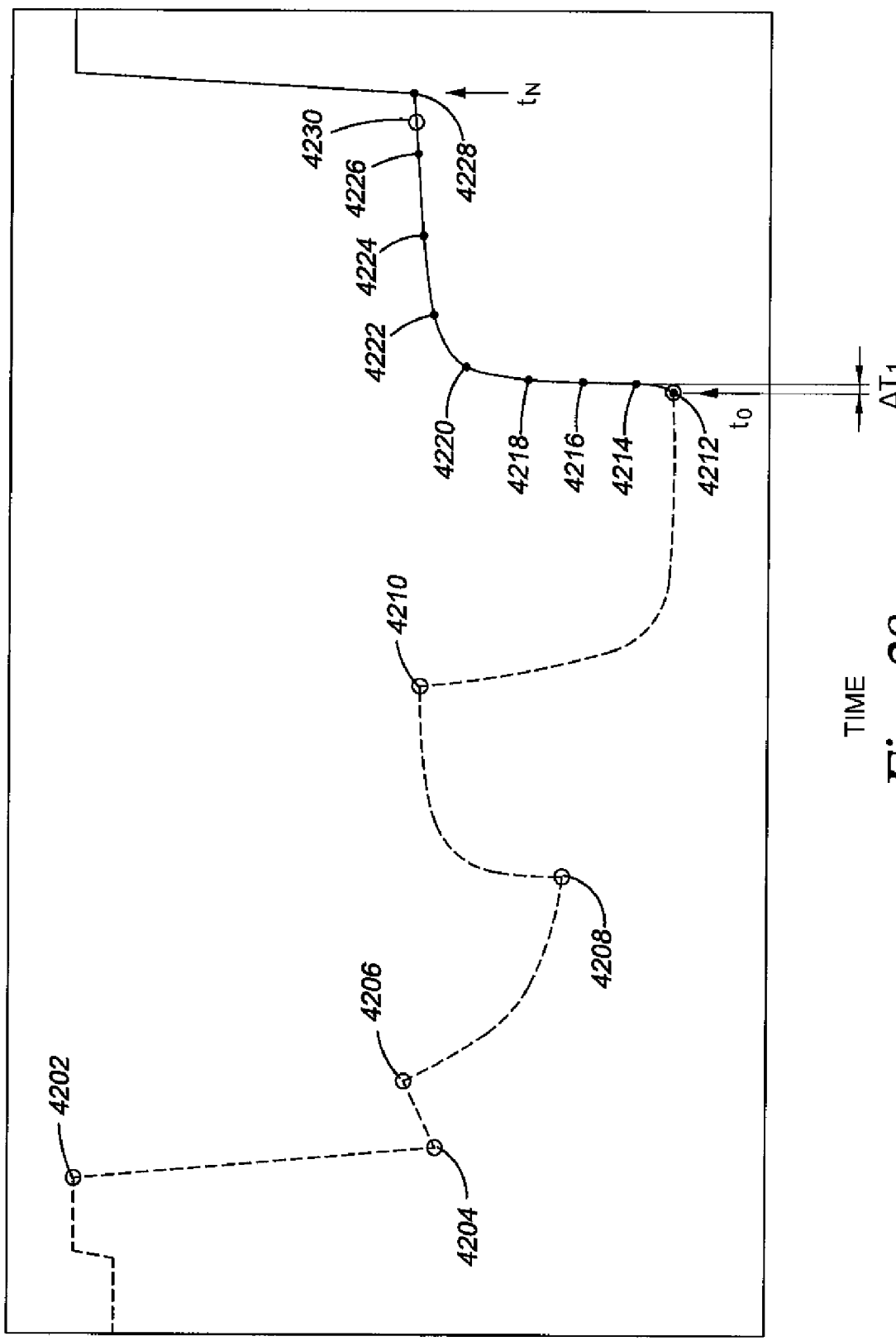
FIG. 28 is a curve associated with a data set for communication according to the present invention substantially corresponding to the pretest measurement phase of FIG. 22.

FIG. 28 shows a curve associated with a data set for communication according to the present invention substantially corresponding to the pretest measurement phase of FIG. 22. Although data points 4202-4230 are shown in FIG. 28, this example illustrates selection of data points with respect to a portion of the curve. Accordingly, data points 4212-4228 are shown as initially being selected as the compressed data set for communication. That is, if the number of bits associated with communicating each of these data points via the communication channel is less than or equal to the available capacity of the communication channel (or that available for communication of this portion of the curve), such as may be determined at step 3810 of FIG. 24, data points 4212-4228 will be selected for communication. Data points 4212-4228 include event data points 4212 and 4228 which may be selected for communication at step 3802 of FIG. 24 and, therefore, may not be duplicatively communicated, and additional data points 4214-4226 selected using a decimator of the described configuration. Accordingly, where the portion of the curve bounded by event data points 4212 and 4228 is to be compressed, a growth function to provide relatively even distribution of selected data points along the curve portion between these bounding event data points is preferably implemented.

In providing data decimation according to the example illustrated in FIG. 26, a number of additional data points to be selected is determined at step 4002. For example, where a particular portion of a curve is to be decimated, a number of additional data points between event data points bounding the portion of the curve may be determined at step 4002. The number of additional data points to be selected may be determined by subtracting the selected event data points and associated communication overhead, as well as any overhead associated with the communication of the additional data points, from the communication channel available bandwidth.

At step 4004 a desired interval between two events is determined. Alternatively, and as discussed herein, the desired interval may be bound by two times, such as $t_0$ and $t_n$, shown in FIG. 28. This interval may span from one event to the other event, or may span any portion between the two events. For example, in the foregoing example where the data points comprise pressure and time information a time interval may be selected which, when a selected growth function is applied, will facilitate the selection of the number of additional data points determined in step 4002. A beginning of the interval may be determined using a time step $\Delta t_1$ as shown in FIG. 28. For example, the beginning of the interval may be determined using a pre-selected time delay, such as 1 second, for example. An end of the interval may be determined using a percentage of $t_n$-$t_0$. Similarly, a beginning of the interval may be determined in a similar fashion.

It should be appreciated that operation of the present invention is not limited with respect to any particular parameter or interval for use with respect to selecting additional data points using a growth function. However, decimation utilizing a growth function is preferably implemented with respect to a portion of the data stream wherein the data point values are increasing or decreasing monotonically in order to provide a more uniform spread of the selected additional data points.

The growth function factor which will result in the selection of the number of data points, determined in step 4002, is determined at step 4006. Having determined the growth function factor, step 4006 of the illustrated example further provides the time progression, thereby identifying the times associated with the additional data points to be selected.

At step 4008, the pressure values for the data points corresponding to the time progression provided in step 4006 are determined. It should be appreciated that, through application of such a growth function, that data compression in addition to the decimation of data may be realized by communicating partial data sets. In the foregoing example, where the data points represent pressure verses time, the aforementioned geometric progression may be utilized to reproduce the relevant time aspect of the data point, thereby allowing only the pressure component of the data point to be communicated.

Accordingly, at step 4010 of the illustrated example, pressure values associated with the selected additional data points and the growth function factor utilized in determining the time progression are quantized for transmission. Additional or alternative information may be quantized at step 4010, as desired. For example, where various different growth functions may be implemented with respect to data decimation, information indicating the particular growth function implemented may be quantized. Similarly, where the desired interval between selected data points, the particular data point parameter used with respect to the growth function, etc. are not known to the receiving end of the communication, information with respect to these parameters may be quantized for communication. Quantization of the values may be accomplished using the same technique as utilized with respect to the selected event data points (step 3806) or utilizing another technique.

Because operation of the foregoing configuration of the present invention maximizes the amount of data communicated within the bandwidth available in the communication channel, selection of additional data points using the foregoing growth function may be an iterative process. For example, a plurality of portions of the curve may be decimated according to the steps set forth in FIGS. 24 and 26. Accordingly, the illustrated example returns to step 3810 of FIG. 24 after selection of additional data points using the foregoing decimation technique for a determination with respect to whether the amount of data associated with communication of the selected event data points, and the selected additional data points is less than the capacity available in the communication channel for such communications. If communication of the selected data points would not fill the communication channel available capacity, the decimation step is preferably repeated with respect to this portion of the curve or another portion of the curve to increase the number of additional selected data points. Similarly, if communication of the selected data points would exceed the communication channel available capacity, the decimation step is preferably repeated with respect to this portion of the curve or another portion of the curve to decrease the number of additional selected data points.

Figure 29:
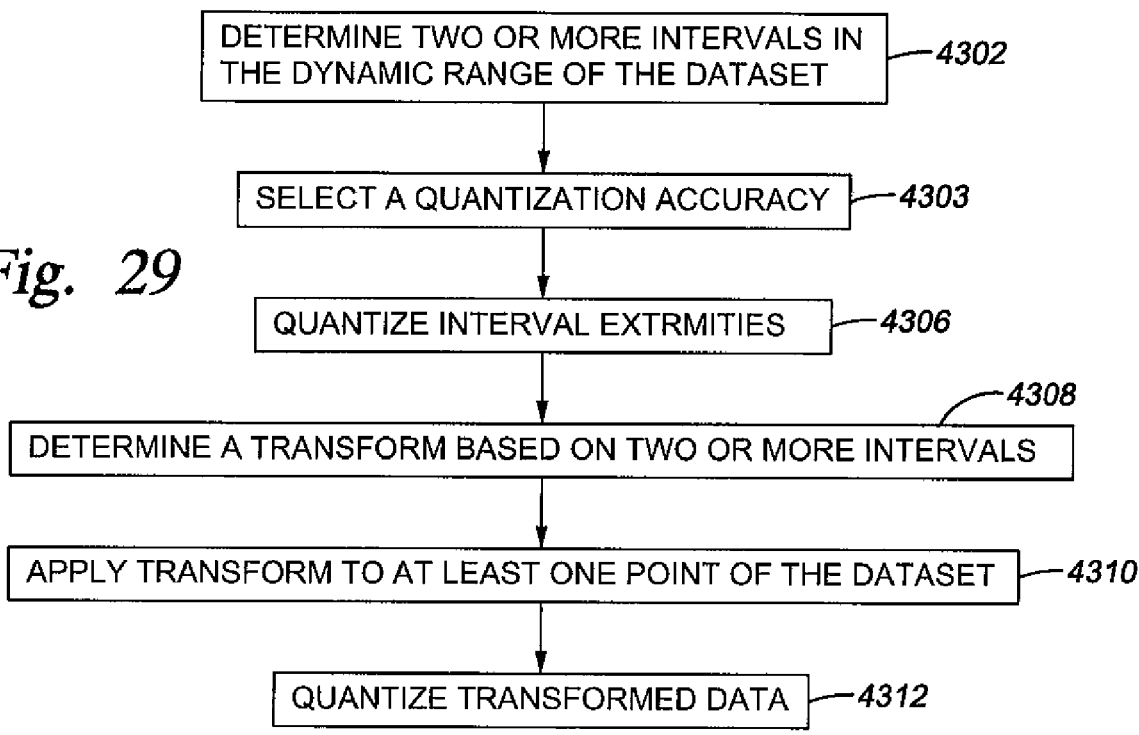
FIG. 29 is a flow diagram providing detail with respect to quantization techniques as may be implemented according to the concepts of the present invention.

Having described operation providing data compression and communication in accordance with the concepts of the present invention as illustrated in FIGS. 24-26, attention is directed to FIG. 29 wherein further detail with respect to quantization techniques, as may be implemented using a data compander according to the concepts of the present invention, is illustrated. The steps of the flow diagram of FIG. 29 may be utilized to provide quantization of data, such as within any of steps 3806 (FIG. 24), 3908 (FIG. 25), and 4010 (FIG. 26).

Quantizing data according to the flow diagram of FIG. 29 begins at step 4302 wherein two or more intervals in the dynamic range of the data set are determined. At step 4304 a desired quantization accuracy is selected, such as discussed above with respect to equation 45. The interval extremities are quantized at step 4306. A transform based on two or more intervals is determined at step 4308 and the transform is applied to at least one point of the data set at step 4310. The result of the transformed data set is quantized at step 4312.

Continuing with the example of formation pretest data having pressure and time values, such as set forth in FIG. 22, let it be assumed that a compander is used to quantize an exemplary data set consisting of the wellbore pressure values $P_{h1}$ and $P_{h2}$, the probe set pressure value $P_{set}$, the expansion pressure value $P_{ex}$, the buildup pressures $P_{b1}$, $P_{b2}$, the drawdown pressures $P_{d1}$ and $P_{d2}$, and the pressure value at which the mudcake breaks $P_{MC}$. As used hereafter, the term "wellbore pressure" may refer to any of hydrostatic and/or hydrodynamic pressure. The values in this dataset range from a minimum value $P_{min}$ equal to $P_{d2}$ and a maximum value $P_{max}$ equal to $P_{set}$.

Figure 30:
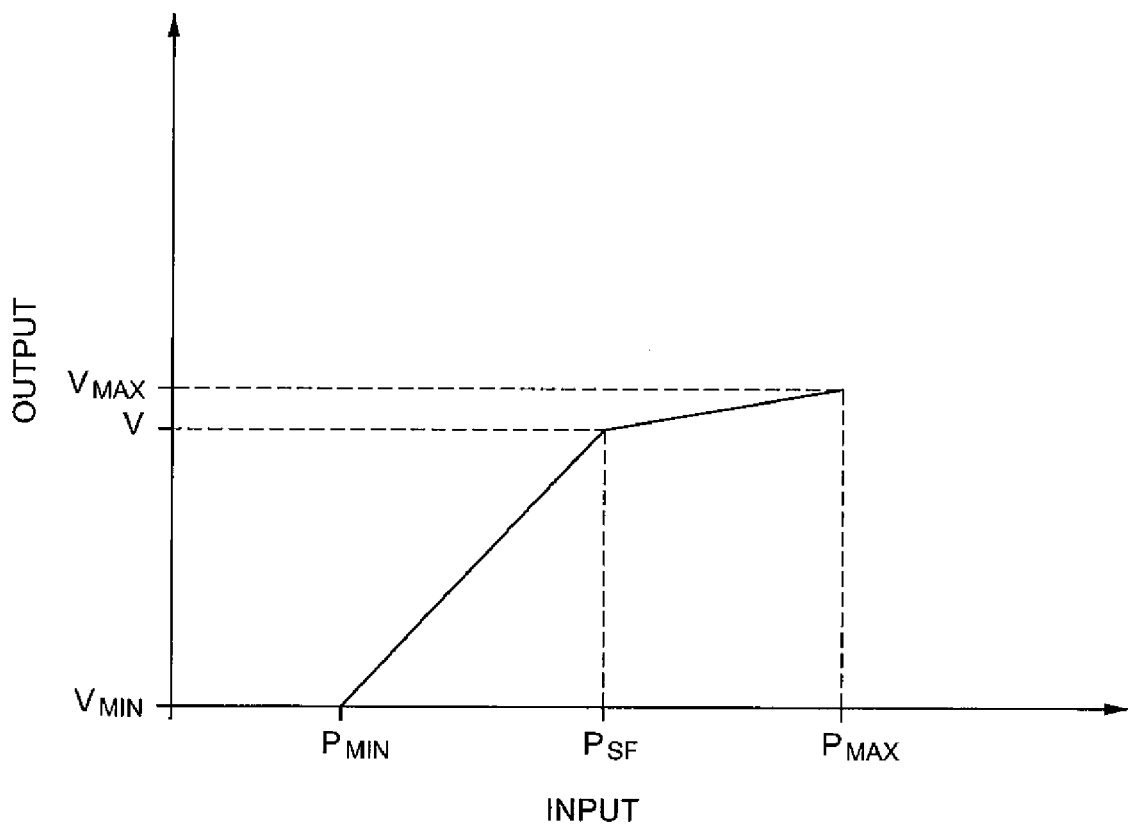
FIG. 30 is a graphical representation of operation of a data compander providing non-uniform quantization.

An important result provided by a pretest is an approximation of the sandface stabilized pressure $P_{sf}$. A quantization accuracy $P_{acc}$ of this pressure is preferably selected for quantizing this pressure value, or at least an event identified as a final formation pressure being reached (for example data point 4136 in FIG. 27 or data point 4230 in FIG. 28). More specifically, the quantization accuracy may be set at 1 psi for generating a log of the estimated the sandface stabilized pressure with 1 psi resolution.

Where the distribution of values in the data set is sparse in an interval or intervals, a data compander operating according to the flow diagram of FIG. 43 is preferably utilized to allocate a small portion of the bits to the values of the data set lying in the above mentioned sparse interval or intervals. Continuing with the example where formation pretest data having pressure and time values associated therewith, such as set forth in FIG. 22, it can be appreciated that except for the initial flowline expansion in the drawdown portion of the investigation phase, the pressure profile essentially varies between $P_{min}$ (the minimum pressure value) and $P_{sf}$ (approximated for example by the final buildup pressure $P_{b2}$). It may be advantageous to shrink the interval $[P_{sf} P_{max}]$ where the distribution of pressures is sparse, such as to efficiently represent the pressures in the interval $[P_{min} P_{sf}]$. The foregoing concepts are more readily appreciated through reference to FIG. 30. As shown in FIG. 30, the pressure may be mapped through a multi-linear transform which compresses the interval $[P_{sf} P_{max}]$ with a linear function with the slope less than 1. Thus, the interval $[P_{min} P_{sf}]$ after mapping occupies a greater fraction of the total interval than the interval $[P_{sf} P_{max}]$. After quantization using a uniform quantizer, the overall effect is the same as a non-uniform quantizer which allocates a large portion of bits to the values falling in $[P_{min} P_{sf}]$.

More specifically, the exemplary transform is based on the two intervals $[P_{min} P_{sf}]$ and $[P_{sf} P_{max}]$ that cover the dynamic range of the exemplary data set. The extremities of these intervals are $P_{min}$ ($P_{d2}$), $P_{sf}$ ($P_{b2}$), and $P_{max}$ ($P_{set}$), that are preferably quantized with accuracy $P_{acc}$, utilizing a number of bits discussed above with respect to equation 45. The other values of the exemplary data set are first mapped through the transform of FIG. 30. This transform maps interval $[P_{min} P_{sf}]$ into the interval $[V_{min} V]$, and the interval $[P_{sf} P_{max}]$ into the interval $[V V_{max}]$, where $V_{min}$ is equal for example to 0, V is equal for example to $P_{sf} - P_{min}$ and $V_{max}$ is a determined value, typically smaller than $P_{max} - P_{min}$.

This transform is applied to the elements of the exemplary data set other than $P_{d2}$, $P_{b2}$ and $P_{set}$ that have been previously quantized. The result of the transform is preferably quantized with accuracy $P_{acc}$. Note that the number of bits utilized for these transformed values is given by:

$$nbits_{trans} = \lceil \log_2(V_{max}/P_{acc}) \rceil \quad (44)$$

Those skilled in the art will appreciate that the number of intervals may be greater than two, if desired. Also, it should be appreciated that transforms other than multi-linear transforms can be alternatively used. For example, a single monotonic function with a variable slope may be used in place of or in addition to a multi-linear function. This monotonic function may also be parameterized by series of data point values. In particular, if the variable to be transmitted has values covering many orders of magnitude, for example permeability, the quantization can be applied to a representation of the variable rather than the values of the variable itself. In the case of permeability once one has decided on the range one wishes to cover the quantization may be applied to the exponent of a logarithmic representation of the value. In this instance it is the precision of the quantization of the exponent that matters.

Figure 31:
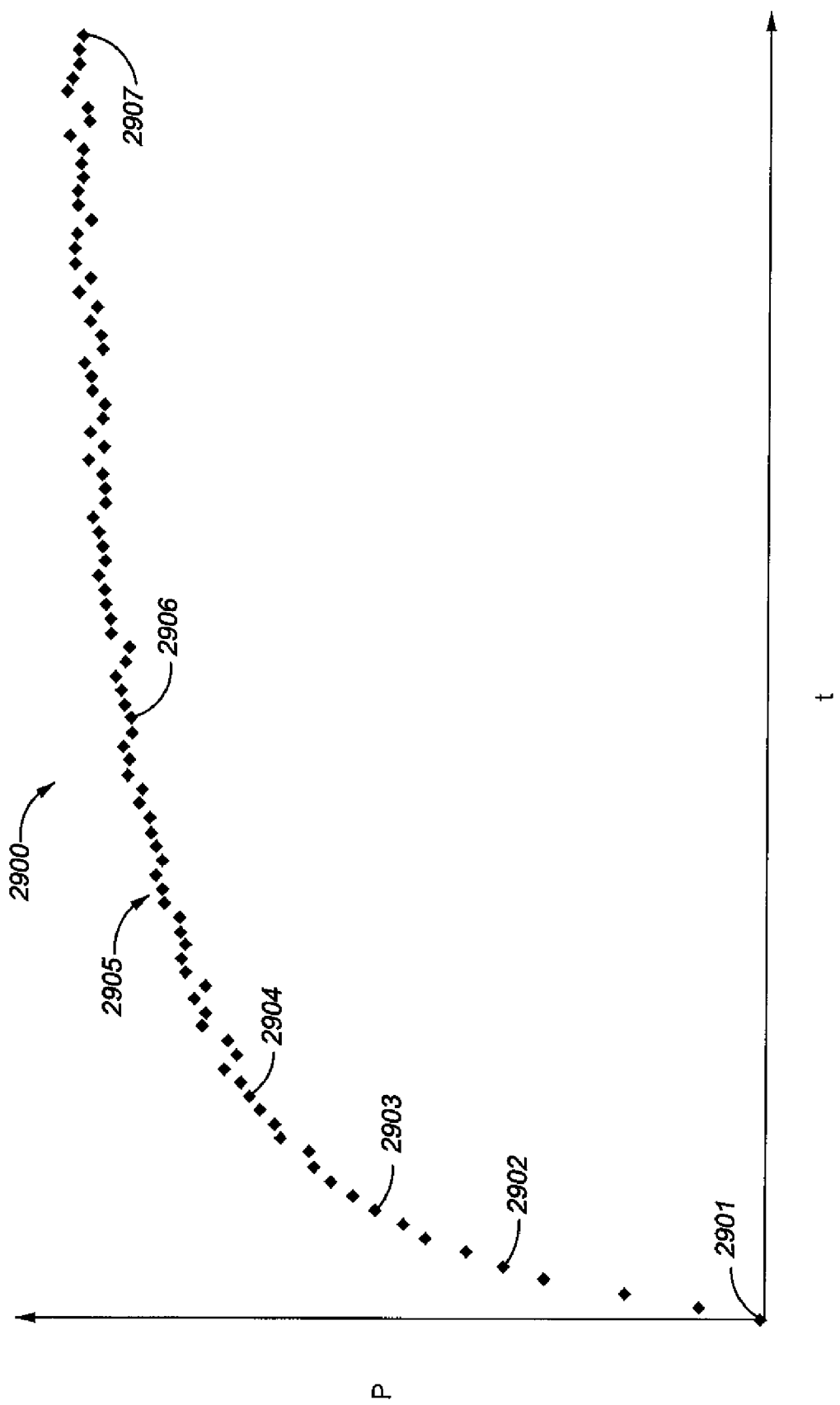
FIG. 31 shows a graphical representation of pressure measurements versus time plot generated by a formation tester depicting data points along a pressure buildup.
Figure 32:
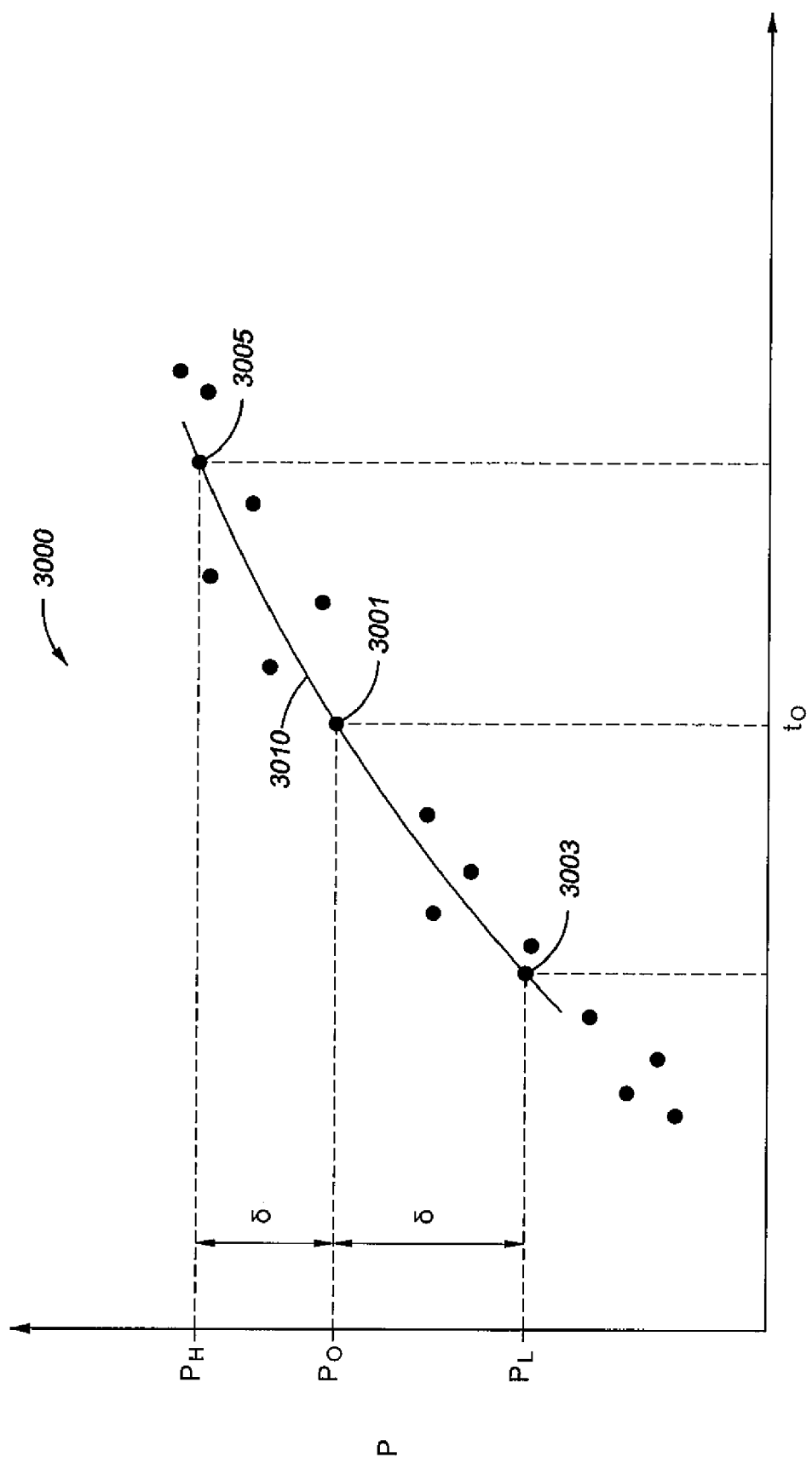
FIG. 32 shows a graphical representation of pressure measurements versus time plot generated by a formation tester depicting a pressure interval of the pressure buildup.

Having described quantization techniques, as may be implemented using a data compander according to the concepts of the present invention as illustrated in FIGS. 29-30, attention is directed to FIGS. 31 and 32 wherein further detail with respect to value determination techniques, as may be implemented according to the concepts of the present invention, are illustrated. Techniques discussed with respect to FIGS. 31-32, or other smoothing techniques discussed below, may be utilized to provide values at selected data points, such as within any of steps 3804 (FIG. 24), 3906 (FIG. 25), and 4008 (FIG. 26).

FIG. 31 shows one example of a buildup curve 2900 of a pressure (P) versus time (t) plot of a pretest. This buildup curve 2900 may be the same as the buildup 2210 or 2220 of FIG. 22 in greater detail. The buildup curve represents all of the pressure data points that are recorded by the downhole tool over time in a hypothetical pretest. Due to variations in the operation of the pressure sensors, the downhole temperature, and the way that fluid flows out of the formation, the data show variations about the general trend. When viewed in the aggregate, however, the data appears to form a somewhat smooth buildup curve.

In some cases, it is advantageous to compute a smoothed pressure value and the pressure derivative, or slope, of the pressure buildup curve at selected points along its evolution. Any method for selecting specific points may be used. In FIG. 31, the first data point in the buildup phase, at time zero, is selected as the first selected data point 2901. The remainder of the data points are selected based on various criteria, such as pressure step values, time step values, time growth function, etc. In this example, points 2902-2907 are selected using geometric time progression. Alternatively, all collected data points may be used for the analysis.

Once data points are selected, the smoothed value and the derivative of the pressure (i.e., the slope of the buildup curve) may be determined about the selected points. It may be useful to select a range about a selected data point and fit a curve to all of the data points in that range. The smoothed value and the derivative of the curve at the selected data point may be estimated using the fitted curve.

FIG. 32 shows a portion 3000 of a buildup curve 2900. Data point 3001, about which a smoothed value and a slope value are to be estimated, is selected. Data point 3001 has a time to and a pressure $P_0$. A range about data point 3001 is selected for a pressure interval ($\delta$). The selection of an interval ($\delta$) may be accomplished arbitrarily, or through a number of different methods. Preferably, the interval ($\delta$) is selected as a multiple of the noise of the signal. In other cases, the interval ($\delta$) may be selected as a multiple of the pressure sensor resolution. By selecting the interval ($\delta$) in either of these manners, it can be assured that the pressure differences between points on the interval represent actual pressure changes and not statistical variations in the data.

The upper and lower bounds of the pressure range correspond to pressures $P_L$ and $P_H$, respectively, where $P_L = P_0 - \delta$ and $P_H = P_0 + \delta$. In FIG. 32, the pressures $P_L$ and $P_H$ correspond approximately to buildup point 3003 and buildup point 3005, respectively.

Once the pressure range is defined, a curve is fit through the interval. In one example, a smoothing function is fit to the data in the range. A "smoothing function" is any function that is fit to the data to create a smooth curve that approximates the data in the range. Any function may be used that approximates the data. In one example, the mathematical expression of the smoothing function is a quadratic function of time, such as the one shown in Equation 31:

$$p(t) = a(t - t_0)^2 + b(t - t_0) + c \quad (31)$$

where $t_0$ is the time of the selected data point, and a, b, and c are constants to be fitted. One method to fit a quadratic is a robust least squares method, as is known in the art. The method of fitting the equation, as well as the particular form of the equation, are not intended to limit the invention. The line 3010 in FIG. 32 represents a curve for a quadratic equation that has been fit to the data in the range.

At the point where t=$t_0$, the pressure in Equation 31 will be the constant c. In addition, taking the analytical derivative of Equation 31, it can be seen that the derivative of Equation 31 at the point $t_0$ is the constant b. Thus, by fitting a quadratic equation, such as Equation 31, to the data in the range, a "smoothed" value of the pressure and of the slope of the pressure buildup curve at $t_0$ may be estimated, respectively, as the constants c and b. Thus, the pressure at $t_0$ may be estimated as the third constant (i.e., c in Equation 31), and the pressure derivative at $t_0$ may be estimated as the second constant (i.e., b in Equation 31). This method, as shown for the selected point 3001 in FIG. 32, may be performed for each of the selected data points in a set of data for a pressure buildup. For example, this method may be used to determine the "most representative" pressure value and the slope of the buildup curve in FIG. 30 at points 2902-2906. This method is also not limited to data points selected along a buildup curve and may be applied to other data points selected elsewhere on a pretest curve.

It may be valuable to know the "most representative" pressure value and/or the slope of the pretest curve at end data points in a pretest phase. In some cases, the selected data point may be the last recorded data point of the curve (i.e. 2907 in FIG. 30). In other cases, the selected data points may be close to an event where the pressure trend changes rapidly (i.e. 2901 in FIG. 30).

It should be appreciated that the values transmitted to a surface operator for being incorporated in a well log are not restricted to a smoothed value and a slope. For example, other data may be determined by curve fitting, such as a curvature, and may be transmitted. Also, only one of a smoothed value or a slope may be transmitted. Additionally or alternatively, values determined by filtering techniques applied to an interval selected around a data point, as further discussed below.

Referring again to FIG. 32, it may be advantageous to determine the smoothed value and the slope of the buildup curve about the selected points using filtering techniques. Once a pressure range or curve portion is defined about the selected data point, a filter may be selected based on the number of data points present in the range. Thus, the number of data points $N_L$ between data point 3003 (associated with the lower bound $P_L$ of the selected interval) and selected data point 3001 is determined. The number of data points $N_H$ between selected data point 3001 and data point 3005 (associated with the higher bound $P_H$ of the selected interval) is also determined. The filter length L may be selected based on $N_L$, $N_H$, or both $N_L$ and $N_H$. For example, a zero phase, Finite Impulse Response (FIR) filter length may be selected based on the minimum $N_{min}$ of $N_L$ and $N_H$, such as given by $L=2N_{min}+1$.

Figure 33A:
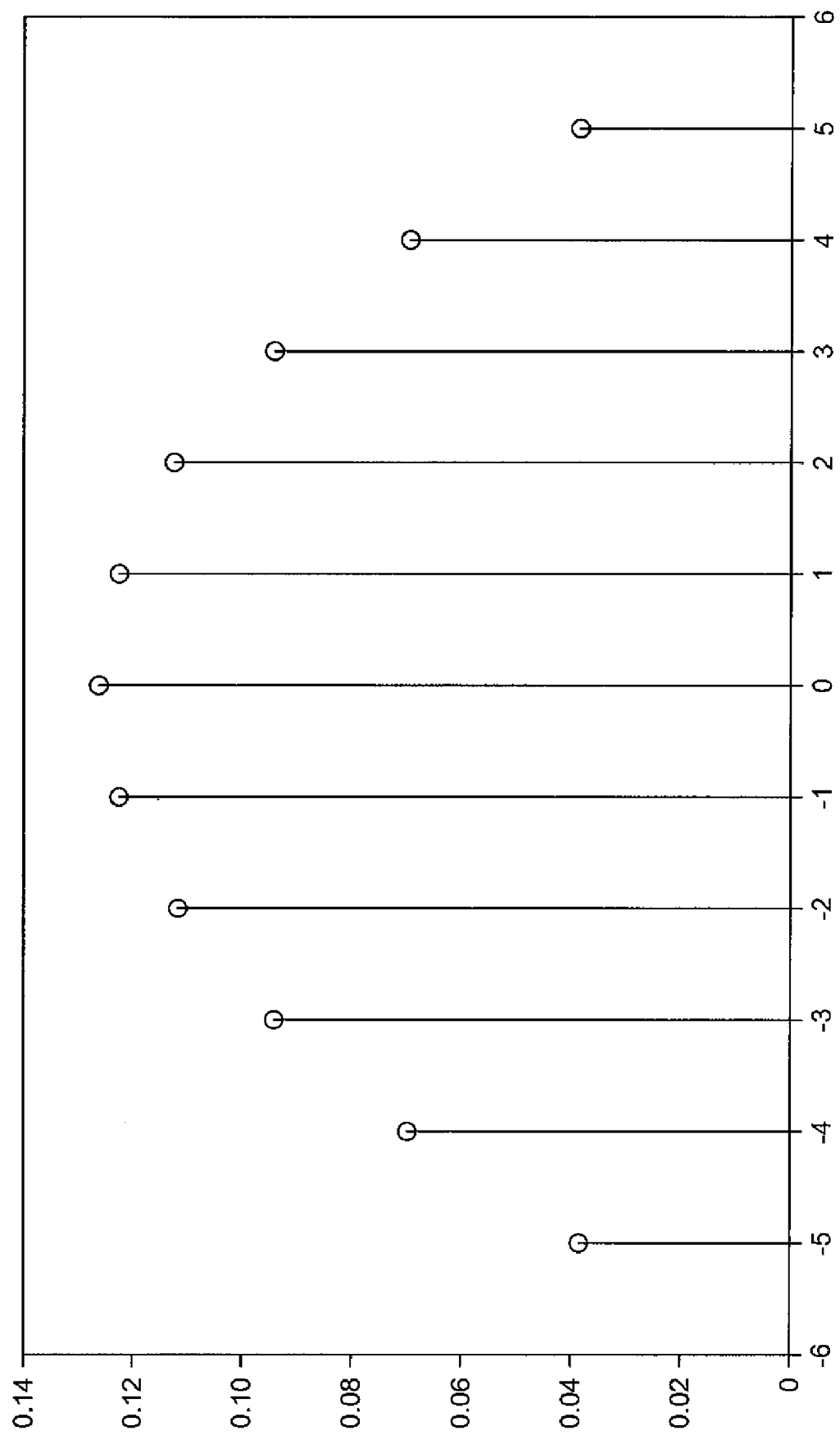
FIG. 33A is a graph illustrating an example of a filter for determining a smoothed value of a curve at a selected point.

The filter coefficients usually depend on the selected filter length L. Some filters may be more effective to filter data on short intervals and others on long intervals and are selected accordingly. The "most representative" pressure value for the pressure at selected data point 3001 may be obtained by convolution with a low pass, zero phase, FIR filter, such as a normalized tapering window or kernel weighting filter. More specifically a Welch window, an Epanechenikov kernel or a Savitsky Golay filter may be used. An illustrative example of a filter usable for obtaining a smoothed value of pressure at a selected point is shown in FIG. 33A. Note that filters may comprise positive and negative (not shown) values.

Once the filter is selected, the recorded curve is filtered about the selected data point using filtering method (i.e. a convolution) as well know in the art. The value of the filtered curve at the time to may then be transmitted.

Alternatively or additionally, a pressure derivative or curve slope at selected data point 3001 may be obtained by filtering techniques. For example, a derivative filter of selected length L may be used. Derivative filters have typically a frequency response H(ω) essentially proportional to the pulsation jω in a frequency band of interest of the signal. For example, a derivative filter may be derived by differentiating a low pass filter. An illustrative example of a FIR anti-symmetrical derivative filter is shown in FIG. 33B.

Figure 33B:
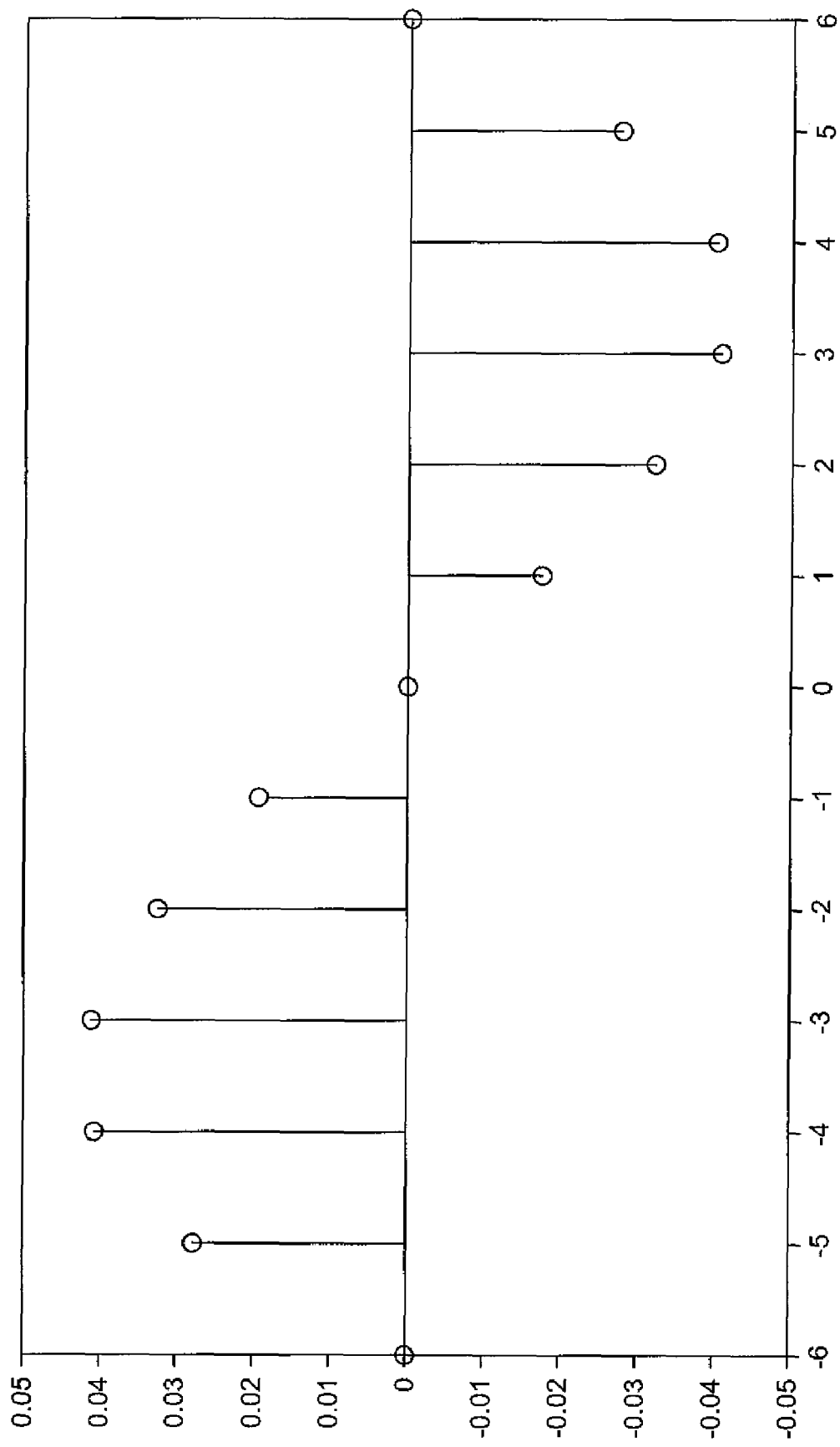
FIG. 33B is a graph illustrating an example of a filter for determining a smoothed value of a curve slope at a selected point.

Although only FIR filters are illustrated in FIG. 33A-B, those skilled in the art will appreciate that other types of filter may be used. For example an Infinite Impulse Response (IIR) filter may be used for determining curve smoothed values, curve slope values or other characteristics of a curve. Also, forward and reverse filtering may be used. Filtering may additionally be used to interpolate data between two acquired times. Other noise removing techniques may be used in additions to filtering, such as outlier detection and removal.

Configurations have been described herein with reference to examples setting forth formation pretest data having pressure and time values. However, it should be appreciated that the concepts of the present invention are not limited with respect to the particular data, the source of the data, or the media through which the data is transmitted.

Moreover, the present invention is not limited to the particular steps, order of steps, or configurations set forth in the above examples. Accordingly, processing in addition to, or in the alternative to, to that set forth above may be performed in accordance with the concepts of the present invention. For example, data smoothing techniques may be implemented with respect to the data prior to decimation, if desired.

It should be appreciated that, using the concepts of the present invention, data may be compressed and transmitted in real-time or near real-time. For example, where the data comprises formation pretest data, compression and transmission may be performed prior to completion of the pretest, such as after an appropriate number of event data points (e.g., one or more event data points) and addition data points (e.g., a series of data points prior or subsequent to an event data point) are captured.

What is claimed is:

1. A method for generating a well log from a downhole tool positioned in a wellbore penetrating a subterranean formation, said method comprising:

determining a data transmission bandwidth associated with said wellbore available to said downhole tool;

identifying a plurality of events in a data stream of said downhole tool;

determining values associated with said plurality of events;

determining a portion of said data transmission bandwidth to be available for data transmission after a bandwidth for transmission of values associated with said plurality of events is deducted from said data transmission bandwidth;

selecting data points from said data stream, said data points being selected as a function of said portion of said data transmission bandwidth to be available for data transmission;

determining values associated with the selected data points;

transmitting to a surface system the values associated with said plurality of events and with said selected data points; and incorporating the transmitted values into the well log.

2. The method of claim 1, wherein said selecting data points as a function of said portion of said data transmission bandwidth to be available for data transmission comprises:

maximizing the amount of selected data points for consuming said portion of said data transmission bandwidth with values associated with said selected data points.

3. The method of claim 2, wherein maximizing the amount of selected data points comprises solving a discrete optimization problem.

4. The method of claim 1, wherein said selecting data points as a function of said portion of said data transmission bandwidth to be available for data transmission comprises:

identifying candidate data points as a function of said values associated with said plurality of events using a growth function.

5. The method of claim 1, wherein said selecting data points as a function of said portion of said data transmission bandwidth to be available for data transmission comprises:

selecting at least one parameter threshold;

identifying candidate data points using said at least one parameter threshold;

determining if values for said candidate data points would consume said portion of said data transmission bandwidth to be available for data transmission.

6. The method of claim 5, further comprising:

iteratively performing said selecting, identifying, and determining to converge on a selection of candidate data points to provide a maximum amount of said values for consumption.

7. The method of claim 6 wherein said iteratively performing said selecting, identifying, and determining comprises adjusting said at least one parameter threshold.

8. The method of claim 7 wherein said adjusting said at least one data parameter change threshold comprises:

determining if said values would exceed said data transmission bandwidth to be available for data transmission; and increasing said at least one parameter threshold.

9. The method of claim 1, further comprising:

quantizing said values for transmission.

10. The method of claim 9, wherein said quantizing comprises:

selecting at least three data points along a path defined by said data stream;

defining a first interval between a first and second values associated with a first and second data points of said at least three data points;

defining a second interval between the second value and a third value associated with a third data point of said at least three data points;

determining a transform from the first and second intervals;

applying the transform to at least one of said values for transmission; and dividing the transformed value by a quantization accuracy.

11. The method of claim 10 wherein said transform provides a multi-linear function which compresses one of said first and second intervals with a linear function with the slope less than 1.

12. The method of claim 10 wherein said selecting, defining, determining, applying, and dividing comprise a quantizing operation operable to allocate a largest portion of bits to said first interval and a smallest portion of bits to said second interval.

13. The method of claim 1, wherein said plurality of events comprise at least one event selected from the group consisting of:

a drawdown start event;

a drawdown pressure reached event;

a buildup pressure approximated event;

a beginning of a pretest investigation phase event;

an ending of a pretest investigation phase event;

a beginning of a pretest measurement phase event;

an ending of a pretest measurement phase event;

a final formation pressure reached event; and a mud cake breached event.

14. The method of claim 1, wherein said data points are disposed in said data stream between at least two events of said plurality of events.

15. The method of claim 1, where said plurality of events are associated with the operations of the downhole tool.

16. The method of claim 1, wherein said determining values associated with the data points comprises:

selecting a portion of the data stream about the data points;

smoothing the values associated with the portion of the data stream; and determining said values from the smoothed values associated with portion of the data stream.

17. The method of claim 1, further including decoding the transmitted values at the surface.

18. The method of claim 17, wherein decoding includes at least one of restoring with a reverse compander, unwrapping, dequantizing and reconstructing the transmitted values.

19. A method for generating a well log from a downhole tool positioned in a wellbore penetrating a subterranean formation, said method comprising:

acquiring data associated with an operation of said downhole tool;

identifying a plurality of events associated with the operation of said downhole tool;

selecting data points for transmission by said downhole tool, said data points being selected as a function of said plurality of events and a growth function;

determining values associated with said plurality of events and said data points for transmission by said downhole tool;

transmitting to a surface system said determined values; and incorporating the transmitted data into the well log.

20. The method of claim 19, wherein selecting data points comprises:

selecting a maximum amount of data points capable of being transmitted to the surface as values.

21. The method of claim 20, further comprising:

quantizing said determined values for transmission.

22. The method of claim 21, wherein said quantizing comprises:

selecting at least three data points in a portion of the acquired data;

defining a first interval between a first and second values associated with a first and second data points of said at least three data points;

defining a second interval between the second value and a third value associated with a third data point of said at least three data points;

determining a transform from the intervals;

applying said transform to at least one of said determined values for transmission; and dividing the transformed value using a quantization accuracy.

23. The method of claim 22 wherein said transform provides a multi-linear function which compresses one of said first and second intervals with a linear function with the slope less than 1.

24. The method of claim 22 wherein said selecting, defining, determining, applying, and dividing comprise a quantizing operation operable to allocate a largest portion of bits to said first interval and a smallest portion of bits to said second interval.

25. The method of claim 19, wherein said growth function is selected from the group consisting of:
   a linear progression;
   a logarithmic progression;
   an exponential progression;
   a spherical progression; and
   a geometric progression.

26. The method of claim 19, further comprising:
   determining a growth factor for said growth function to provide selection of a maximum amount of said data points capable of transmission as values.

27. The method of claim 26 where the determining is performed within the tool acquiring the data.

28. The method of claim 19, wherein said data points comprise data points disposed in said data stream between at least two events of said plurality of events.

29. The method of claim 19, wherein said acquired data define a curve.

30. The method of claim 29, further comprising smoothing at least a portion of the curve and wherein said determined values comprises values associated with the smoothed portion of the curve.

31. The method of claim 30, wherein smoothing at least a portion of the curve comprises filtering the portion of the curve.

32. The method of claim 19, further including decoding the transmitted values at the surface.

33. The method of claim 32 wherein decoding includes at least one of restoring with a reverse compander, unwrapping, dequantizing and reconstructing the transmitted values.

* * * * *